(12) United States Patent
Sundarraj et al.

(10) Patent No.: US 9,917,260 B2
(45) Date of Patent: Mar. 13, 2018

(54) COMPOUNDS WITH TERMINAL HETEROARYLCYANOVINYLENE GROUPS AND THEIR USE IN ORGANIC SOLAR CELLS

(71) Applicant: BASF SE, Ludwigshafen (DE)

(72) Inventors: Sudhakar Sundarraj, Singapore (SG); Christian Eickhoff, Mannheim (DE); Sheeja Bahulayan, Singapore (SG); Robert Send, Karlsruhe (DE); Yuichi Nishimae, Ibaraki (JP); Helmut Reichelt, Neustadt (DE); Junichi Tanabe, Takarazuka (JP); Peter Erk, Frankenthal (DE)

(73) Assignee: BASF SE, Ludwigshafen (DE)

( * ) Notice: Subject to any disclaimer, the term of this patent is extended or adjusted under 35 U.S.C. 154(b) by 81 days.

(21) Appl. No.: 14/913,817

(22) PCT Filed: Aug. 14, 2014

(86) PCT No.: PCT/EP2014/067390
§ 371 (c)(1),
(2) Date: Feb. 23, 2016

(87) PCT Pub. No.: WO2015/024848
PCT Pub. Date: Feb. 26, 2015

(65) Prior Publication Data
US 2016/0248021 A1    Aug. 25, 2016

(30) Foreign Application Priority Data
Aug. 23, 2013  (EP) .................................. 13181538

(51) Int. Cl.
*H01L 21/00* (2006.01)
*H01L 31/00* (2006.01)
(Continued)

(52) U.S. Cl.
CPC .......... *H01L 51/0068* (2013.01); *C09K 11/06* (2013.01); *H01L 51/0046* (2013.01);
(Continued)

(58) Field of Classification Search
CPC ............ C09K 11/06; C09K 2211/1007; C09K 2211/1011; C09K 2211/1029;
(Continued)

(56) References Cited

U.S. PATENT DOCUMENTS 3,458,506 A    7/1969  Bloom et al.
4,461,922 A    7/1984  Gay et al.
(Continued)

FOREIGN PATENT DOCUMENTS

DE    103 13 232.5    3/2003
GB    2 424 881 A    10/2006
(Continued)

OTHER PUBLICATIONS

John A. Mikroyannidis, et al., "New 4,7-dithienebenzothiadiazole derivatives with cyano-vinylene bonds: Synthesis, photophysics and photovoltaics" Synthetic Metals, vol. 159, No. 14, XP026301874, 2009, pp. 1471-1477.*
(Continued)

*Primary Examiner* — William Cheung
(74) *Attorney, Agent, or Firm* — Oblon, McClelland, Maier & Neustadt, L.L.P.

(57) ABSTRACT

The present invention relates to a photoactive material comprising a donor substance and an acceptor substance, wherein the donor substance comprises or consists of one or more compounds of formula (I) described herein, or the acceptor substance comprises or consists of one or more compounds of formula (I) described herein, or the donor substance comprises or consists of a first compound of formula (I) described herein and the acceptor substance
(Continued)

16: conductive layer (back electrode, cathode)
15: exciton-blocking and/or electron conducting layer (ETL)
14: layer comprising an acceptor material
13: layer comprising a donor material
12: hole-conducting layer (hole transport layer, HTL)
11: conductive layer (top electrode, anode)

comprises a second compound of formula (I) described herein with the proviso that the first and second compound are not the same, as well as to an organic solar cell comprising said photoactive material. The present invention also relates to a photoelectric conversion device comprising or consisting of two or more organic solar cells comprising said photoactive material and to compounds of formula (I) as described herein for use as donor substance or as acceptor substance in a photoactive material, Further, the present invention relates to the use of a compound of formula (III) as described herein in the synthesis of a compound of formula (I)as described herein.

10 Claims, 3 Drawing Sheets

(51) Int. Cl.

| | | |
|---|---|---|
| *H01L 51/00* | (2006.01) | |
| *C09K 11/06* | (2006.01) | |
| *H05B 33/10* | (2006.01) | |
| *H01L 51/42* | (2006.01) | |

(52) U.S. Cl.
CPC ...... *H01L 51/0052* (2013.01); *H01L 51/0053* (2013.01); *H01L 51/0065* (2013.01); *H01L 51/0067* (2013.01); *H01L 51/0069* (2013.01); *H01L 51/0071* (2013.01); *H01L 51/0072* (2013.01); *H01L 51/0074* (2013.01); *H01L 51/424* (2013.01); *H05B 33/10* (2013.01); *C09K 2211/104* (2013.01); *C09K 2211/1007* (2013.01); *C09K 2211/1011* (2013.01); *C09K 2211/1029* (2013.01); *C09K 2211/1037* (2013.01); *C09K 2211/1088* (2013.01); *C09K 2211/1092* (2013.01)

(58) Field of Classification Search
CPC ...... C09K 2211/1037; C09K 2211/104; C09K 2211/1088; C09K 2211/1092; H01L 51/0068; H01L 51/0046; H01L 51/0074; H01L 51/0072; H01L 51/0071; H01L 51/0069; H01L 51/424; H01L 51/0067; H01L 51/0065; H01L 51/0053; H01L 51/0052; H05B 33/10
USPC ...................... 136/255, 263, 262; 438/82, 85
See application file for complete search history.

(56) References Cited

U.S. PATENT DOCUMENTS

| | | |
|---|---|---|
| 6,198,091 B1 | 3/2001 | Forrest et al. |
| 6,198,092 B1 | 3/2001 | Bulovic et al. |
| 6,451,415 B1 | 9/2002 | Forrest et al. |
| 6,818,260 B2 | 11/2004 | Farrand et al. |
| 7,829,658 B2 | 11/2010 | Duffy et al. |
| 8,053,840 B2 | 11/2011 | Bailey et al. |
| 2005/0098726 A1 | 5/2005 | Peumans et al. |
| 2005/0224905 A1 | 10/2005 | Forrest et al. |
| 2005/0227406 A1 | 10/2005 | Shtein et al. |
| 2007/0090371 A1 | 4/2007 | Drechsel et al. |
| 2010/0282309 A1* | 11/2010 | Pschirer ............... B82Y 10/00 136/255 |
| 2010/0301271 A1 | 12/2010 | Adlem et al. |

FOREIGN PATENT DOCUMENTS

| | | |
|---|---|---|
| JP | 9-205237 A | 8/1997 |
| JP | 2010-87405 A | 4/2010 |
| WO | WO 2006/113205 A2 | 10/2006 |

OTHER PUBLICATIONS

Combined Office Action and Search Report dated Apr. 13, 2017 in Chinese Patent Application No. 201480058181.1 (with partial English language translation, and English Translation of Category of Cited Documents).

Hoang Anh Ho. et al., "Thiophene-Based Conjugated Oligomers and Polymers with High Electron Affinity", Advanced Materials, vol. 8, Issue 12, Dec. 31, 1996, pp. 990-994.

International Search Report dated Jan. 21, 2015 in PCT/EP2014/067390.

Qing-yun Leung, et al., "Synthesis, characterization and photovoltaic applications of fused heterocyclic molecules with intramolecular charge transfer properties" The University of Hong Kong, http://hub.hku.hk/bitstream/10722/141914/3/FullText.pdf?accept=1, XP055148102, 2010, pp. 1-227 and Cover Pages.

John A. Mikroyannidis, et al., "Novel p-Phenylenevinylene Compounds Containing Thiophene or Anthracene Moieties and Cyano-Vinylene Bonds for Photovoltaic Applications" Applied Materials & Interfaces, vol. 1, No. 8, XP055147983, 2009, pp. 1711-1718.

Cuihua Xue, et al. "Synthesis of oligo(p-phenylene-vinylene-thienylene)s as potential red light-emitting materials" Tetrahedron, vol. 59, No. 28, XP004434885, 2003, pp. 5193-5198.

Bar-Yuan Hsieh, et al., "Copolyfluorenes Containing Phenothiazine or Thiophene Derivatives: Synthesis, Characterization, and Application in White-Light-Emitting Diodes" Journal of Polymer Science: Part A: Polymer Chemistry, vol. 47, No. 3, XP055148022, 2009, pp. 833-844.

Harihara Padhy, et al., "Synthesis and Applications of Cyano-Vinylene-Based Polymers Containing Cyclopentadithiophene and Dithienosilole Units for Photovoltaic Cells" Journal of Polymer Science Part A: Polymer Cherriistry, vol. 49, No. 15, XP055147997, 2011, pp. 3417-3425.

Fulvio G. Brunetti, et al., "Organic electronics from perylene to organic photovoltaics: painting a brief history with a broad brush" Journal of Materials Chemistry, vol. 20, No. 15, XP055148094, 2010, pp. 2934-2948.

\* cited by examiner

Fig. 1

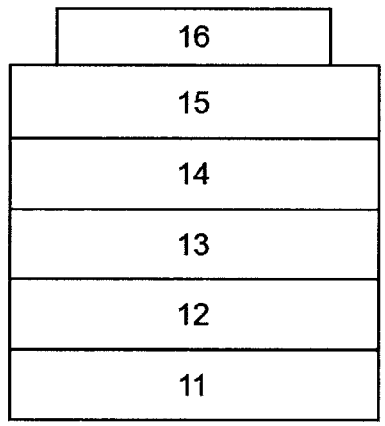

16: conductive layer (back electrode, cathode)
15: exciton-blocking and/or electron conducting layer (ETL)
14: layer comprising an acceptor material
13: layer comprising a donor material
12: hole-conducting layer (hole transport layer, HTL)
11: conductive layer (top electrode, anode)

Fig. 2

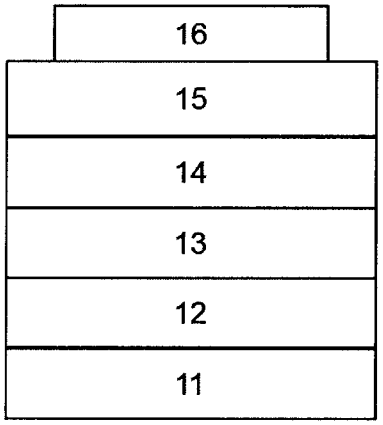

16: conductive layer (back electrode, anode)
15: hole-conducting layer (hole transport layer, HTL)
14: layer comprising a donor material
13: layer comprising an acceptor material
12: exciton-blocking and/or electron conducting layer
11: conductive layer (cathode)

Fig. 3

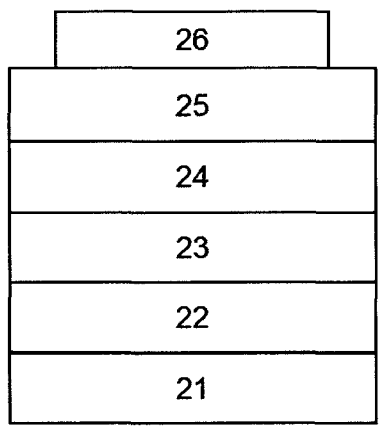

26: conductive layer (back electrode, cathode)
25: exciton-blocking and/or electron conducting layer (ETL)
24: electron-conducting layer
23: mixed layer comprising donor and acceptor material, which form a donor-acceptor heterojunction in the form of a bulk heterojunction
22: hole-conducting layer (hole transport layer, HTL)
21: conductive layer (anode)

Fig. 4

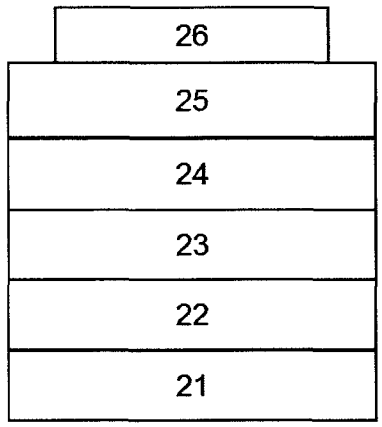

26: conductive layer (anode)
25: exciton-blocking and/or electron conducting layer (ETL)
24: mixed layer comprising donor and acceptor material, which form a donor-acceptor heterojunction in the form of a bulk heterojunction
23: electron-conducting layer
22: exciton-blocking and/or electron conducting layer (ETL)
21: conductive layer (cathode)

36: top electrode
further recombination layer(s) and subcell(s)

34: 2nd subcell

33: recombination layer

32: 1st subcell

31: conductive layer

US 9,917,260 B2

COMPOUNDS WITH TERMINAL HETEROARYLCYANOVINYLENE GROUPS AND THEIR USE IN ORGANIC SOLAR CELLS

The present application is a National Stage Application of PCT International Application No. PCT/EP2014/067390 filed Aug. 14, 2014, under 35 U.S.C. § 371, which claims priority to European Patent Application No. EP13181538.3 filed on Aug. 23, 2013, which are each hereby incorporated by reference in their respective entireties.

FIELD OF THE INVENTION

The present invention relates to a photoactive material comprising a donor substance and an acceptor substance, wherein the donor substance comprises or consists of one or more compounds of formula (I) described below, or the acceptor substance comprises or consists of one or more compounds of formula (I) described below, or the donor substance comprises or consists of a first compound of formula (I) described below and the acceptor substance comprises a second compound of formula (I) described below with the proviso that the first and second compound are not the same, as well as to an organic solar cell comprising said photoactive material. The present invention also relates to a photoelectric conversion device comprising or consisting of two or more organic solar cells comprising said photoactive material and to compounds of formula (I) as described below for use as donor substance or as acceptor substance in a photoactive material. Further, the present invention relates to the use of a compound of formula (III) as described below in the synthesis of a compound of formula (I) as described below.

DESCRIPTION OF THE PRIOR ART

The increasing global energy demand and the growing concerns for a clean and sustainable energy solution for the future has made people to look into energy generation from renewable sources with much interest. Owing to diminishing fossil raw materials and the $CO_2$ which is formed in the combustion of these raw materials and is active as a greenhouse gas, direct energy generation from sunlight is playing an increasing role. Of all the renewable energy sources that are available for use, photovoltaic or the process of converting sunlight into electricity assumes paramount importance, due to the fact that the sun gives us abundant amount of energy, much more than what is needed to meet our present and future energy requirements.

"Photovoltaic" is understood to mean the direct conversion of radiative energy, principally solar energy, to electrical energy. The conventional way of harnessing sunlight is by using solar cells typically made of silicon (in the form of single crystalline, polycrystalline or amorphous silicon) or by the use of thin film technologies like CdTe, CIGS, etc. Factors such as high cost for the energy conversion process, limited availability of raw materials and toxic nature of some of the materials used like Cd, prevents their widespread use in harnessing the tremendous potential of the Sun.

One promising alternative approach for solar energy conversion is the use of organic carbon based materials instead of the conventional inorganic materials used in the photovoltaic industry. Carbon based materials or the so called organic dyes that could be used for this purpose have certain advantages over conventional inorganics, for example organic dyes being strong light absorbers can absorb light more efficiently than their inorganic counterparts. As a consequence of this only a small amount of material is required for making solar cells. Further they are easy to process; thin layers of organic dyes can easily be formed by wet printing or thermal evaporation process.

In contrast to inorganic solar cells, in organic solar cells the light does not directly generate free charge carriers, but rather excitons are formed first, i.e. electrically neutral excited states in the form of electron-hole pairs. These excitons can be separated only by very high electric fields or at suitable interfaces.

In organic solar cells, sufficiently high fields are unavailable, and so all existing concepts for organic solar cells are based on exciton separation at photoactive interfaces (organic donor-acceptor interfaces or interfaces to an inorganic semiconductor). For this purpose, it is necessary that excitons which have been generated in the volume of the organic material can diffuse to this photoactive interface. The diffusion of excitons to the active interface thus plays a critical role in organic solar cells. In order to make a contribution to the photocurrent, the exciton diffusion length in a good organic solar cell must at least be in the order of magnitude of the typical penetration depth of light, in order that the predominant portion of the light can be utilized. The efficiency of an organic solar cell is characterized by its open-circuit voltage $V_{oc}$. Further important characteristics are the short-circuit current $I_{sc}$, the fill factor FF and the resulting efficiency η (eta). The first organic solar cell with an efficiency in the percent range was described by Tang et al. in 1986 (C W. Tang et al., Appl. Phys. Lett. 1986, 48, 183). It consisted of a two-layer system with copper phthalocyanine (CuPc) as the donor substance (p-semiconductor) and perylene-3,4,9,10-tetracarboxylic acid bisimidazole (PTCBI) as the acceptor substance (n-semiconductor).

A current aim in organic photovoltaic is to provide a new generation of solar cells which are significantly less expensive than solar cells composed of silicon or other inorganic semiconductors such as cadmium indium selenide or cadmium telluride. For this purpose, there is additionally a need for suitable semiconductive light-absorbing materials. One means of absorbing a large amount of light and of achieving good efficiencies is to use a pair of semiconductor materials which are complementary with regard to light absorption, for example comprising a short-wave-absorbing n-semiconductor and a long-wave-absorbing p-semiconductor. This concept is also the basis of the aforementioned first organic solar cell, known as the Tang cell.

Even though many fullerene compounds absorb the light only weakly, it has been found that efficient solar cells can be produced when fullerenes or fullerene derivatives, such as $C_{60}$ or $C_{72}$, are used as n-semiconductors. It is additionally known, when using weakly absorbing semiconductor materials, to build two solar cells one on top of another. In that case, one cell comprises a combination of the weakly absorbing semiconductor with a semiconductor complementary thereto, which absorbs the short-wave radiation, and the other cell a combination of the weakly absorbing semiconductor with a semiconductor complementary thereto, which absorbs the long-wave radiation. For such tandem cells for combination with fullerenes or fullerene derivatives, two suitable p-semiconductors are required, one of which absorbs the short-wave radiation and one the long-wave radiation.

The discovery of suitable semiconductor combinations is not trivial. In tandem cells, the open-circuit voltages $V_{oc}$ of the individual components are additive. The total current is limited by the component cell with the lowest short-circuit current $I_{sc}$. The two semiconductor materials of the individual cells thus have to be adjusted exactly with respect to one another. There is therefore a great need for p-semiconductive organic absorber materials with long-wave absorption for use in organic solar cells in combination with fullerenes or fullerene derivatives, and especially in tandem cells, with high open-circuit voltage and acceptable short-circuit current.

In light of this, there has been an ever growing interest in the scientific community to look for alternate materials for light energy conversion. Thus, there has been a continued search for new materials which includes both organic (semiconducting) small molecules and polymers. Compared to conjugated polymers, small molecular semiconductors offer several intrinsic advantages in organic solar cell applications. They are monodisperse with a defined molecular structure and are also easy to synthesis and purify. The quest for new small organic semiconductor molecules has led to the investigation of several organic dye classes as donor materials, which includes phthalocyanines, porphyrins, merocyanines, organic acenes, oligothiophenes, squarines, rylenes, hexabenzocoronene, BODIPY dyes, etc. These donor or p-type semiconducting absorber materials can be further sub-classified based on their structure viz, Donor (D), Donor-Acceptor-Donor (D-A-D), Acceptor-Donor-Acceptor (A-D-A), Donor-Acceptor-Donor-Acceptor-Donor (D-A-D-A-D) and Acceptor-Donor-Acceptor-Donor-Acceptor (A-D-A-D-A) where "D" represent an electron rich donor segment and "A" represent an electron deficient acceptor segment. By carefully choosing the donor and acceptor segments, it is possible to tune the electronic as well as the photophysical properties of these molecules.

A detailed summary of various organic small molecules and also the device structures that has been investigated for use in organic solar cells can be found in published literatures, e.g. "Small molecule semiconductors for high-efficiency organic photovoltaics", Yuze Lin, Yongfang Lia and Xiaowei Zhan; *Chem. Soc. Rev.* 2012, 41, 4245-4272, "Small molecule organic semiconductors on the move: Promises for future solar energy technology", Amaresh Mishra and Peter Buerle; *Angew. Chem. Int. Ed.* 2012, 51, 2020-2067, "Small-molecule solar cells—Status and perspectives", M. Riede, T. Mueller, W Tress, R. Schueppel and K. Leo; *Nanotechnology* 2008, 19, 424001.

Further, U.S. Pat. No. 3,458,506 discloses the synthesis of conjugated benzoxazole, benzothiazole, and benzimidazole compounds containing cyanovinylene groups which impart fluorescent yellow to orange shades to polymeric materials when incorporated therein in minor amounts.

JP 09205237 discloses the provision of an organic thin-film element whose electron transport property and heat resistance are said to be excellent, whose life is said to be long and whose optical and electric characteristic are said to be good by a method in which pigment molecules are used.

Cava et al. disclose in *J. Org. Chem.* 1998, 63, 3105-3112 the synthesis of a number of derivatives of 1,3-dithienyl-benzo[c]thiophene. The mono- and dicarboxaldehydes of these 1,3-dithienylbenzo[c]thiophene derivates are elaborated to give vinylenes and cyanovinylenes. Also beta-dodecyl- and hexyl-substituted analogues have been prepared. Results from cyclic voltammetric investigation as well as fluorescence studies are reported.

Leung et al. disclose in *J. Org. Chem.* 1998, 63, 5059-5063 the syntheses and electrochemical studies of 1,3-bis (2-cyano-2-alpha-thienylethenyl)benzene, 1,4-bis(2-cyano-2-alpha-thienylethenyl)benzene, and 2,7-bis(2-cyano-2-alpha-thienylethenyl)biphenylene. The object of the investigation is said to be to explore the effects arising from an antiaromatic biphenylene unit on electropolymerization or to exploit the potential of applying the unusual electrochemical properties of antiaromatic (4n) π(pi)-electron units to conjugated polymer systems.

Leclerc and Beaupré disclose in *Macromolecules* 2003, 36, 8986-8991 the syntheses of π(pi)-conjugated polymers using 3,6-dimethoxy-9,9-dihexylfluorene as an electron-rich unit. These electroactive and photoactive polymers are prepared from nickel(0)-mediated coupling or by palladium-catalyzed Suzuki coupling.

Shim et al. disclose in *Macromolecules* 2004, 37, 5265-5273 the synthesis, characterization, and electroluminescence of four conjugated polyfluorene derivatives containing various dyes as comonomers. The four fluorene-based alternating polymers which contain different comonomers are found to be thermally stable and readily soluble in common organic solvents. Single layer LED devices fabricated from these polymers are emitting bluish green to pure red light. Shim et al. show that the color of the light emitted by the homopolymer, poly(9,9-dioctylfluorene-2,7-diyl) (PDOF), can be tuned by incorporating the above mentioned comonomers, which have narrower band gaps. The absorption and emission maxima of the copolymers varied according to the position of the cyano group in the vinylene unit (alpha- or beta-position) and the type of incorporated aromatic group (thiophene or phenylene).

U.S. Pat. No. 6,818,260 disclose thienothiophene derivatives, their use as semiconductors or charge transport materials, in optical, electrooptical or electronic devices like for example organic field effect transistors (FET or OFET) for thin film transistor liquid crystal displays and integrated circuit devices such as RFID tags, electroluminescent devices in flat panel displays, and in photovoltaic and sensor devices, and to a field effect transistor, light emitting device or ID tag comprising the thienothiophene derivatives.

Chen, Shu and Chiang disclose in *Org, Lett.* 2005, 7, 3717-3720 a synthesis of 2,2'-dibromo-9,9'-spirobifluorene by a method that does not involve dibromination of 9,9'-spirobifluorene or Sandmeyer reaction of 2,2'-diamino-9,9'-spirobifluorene. A series of donor-acceptor orthogonally substituted 9,9'-spirobifluorene is subsequently prepared showing rich variation of fluorescence in solution and in solid state.

WO 2006/113205 teaches aryl-ethylene aromatic compounds and their use as organic semiconductors. The compounds can be used in electronic devices such as organic thin film transistors (OTFTs), display devices, light-emitting diodes, photovoltaic cells, photodetectors, and memory cells. Methods for manufacturing these aryl-ethylene aromatic compounds are also disclosed.

GB 2424881 discloses 2,7-di(halophenyl)-9,9-bisalkyl-fluorene derivatives, liquid crystal (LC) compositions comprising them, and their use in LC displays and organic electroluminescent display devices.

US 2010/0301271 discloses fluorene derivatives, which are especially suitable for use in birefringent films with negative optical dispersion, liquid crystal (LC) formulations and polymer films comprising these fluorine derivatives, and the use of the fluorene derivatives, formulations and films in optical, electrooptical, electronic, semiconducting or luminescent components or devices.

U.S. Pat. No. 8,053,840 discloses thin film transistors comprising dielectric layers and electrodes comprising metal compositions that can be provided by a dry thermal transfer process.

U.S. Pat. No. 7,829,658 teaches mono-, oligo- and polymeric compounds comprising thienothiazole groups and their use as semiconductors or charge transport materials, in optical, electro-optical or electronic devices, and discloses optical, electro-optical or electronic devices comprising these mono-, oligo- and polymeric compounds.

Park et al. disclose in *Adv. Mater.* 2012, 24, 911-915 the syntheses and characterization of cyanostilbene-based high-performance n-type organic semiconductors. Attributed to the tight molecular stacking, high crystallinity, and optimized energy level of them, electron mobilities as high as 2.14 cm$^2$ V$^{-1}$ s$^{-1}$ and on/off current ratios >10$^6$ are demonstrated.

Sutherland et al. teaches in *Eur. J. Org. Chem.* 2009, 5635-5646 the syntheses of fully derivatized, π(pi)-extended thiophenes. The functionalized thiophenes are divergently synthesized to create three classes of compounds—electron-deficient, extended conjugation and electron-rich—to assess substituent effects on optical and electrochemical properties. The properties are assessed by solution absorption spectroscopy, solution and solid-state fluorescence spectroscopy, cyclic voltammetry and density functional theory calculations. Tetracyano derivatives, prepared through Knoevenagel condensations of malononitrile with thiophene-2,5-dicarbaldehydes, are used as electron-poor analogs.

Luo and Xue disclose in *Tetrahedron* 2003, 59, 5193-5198 several potential red light-emitting oligomers containing alkoxylated phenylene-vinylene-thienylene backbones with and without cyano groups at the olefin moieties. The influences of the skeleton as well as the position of the cyano groups in the vinylene moiety to the absorption and emission spectra of these oligomers are also discussed.

Roncali et al. disclose in *Tetrahedron Lett.* 2010, 51, 4117-4120 some terthienyls functionalized at their two outer beta,beta'-positions by 2- and 3-(thienyl)cyanovinyl groups and their syntheses by basic condensation. The analysis of the electronic properties of theses functionalized terthienyls by UV-vis spectroscopy and cyclic voltammetry shows that the mode of derivatization affects essentially the LUMO level of the conjugated system.

JP 2010-087405 discloses an organic transistor which has an organic semiconductor layer. The disclosed organic transistor is said to have a high mobility and a large current on/off-ratio, and is said to be superior in storage stability.

It has now been found that, surprisingly, compounds of formula (I) defined below are advantageously suitable as electron donors (p-semiconductors, hole conductors) in organic photovoltaics. They are especially suitable for a combination with at least one fullerene compound, such as C$_{60}$, as an electron acceptor (n-semiconductor, electron conductor). The presence of a heteroarylcyanovinylene moiety as acceptor end group helps to minimise the open circuit voltage (V$_{oc}$) loss that is generally observed in bulk heterojunction (BHJ) organic solar cells when compared to the bilayer (BL) cells made from the same material. In most of the compounds described in the present application, the V$_{oc}$ of the BHJ cell was more or less equal to or better than that of a BL cell (see Tables 1 and 2). In a bilayer cell, electrons and holes are spatially separated in the donor and acceptor layer, leading to a diffusion gradient for photogenerated charges. This gradient counteracts the applied outer field, leading to a high V$_{oc}$. On the other hand, in the mixed film of a BHJ no diffusion gradient is present and hence results in a significantly lower V$_{oc}$. Further, the flexibility to structurally tune the novel acceptor end groups provides an alternative way to alter the HOMO-LUMO energy levels thereby contributing to an additional enhancement in V$_{oc}$ (see Table 2). In this context, it is envisaged that the compounds of formula (I) would be even more suitable for use in tandem cells, since they exhibit a high open circuit voltage in combination with a fullerene compound, such as C$_{60}$.

SUMMARY OF THE INVENTION

According to a first aspect of the present invention, a photoactive material is provided comprising a donor substance and an acceptor substance, wherein a. the donor substance comprises or consists of one or more compounds of formula (I), or b. the acceptor substance comprises or consists of one or more compounds of formula (I), or c. the donor substance comprises or consists of a first compound of formula (I) and the acceptor substance comprises or consists of a second compound of formula (I) with the proviso that the first and second compound are not the same,

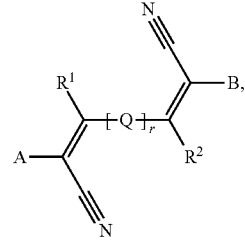

(I)

wherein in formula (I) an uninterrupted π(pi)-electron system extends from A to B, and wherein Q is a linking unit;

r is 0 or 1;

R$^1$, R$^2$ are independently of each other selected from the group consisting of H, halogen, CN, unsubstituted alkyl and substituted alkyl;

A and B are independently of each other selected from

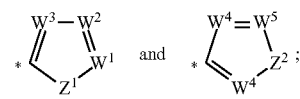

where * in each case denotes the atom bonded to the remaining part of the compound of formula (I);

W$^1$, W$^2$, W$^3$, W$^4$, W$^5$, W$^6$ are independently of each other selected from the group consisting of N and C—R';

Z$^1$, Z$^2$ are independently of each other bivalent groups selected from the group consisting of O, S, Se, N—R,

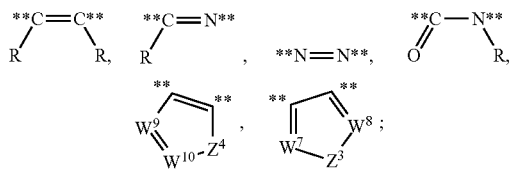

where  in each case denotes the atom bonded to the remaining part of A or B, respectively, $W^7$, $W^8$, $W^9$, $W^{10}$ are independently of each other selected from the group consisting of N and **C—R';

$Z^3$, $Z^4$ are independently of each other bivalent groups selected from the group consisting of O, S, Se, N—R,

wherein each R is independently of each other selected from the group consisting of H, unsubstituted alkyl, substituted alkyl, unsubstituted cycloalkyl, substituted cycloalkyl, unsubstituted aryl, substituted aryl, unsubstituted heteroaryl and substituted heteroaryl;
wherein
(i) each R' is independently selected from the group consisting of H, halogen, unsubstituted alkyl, substituted alkyl, unsubstituted aryl, substituted aryl, alkoxy, aryloxy, $NO_2$, CN, COR", COOR", $SO_2R"$ and $SO_3R"$;
wherein each R" is independently selected from the group consisting of unsubstituted aryl, substituted aryl, unsubstituted alkyl having 1 to 10 carbon atoms, substituted alkyl having 1 to 10 carbon atoms including substituents, unsubstituted cycloalkyl having 5 to 7 carbon atoms, and substituted cycloalkyl having 5 to 10 carbon atoms including substituents, wherein in said alkyl or cycloalkyl groups one oxygen atom or two nonadjacent oxygen atoms may be inserted between respective C atoms;
or
(ii) when each of $W^1$, $W^2$, $W^3$ is **C—R' and $Z^1$ is

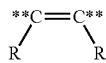

and/or
when each of $W^4$, $W^5$ and $W^6$ is **C—R' and $Z^2$ is

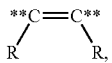

each R' is independently selected from the group consisting of halogen, unsubstituted alkyl, substituted alkyl, unsubstituted aryl, substituted aryl, alkoxy, aryloxy, CN, COR", COOR", $SO_2R"$ and $SO_3R"$,
wherein each R" has the meaning as defined under (i), and wherein each R has the meaning as defined above;
or
(iii) two adjacent **C—R' are linked together so as to form an additional aromatic or heteroaromatic or aliphatic ring,
wherein those R' not being part of said two adjacent **C—R' linked together so as to form an additional aromatic or heteroaromatic or aliphatic ring independently of each other have the meaning as defined under (i).

In a preferred aspect of the present invention, in the compound of formula (I) one or both of A and B comprises a heteroaryl group comprising one or more ring heteroatoms.

According to another aspect of the invention, an organic solar cell is provided comprising a photoactive material according to the present invention, as defined above.

In a further aspect, the present invention relates to a photoelectric conversion device comprising or consisting of two or more organic solar cells according to the present invention, as defined above, wherein the organic solar cells are preferably arranged as tandem cells (multi-junction solar cells) or as inverted tandem cells.

In yet a further aspect, the present invention relates to a compound of formula (I) as defined above for use as donor substance or as acceptor substance in a photoactive material, wherein preferably the photoactive material is part of a layer of a donor-acceptor bilayer or part of a donor-acceptor mixed layer (bulk heterojunction, BHJ).

The present invention also relates to the use of a compound of formula (III)

wherein A is defined as described for formula (I) above, in the synthesis of a compound of formula (I) as defined above.

DESCRIPTION OF FIGURES

FIG. 1 shows a solar cell having normal structure.
FIG. 2 shows a solar cell with inverse structure.
FIG. 3 shows the structure of a solar cell with normal structure and with a donor-acceptor interface in the form of a bulk heterojunction.
FIG. 4 shows the structure of a solar cell with inverse structure and with a donor-acceptor interface in the form of a bulk heterojunction.

DETAILED DESCRIPTION OF THE INVENTION

Figure 5:
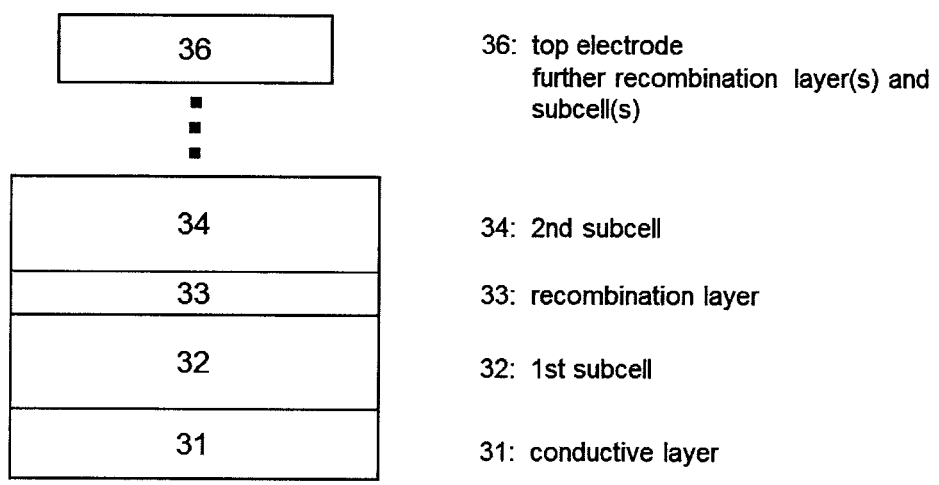
FIG. 5 shows the structure of a tandem cell.

In the context of the invention, the expression "photoactive material" represents a material having a photoactive heterojunction formed by at least one hole-conducting organic substance (donor substance, p-semiconductor) and at least one electron-conducting organic substance (acceptor substance, n-semiconductor).

In the context of the present application, an organic substance is referred to as "hole-conducting" when the charge carriers which are formed as a result of light absorption and charge separation at a heterojunction ("photogenerated charge carriers") are transported within the material in the form of holes. Accordingly, an organic substance is referred to as "electron-conducting" when photogenerated charge carriers are transported within the material in the form of electrons.

A "heterojunction" refers to an interface region between the electron-conducting and the hole-conducting substance.

A "photoactive heterojunction" refers to a heterojunction between the electron-conducting and the hole-conducting substance when excited states formed by light absorption in the electron-conducting and/or the hole-conducting substance ("excitons"), which are separated in the region of the heterojunction into the individual charge carriers, namely electrons and holes, which are then in turn transported through the electron-conducting substance/the hole-conducting substance to electrical contacts, where electrical energy can be drawn off.

A "flat heterojunction" refers to a heterojunction between the electron-conducting and the hole-conducting substance when the interface between the electron-conducting and the hole-conducting substance is formed as an essentially cohesive surface between the two substance layers, namely one layer of the electron-conducting substance and one layer of the hole-conducting substance, i.e. a bilayer configuration (cf. C. W. Tang, *Appl. Phys. Lett.* 1986, 48 (2), 183-185 or N. Karl et al., *Mol. Cryst. Liq. Cryst.* 1994, 252, 243-258).

A "bulk heterojunction" refers to a heterojunction between the electron-conducting and the hole-conducting substance when the electron-conducting substance and the hole-conducting substance are at least partly mixed with one another, such that the interface between the electron-conducting and the hole-conducting substance comprises a multitude of interface sections distributed over the volume of the substance mixture (cf. C. J. Brabec et al., *Adv. Funct. Mater.* 2001, 11 (1), 15).

In the context of the present invention, the expression "alkyl" comprises straight-chain or branched alkyl. Alkyl preferably has 1 to 20 carbon atoms, more preferably 2 to 10 carbon atoms and most preferably 3 to 8 carbon atoms. Examples of alkyl groups are methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl, n-dodecyl, n-tridecyl, n-tetradecyl, n-hexadecyl, noctadecyl and n-eicosyl.

Substituted alkyl groups may, depending on the length of the alkyl chain, have one or more (e.g. 1, 2, 3, 4, 5 or more than 5) substituents. These are preferably each independently selected from cycloalkyl, heterocycloalkyl, aryl, heteroaryl, fluorine, chlorine, bromine, hydroxyl, mercapto, cyano, nitro, nitroso, formyl, acyl, carboxylate, alkylcarbonyloxy, carbamoyl, sulfonate, sulfamino, sulfamide, amidino. Cycloalkyl, heterocycloalkyl, aryl and heteroaryl substituents of the alkyl groups may in turn be unsubstituted or substituted; suitable substituents are the substituents mentioned above for these groups.

The above remarks regarding unsubstituted and substituted alkyl also apply to unsubstituted and substituted alkoxy.

In the context of the invention, "cycloalkyl" denotes a cycloaliphatic group preferably having 5 to 10 carbon atoms, more preferably 5 to 7 carbon atoms. Examples of cycloalkyl groups are cyclopropyl, cyclobutyl, cyclopentyl, cyclohexyl, cycloheptyl and cyclooctyl.

Substituted cycloalkyl groups may, depending on the ring size, have one or more (e.g. 1, 2, 3, 4, 5 or more than 5) substituents. These are preferably each independently selected from cycloalkyl, heterocycloalkyl, aryl, heteroaryl, fluorine, chlorine, bromine, hydroxyl, mercapto, cyano, nitro, nitroso, formyl, acyl, carboxylate, alkylcarbonyloxy, carbamoyl, sulfonate, sulfamino, sulfamide, amidino.

In the case of substitution, the cycloalkyl groups preferably bear one or more (e.g. 1, 2, 3, 4, 5 or more than 5) alkyl groups. Examples of substituted cycloalkyl groups are 2- and 3-methyl-cyclopentyl, 2- and 3-ethylcyclopentyl, 2-, 3- and 4-methylcyclohexyl, 2-, 3- and 4-ethylcyclohexyl, 2-, 3- and 4-propylcyclohexyl, 2-, 3- and 4-isopropylcyclohexyl, 2-, 3- and 4-butylcyclohexyl, 2-, 3- and 4-sec-butylcyclohexyl, 2-, 3- and 4-tert-butylcyclohexyl, 2-, 3- and 4-methylcycloheptyl, 2-, 3- and 4-ethylcycloheptyl, 2-, 3- and 4-propylcycloheptyl, 2-, 3- and 4-isopropylcycloheptyl, 2-, 3- and 4-butylcycloheptyl, 2-, 3- and 4-secbutylcycloheptyl, 2-, 3- and 4-tert-butylcycloheptyl, 2-, 3-, 4- and 5-methylcyclooctyl, 2-, 3-, 4- and 5-ethylcyclooctyl, 2-, 3-, 4- and 5-propylcyclooctyl.

In the context of the present invention, the expression "aryl" comprises mono- and polycyclic aromatic hydrocarbon groups preferably having 5 to 30 carbon atoms, more preferably 6 to 14 carbon atoms, most preferably 6 to 10 carbon atoms. Examples of aryl groups are phenyl, naphthyl, indenyl, fluorenyl, anthracenyl, phenanthrenyl, naphthacenyl, chrysenyl and pyrenyl.

Substituted aryl groups may, depending on the number and size of their ring systems, have one or more (e.g. 1, 2, 3, 4, 5 or more than 5) substituents. These are preferably each independently selected from cycloalkyl, heterocycloalkyl, aryl, heteroaryl, fluorine, chlorine, bromine, hydroxyl, mercapto, cyano, nitro, nitroso, formyl, acyl, carboxylate, alkylcarbonyloxy, carbamoyl, sulfonate, sulfamino, sulfamide, amidino. Cycloalkyl, heterocycloalkyl, aryl and heteroaryl substituents of the aryl groups may in turn be unsubstituted or substituted; suitable substituents are the substituents mentioned above for these groups.

In case of substitution, the aryl groups preferably bear one or more (e.g. 1, 2, 3, 4, 5 or more than 5) alkyl groups. Examples of substituted aryl groups are 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethyiphenyl, 2,4,6-triethylphenyl, 2-, 3- and 4-propylphenyl, 2,4-, 2,5-, 3,5- and 2,6-dipropyiphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl, 2,4,6-tri-tert-butylphenyl.

The above remarks regarding unsubstituted and substituted aryl also apply to unsubstituted and substituted aryloxy.

In the context of the present invention, the expression "heteroaryl" comprises heteroaromatic, mono- or polycyclic groups. In addition to the ring carbon atoms, these groups have 1, 2, 3, 4 or more than 4 ring heteroatoms. The heteroatoms are preferably selected from oxygen, nitrogen, selenium and sulfur. The heteroaryl groups have preferably 5 to 28, more preferably 6 to 14, ring atoms.

Monocyclic heteroaryl groups are preferably 5- or 6-membered heteroaryl groups, such as 2-furyl (furan-2-yl), 3-furyl (furan-3-yl), 2-thienyl (thiophen-2-yl), 3-thienyl (thiophen-3-yl), selenophen-2-yl, selenophen-3-yl, 1H-pyrrol-2-yl, 1H-pyrrol-3-yl, pyrrol-1-yl, imidazol-2-yl, imidazol-1-yl, imidazol-4-yl, pyrazol-1-yl, pyrazol-3-yl, pyrazol-4-yl, pyrazol-5-yl, 3-isoxazolyl, 4-isoxazolyl, 5-isoxazolyl, 3-isothiazolyl, 4-isothiazolyl, 5-isothiazolyl, 2-oxazolyl, 4-oxazolyl, 5-oxazolyl, 2-thiazolyl, 4-thiazolyl, 5-thiazolyl, 1,2,4-oxadiazol-3-yl, 1,2,4-oxadiazol-5-yl, 1,3,4-oxadiazol-2-yl, 1,2,4-thiadiazol-3-yl, 1,2,4-thiadiazol-5-yl, 1,3,4-thiadiazol-2-yl, 4H-[1,2,4]-triazol-3-yl, 1,3,4-triazol-2-yl, 1,2,3-triazol-1-yl, 1,2,4-triazol-1-yl, pyridin-2-yl, pyridin-3-yl, pyridin-4-yl, 3-pyridazinyl, 4-pyridazinyl, 2-pyrimidinyl, 4-pyrimidinyl, 5-pyrimidinyl, 2-pyrazinyl, 1,3,5-triazin-2-yl and 1,2,4-triazin-3-yl.

Polycyclic heteroaryl groups have 2, 3, 4 or more than 4 fused rings. The fused-on rings may be aromatic, saturated or partly unsaturated. Examples of polycyclic heteroaryl groups are quinolinyl, isoquinolinyl, indolyl, isoindolyl, indolizinyl, benzofuranyl, isobenzo(uranyl, benzothiophenyl, benzoxazolyl, benzisoxazolyl, benzthiazolyl, benzoxadiazolyl; benzothiadiazolyl, benzoxazinyl, benzopyrazolyl, benzimidazolyl, benzotriazolyl, benzotriazinyl, benzoselenophenyl, thienothiophenyl, thienopyrimidyl, thiazolothiazolyl, dibenzopyrrolyl (carbazolyl), dibenzofuranyl, dibenzothiophenyl, naphtho[2,3-b]thiophenyl, naphtha[2,3-b]furyl, dihydroindolyl, dihydroindolizinyl, dihydroisoindolyl, dihydroquinolinyl, dihydroisoquinolinyl.

Substituted heteroaryl groups may, depending on the number and size of their ring systems, have one or more (e.g. 1, 2, 3, 4, 5 or more than 5) substituents. These are preferably each independently selected from cycloalkyl, heterocycloalkyl, aryl, heteroaryl, fluorine, chlorine, bromine, hydroxyl, mercapto, cyano, nitro, nitroso, formyl, acyl, carboxylate, alkylcarbonyloxy, carbamoyl, sulfonate, sulfamino, sulfamide, amidino.

According to a first aspect of the present invention, a photoactive material is provided comprising a donor substance and an acceptor substance, wherein a. the donor substance comprises or consists of one or more compounds of formula (I), or b. the acceptor substance comprises or consists of one or more compounds of formula (I), or c. the donor substance comprises or consists of a first compound of formula (I) and the acceptor substance comprises or consists of a second compound of formula (I) with the proviso that the first and second compound are not the same,

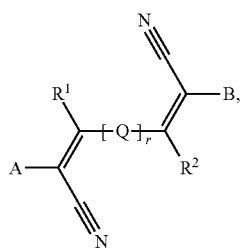

(I)

wherein in formula (I) an uninterrupted π(pi)-electron system extends from A to B, and wherein Q is a linking unit;

r is 0 or 1;

$R^1$, $R^2$ are independently of each other selected from the group consisting of H, halogen, CN, unsubstituted alkyl and substituted alkyl;

A and B are independently of each other selected from

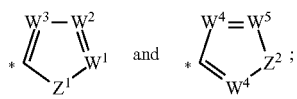

where * in each case denotes the atom bonded to the remaining part of the compound of formula (I);

$W^1$, $W^2$, $W^3$, $W^4$, $W^5$, $W^6$ are independently of each other selected from the group consisting of N and C—R';

$Z^1$, $Z^2$ are independently of each other bivalent groups selected from the group consisting of O, S, Se, N—R,

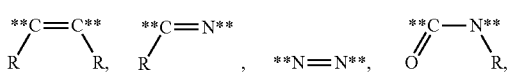

-continued

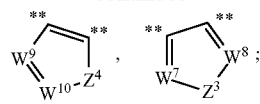

where  in each case denotes the atom bonded to the remaining part of A or B, respectively, $W^7$, $W^8$, $W^9$, $W^{10}$ are independently of each other bivalent groups selected from the group consisting of N and **C—R';

$Z^3$, $Z^4$ are independently of each other bivalent groups selected from the group consisting of O, S, Se, N—R,

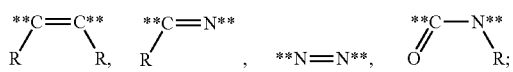

wherein each R is independently of each other selected from the group consisting of H, unsubstituted alkyl, substituted alkyl, unsubstituted cycloalkyl, substituted cycloalkyl, unsubstituted aryl, substituted aryl, unsubstituted heteroaryl and substituted heteroaryl;

wherein (i) each R' is independently selected from the group consisting of H, halogen, unsubstituted alkyl, substituted alkyl, unsubstituted aryl, substituted aryl, alkoxy, aryloxy, $NO_2$, CN, COR", COOR", $SO_2R"$ and $SO_3R"$;

wherein each R" is independently selected from the group consisting of unsubstituted aryl, substituted aryl, unsubstituted alkyl having 1 to 10 carbon atoms, substituted alkyl having 1 to 10 carbon atoms including substituents, unsubstituted cycloalkyl having 5 to 7 carbon atoms, and substituted cycloalkyl having 5 to 10 carbon atoms including substituents, wherein in said alkyl or cycloalkyl groups one oxygen atom or two nonadjacent oxygen atoms may be inserted between respective C atoms;

Or (ii) when each of $W^1$, $W^2$, $W^3$ is **C—R' and $Z^1$ is

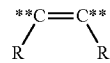

and/or when each of $W^4$, $W^5$ and $W^6$ is **C—R' and $Z^2$ is

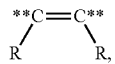

each R' is independently selected from the group consisting of halogen, unsubstituted alkyl, substituted alkyl, unsubstituted aryl, substituted aryl, alkoxy, aryloxy, CN, COR", COOR", $SO_2R"$ and $SO_3R"$, wherein each R" has the meaning as defined under (i), and wherein each R has the meaning as defined above;

or (iii) two adjacent C—R' are linked together so as to form an additional aromatic or heteroaromatic or aliphatic ring, wherein those R' not being part of said two adjacent C—R' linked together so as to form an additional aromatic or heteroaromatic or aliphatic ring independently of each other have the meaning as defined under (i).

The above definitions are exemplarily explained for compounds 43 and 49 (which are discussed in more detail below):

For Compound 43:

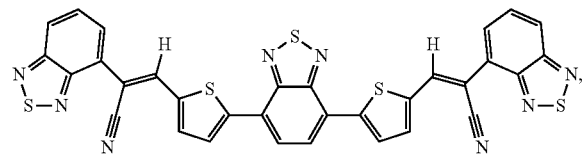

Q is

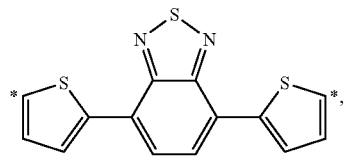 [SMILES: c1csc(-c2ccc(-c3cccs3)c3nsnc23)c1]

and r=1,
$R^1$=H,
$R^2$=H,
A=B=

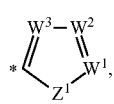

wherein
$W^1$=$W^2$=$W^3$=**C—R, wherein R'=H,
and
$Z^1$=

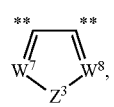

wherein
$W^7$=$W^8$=N,
$Z^3$=S.

For Compound 49:

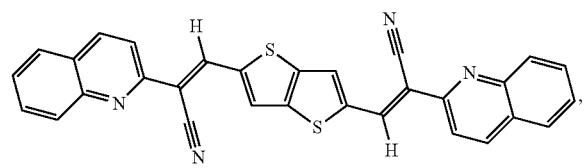

Q is

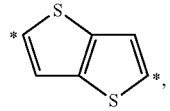

and r=1,
$R^1$=H,
$R^2$=H,
A=B=

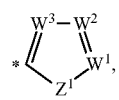

wherein
$W^1$=**C—R',
$W^2$=**C—R',
$W^3$=**N,
and
$Z^1$=

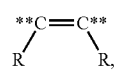

wherein
R=H,
and wherein $W^1$ (i.e. C—R') and $W^2$ (i.e. C—R') are adjacent and linked together so as to form the additional aromatic ring.

Since in the compound of formula (I) described above an uninterrupted π(pi)-electron system extends from A to B, said π(pi)-electron system is also present in linking unit Q.

In each of options a., b. and c. defined above, donor substance and acceptor substance are always two distinct substances.

In the context of the present invention option a. described above is preferred, i.e. it is preferred that in the inventive photoactive material the donor substance comprises or consists of one or more compounds of formula (I).

In a preferred aspect of the present invention, in the compound of formula (I) one or both of A and B comprises a heteroaryl group comprising one or more ring heteroatoms.

According to the present invention it is preferred that in the compound of formula (I) A and B are independently of each other selected from

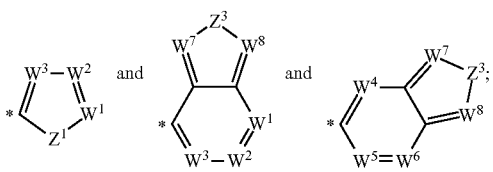

where * in each case denotes the atom bonded to the remaining part of the compound of formula (I);
$Z^1$ and $Z^3$ are independently of each other selected from the group consisting of O, S **Se and

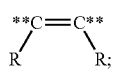

$W^1, W^2, W^3, W^4, W^5, W^6, W^7, W^8$ are independently of each other selected from the group consisting of N and C—R';

wherein (i) each R' is independently selected from the group consisting of H, halogen, NO$_2$, CN, COR", COOR", SO$_2$R" and SO$_3$R";

wherein each R" is independently selected from the group consisting of unsubstituted aryl, substituted aryl, unsubstituted alkyl having 1 to 10 carbon atoms, substituted alkyl having 1 to 10 carbon atoms including substituents, unsubstituted cycloalkyl having 5 to 7 carbon atoms, and substituted cycloalkyl having 5 to 10 carbon atoms including substituents, wherein in said alkyl or cycloalkyl groups one oxygen atom or two nonadjacent oxygen atoms may be inserted between respective C atoms;

or (ii) two adjacent C—R' are linked together so as to form an additional aromatic or heteroaromatic or aliphatic ring, wherein those R' not being part of said two adjacent C—R' linked together so as to form an additional aromatic or heteroaromatic or aliphatic ring independently of each other have the meaning as defined under (i).

According to the present invention it is preferred that in the compound of formula (I) each R' is independently selected from the group consisting of H, halogen, unsubstituted alkyl and substituted alkyl, unsubstituted aryl and substituted aryl, alkoxy, aryloxy, NO$_2$, CN, COR", COOR", SO$_2$R" and SO$_3$R", wherein each R" is independently selected from fluorinated alkyl having 1 to 10 carbon atoms including substituents and perfluorinated alkyl having 1 to 10 carbon atoms including substituents.

According to the present invention it is also preferred that in the compound of formula (I) in the compound of formula (I) Q comprises one or more units Ar independently of each other selected from the group consisting of:

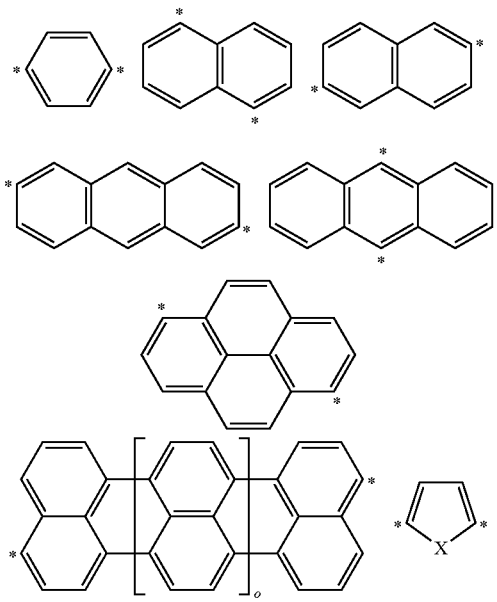

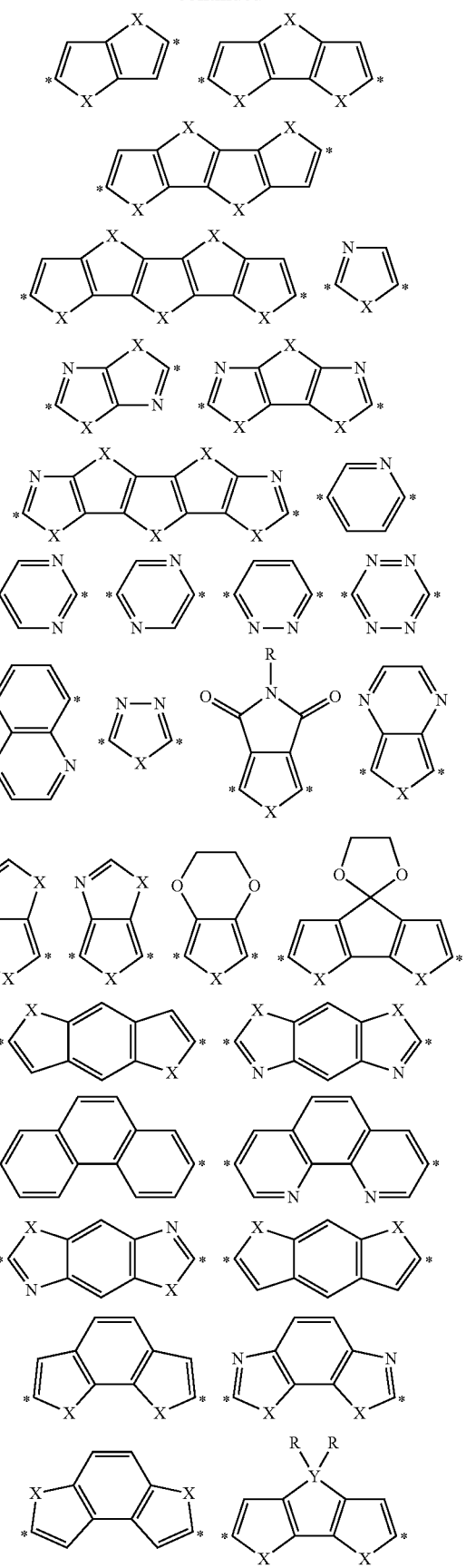

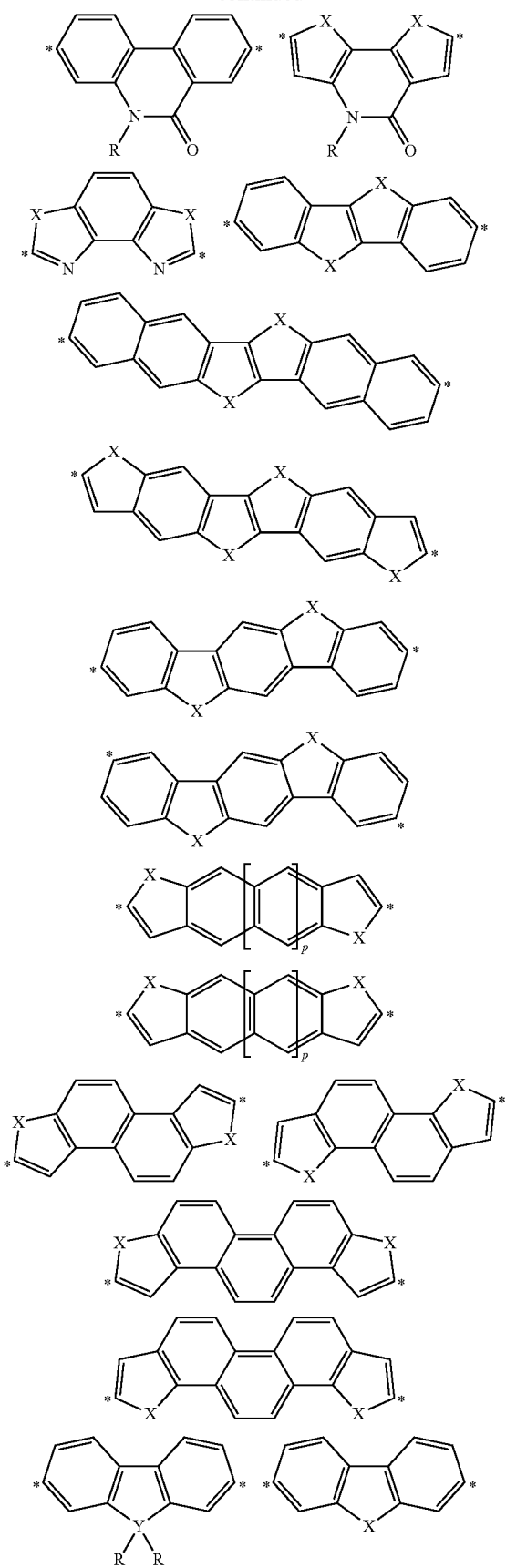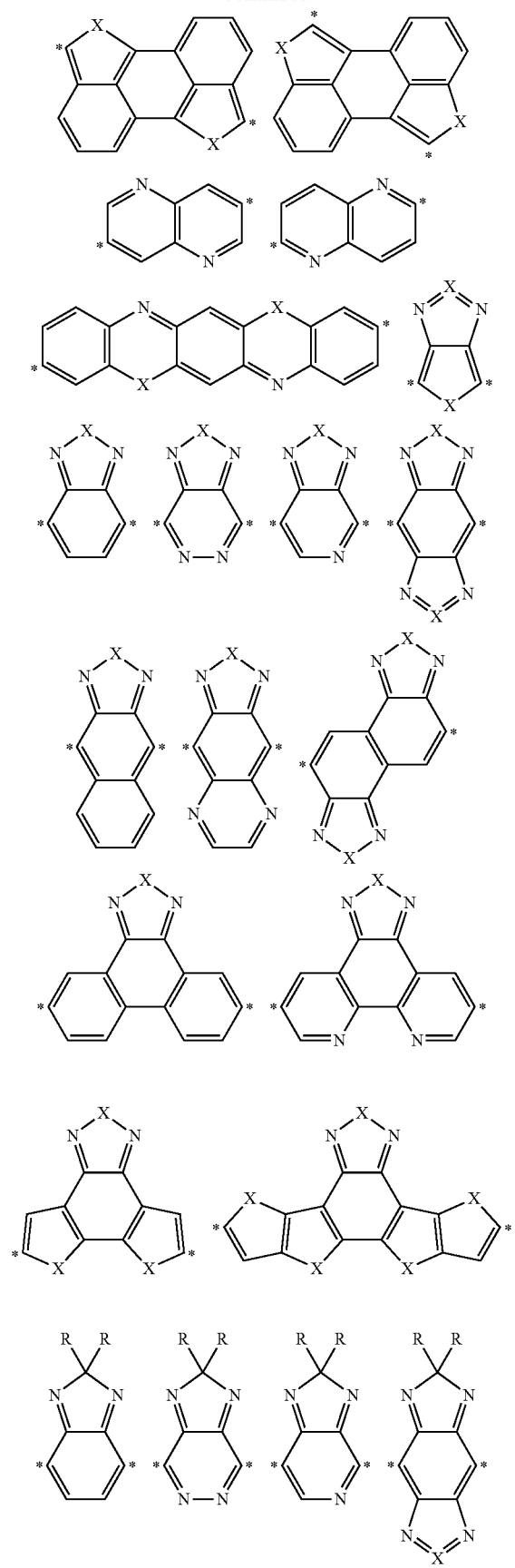

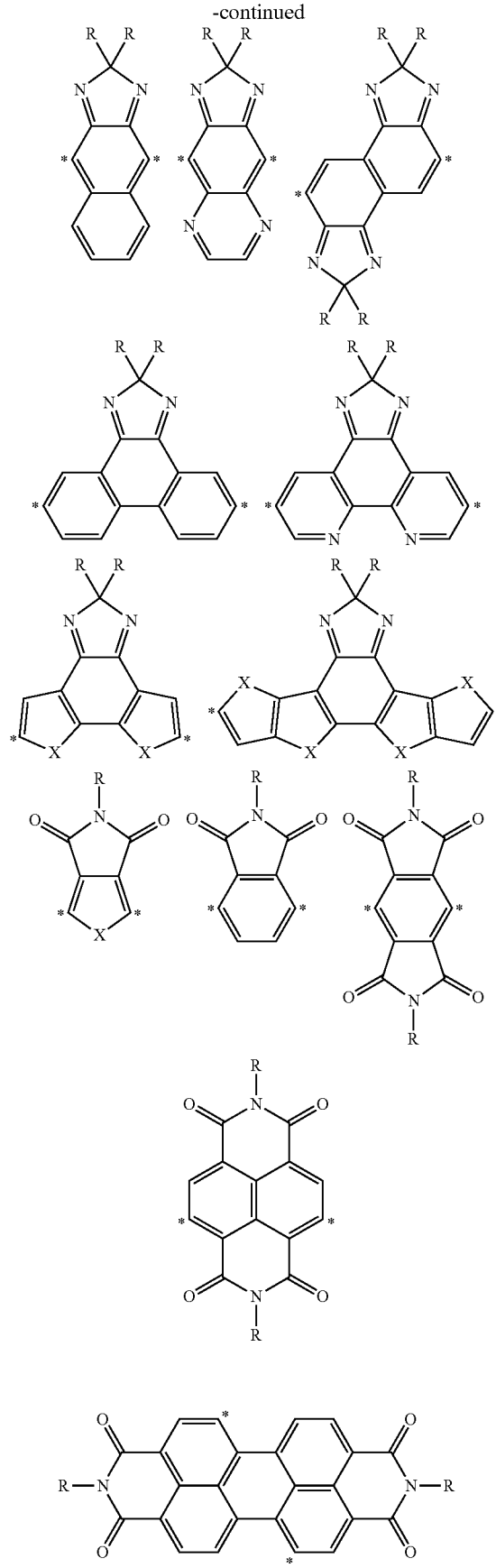
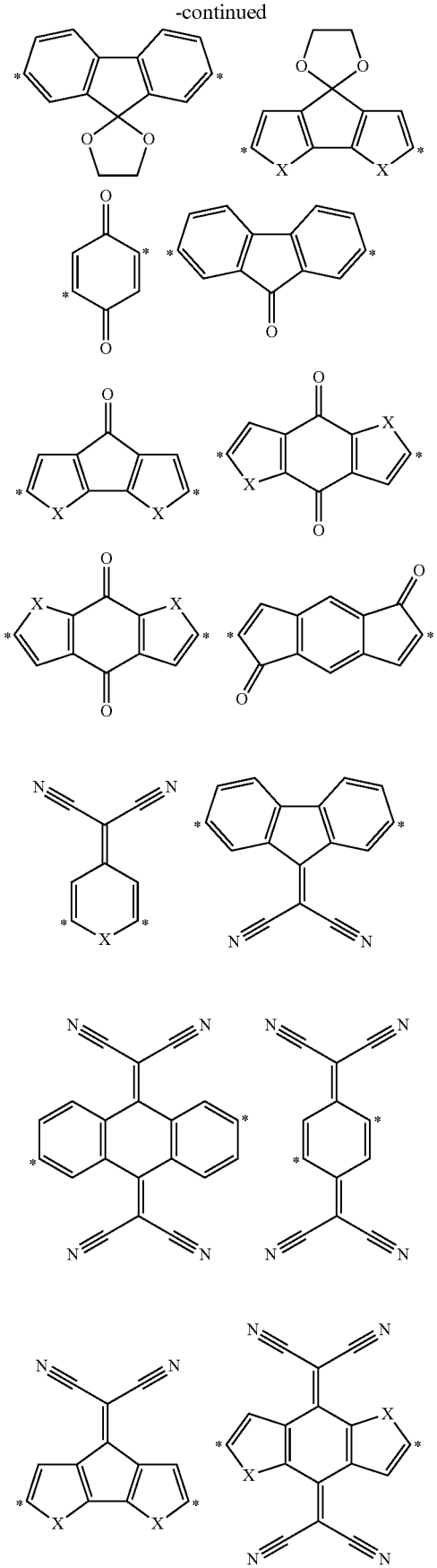

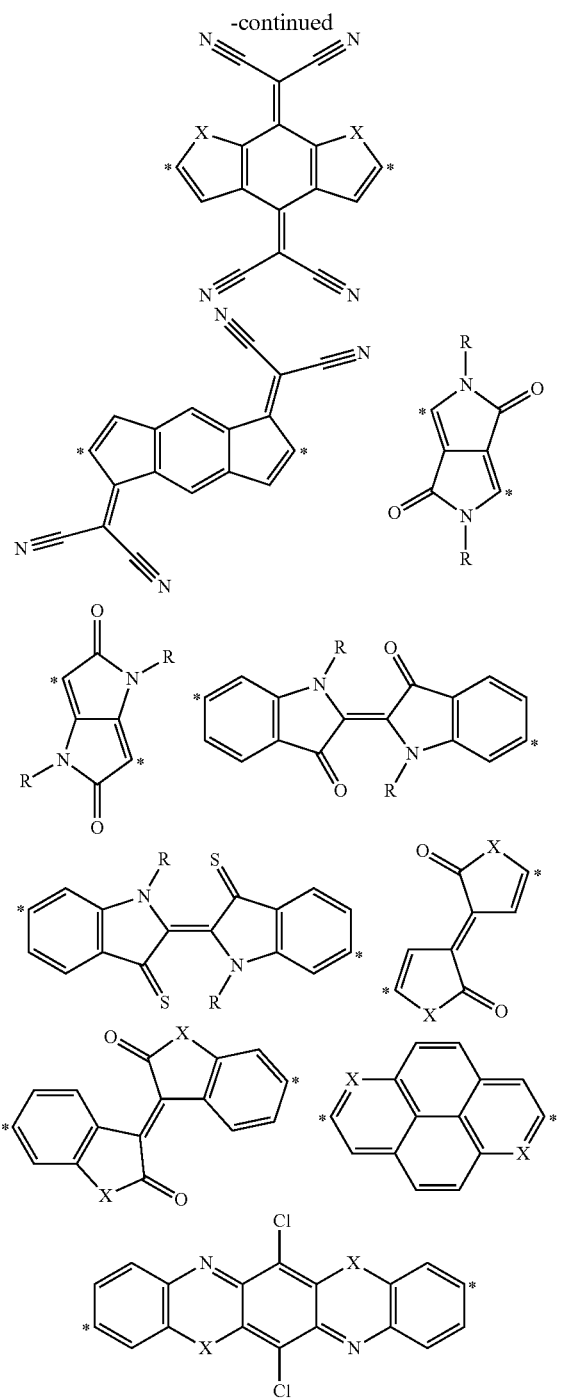

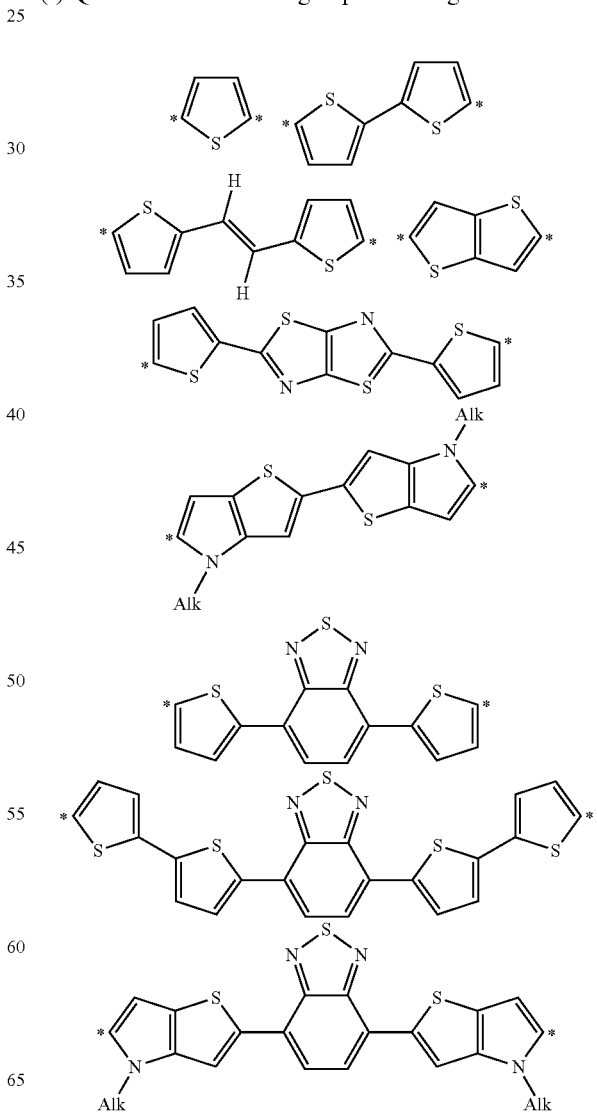

where * in each case denotes the atoms bonded to the remaining part of the compound of formula (I);

o is independently of each other selected from the group consisting of 0, 1 and 2;

p is independently of each other selected from the group consisting of 0, 1, 2, 3, 4 and 5;

each Y is independently of each other selected from the group consisting of C, Si and Ge;

each X is independently of each other selected from the group consisting of S, Se, O and N—R;

wherein each R is independently of each other selected from the group consisting of H, unsubstituted alkyl, substituted alkyl, unsubstituted cycloalkyl, substituted cycloalkyl, unsubstituted aryl, substituted aryl, unsubstituted heteroaryl and substituted heteroaryl;

and wherein one or more hydrogen atoms bonded to C atoms of the aromatic system of each of said units Ar may be substituted by substituents $R^3$, wherein each $R^3$ is independently of each other selected from the group consisting of H, halogen, unsubstituted alkyl, substituted alkyl, unsubstituted cycloalkyl, substituted cycloalkyl, unsubstituted substituted aryl, unsubstituted heteroaryl, substituted heteroaryl, $NO_2$, CN, OR", COR", COOR", $SO_2R"$ and $SO_3R"$, wherein each R" is independently selected from the group defined in claim 1.

According to the present invention it is preferred that in the compound of formula (I) Q comprises one or more units L independently of each other comprising a bond selected from the group consisting of unsubstituted carbon-carbon double-bond, substituted carbon-carbon double bond and carbon-carbon triple-bond, wherein the bond is part of the conjugated π(pi)-electron system extending from A to B, but not part of an aromatic system.

According to the present invention it is also preferred that in the compound of formula (I) in the compound of formula (I) Q is selected from the group consisting of:

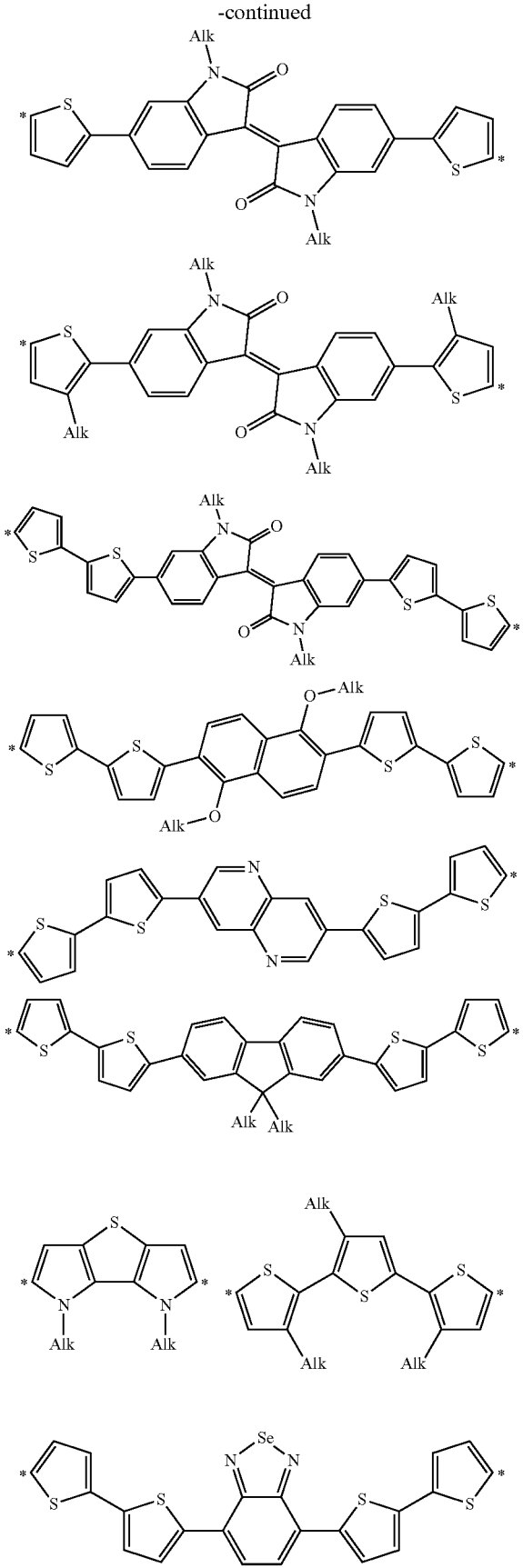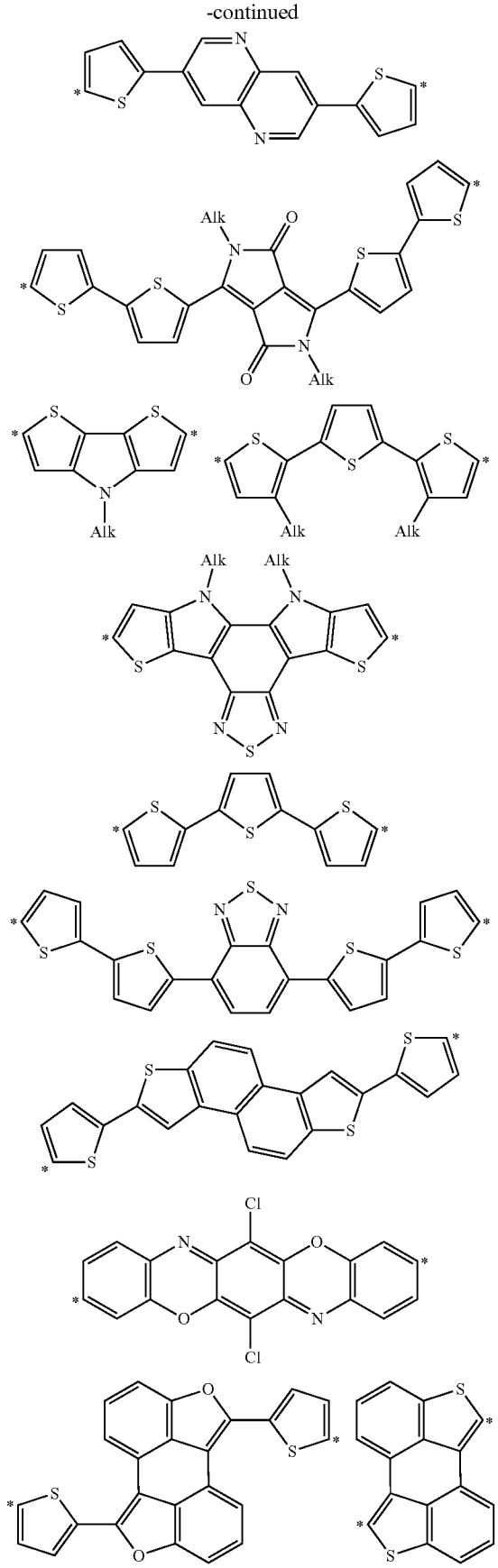

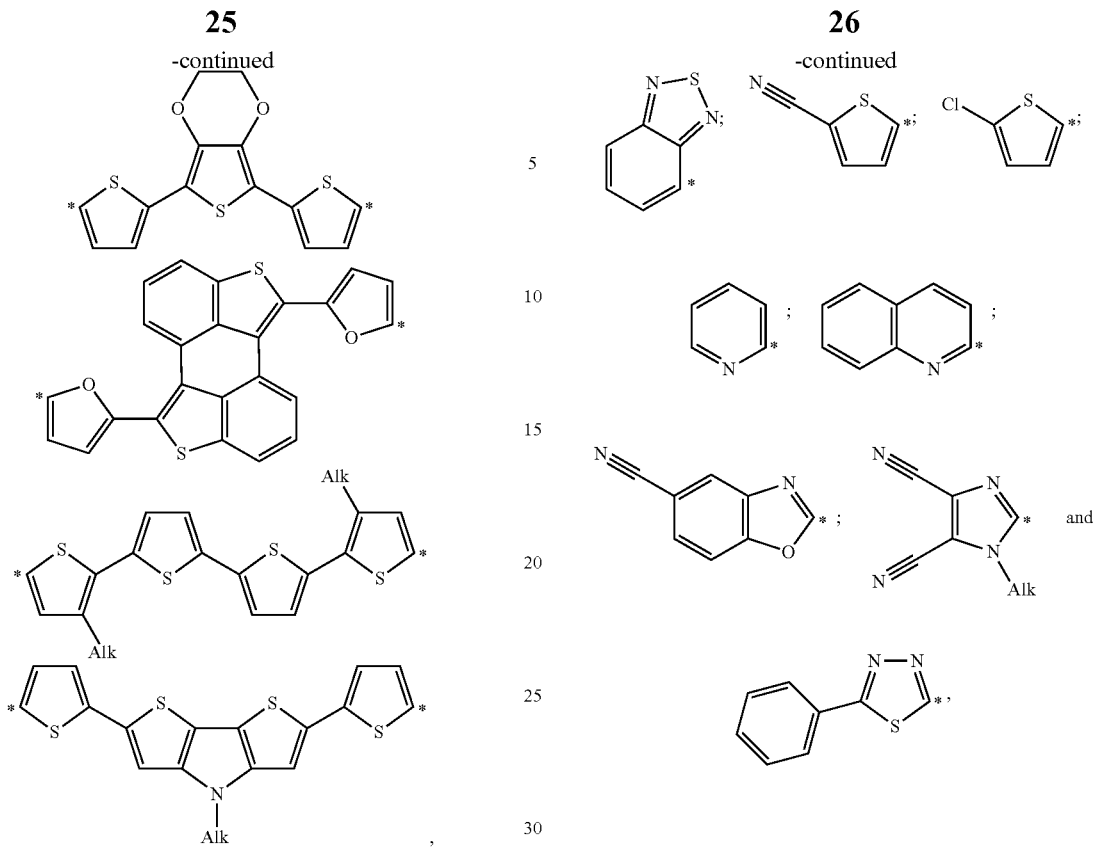

wherein Alk in each case is independently of each other either linear alkyl having 1 to 20 carbon atoms or branched alkyl having 1 to 20 carbon atoms and where * in each case denotes the atoms bonded to the remaining part of the compound of formula (I).

where * in each case denotes the atom bonded to the remaining part of the compound of formula (I).

According to the present invention it is further preferred that the compound of formula (I) is a compound of formula (II)

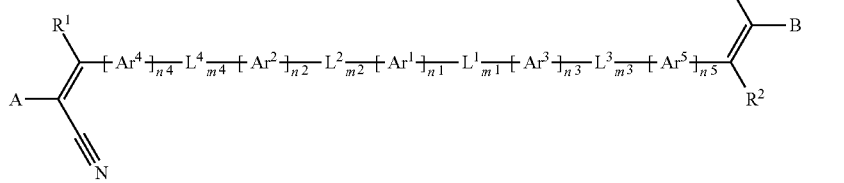

According to the present invention it is especially preferred that in the compound of formula (I) A and B are independently of each other selected from the group consisting of:

wherein $n^1$, $n^2$, $n^3$, $n^4$, $n^5$ are independently of each other selected from the group consisting of 0, 1 and 2;

$m^1$, $m^2$, $m^3$, $m^4$ are independently of each other selected from the group consisting of 0, 1 and 2;

A and B are defined as described above;

each $L^1$, $L^2$, $L^3$, $L^4$ is independently of each other a unit L as defined above;

each $Ar^1$, $Ar^2$, $Ar^3$, $Ar^4$ and $Ar^5$ is independently of each other a unit Ar as defined above.

According to the present invention it is preferred that the compound of formula (I) is selected from the group consisting of:

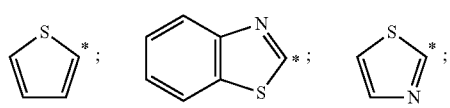

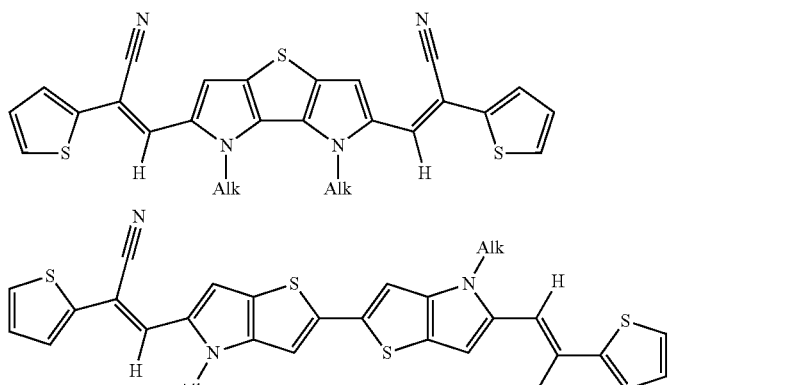
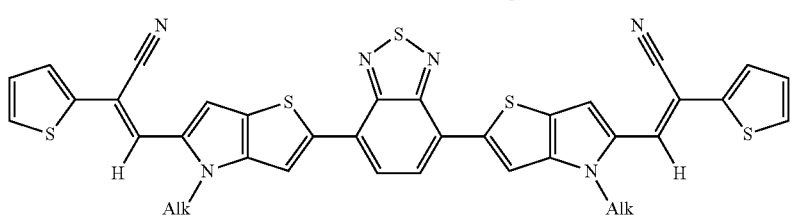
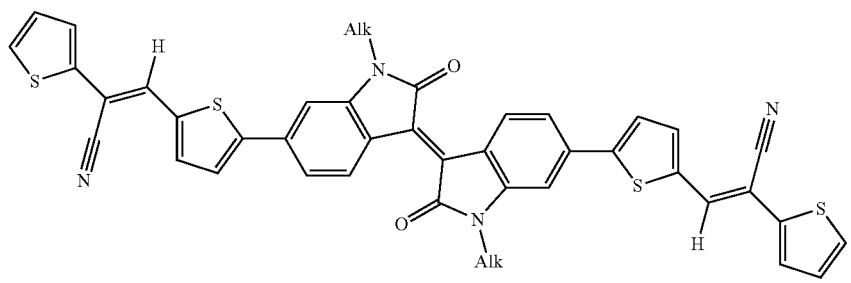
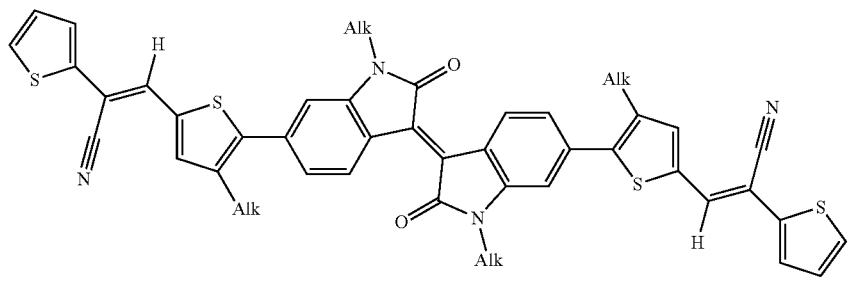
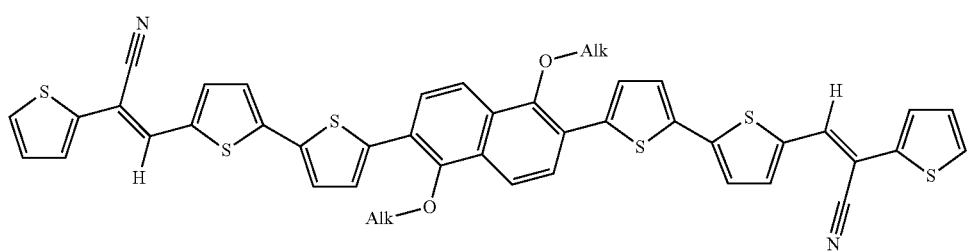

-continued
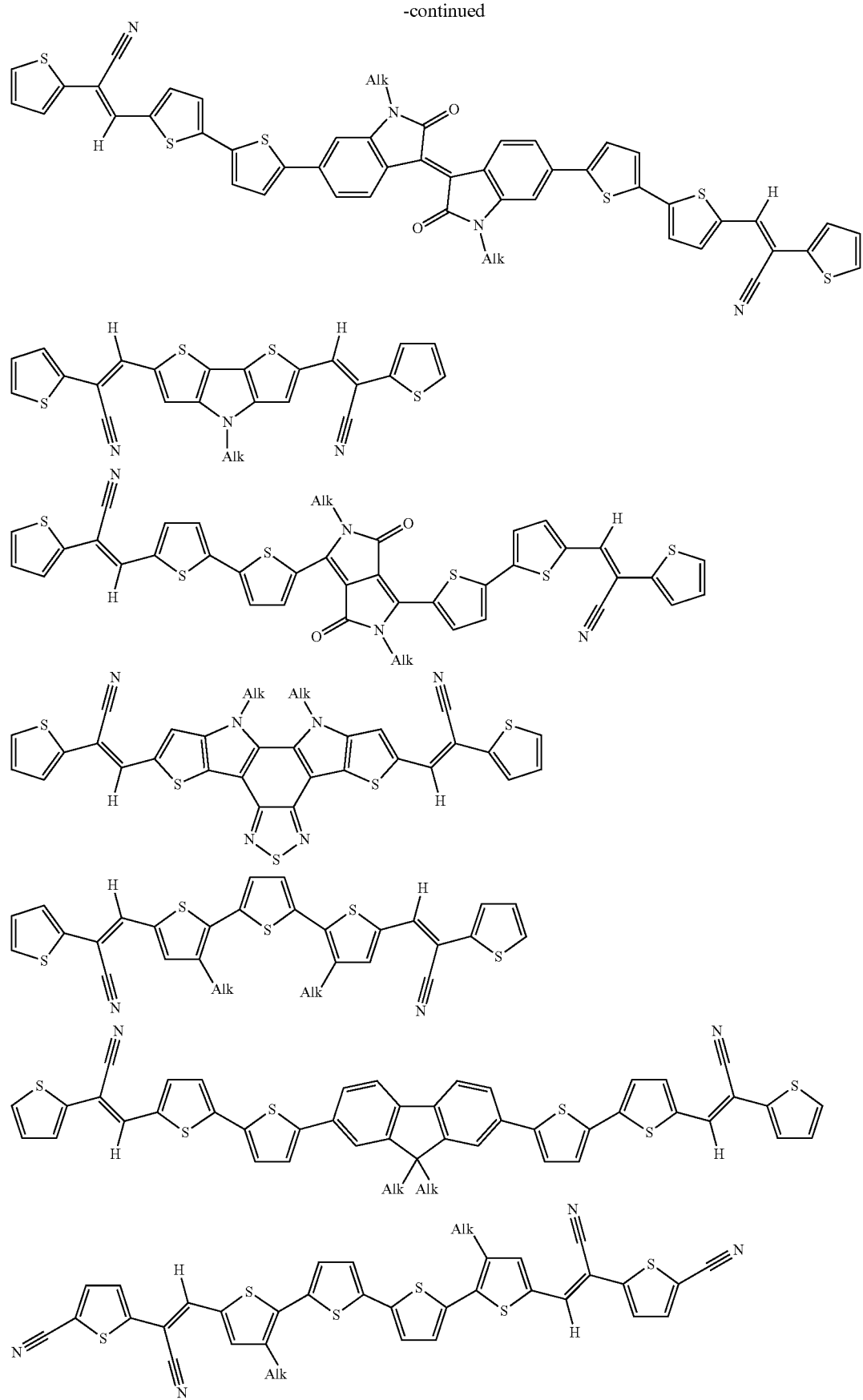

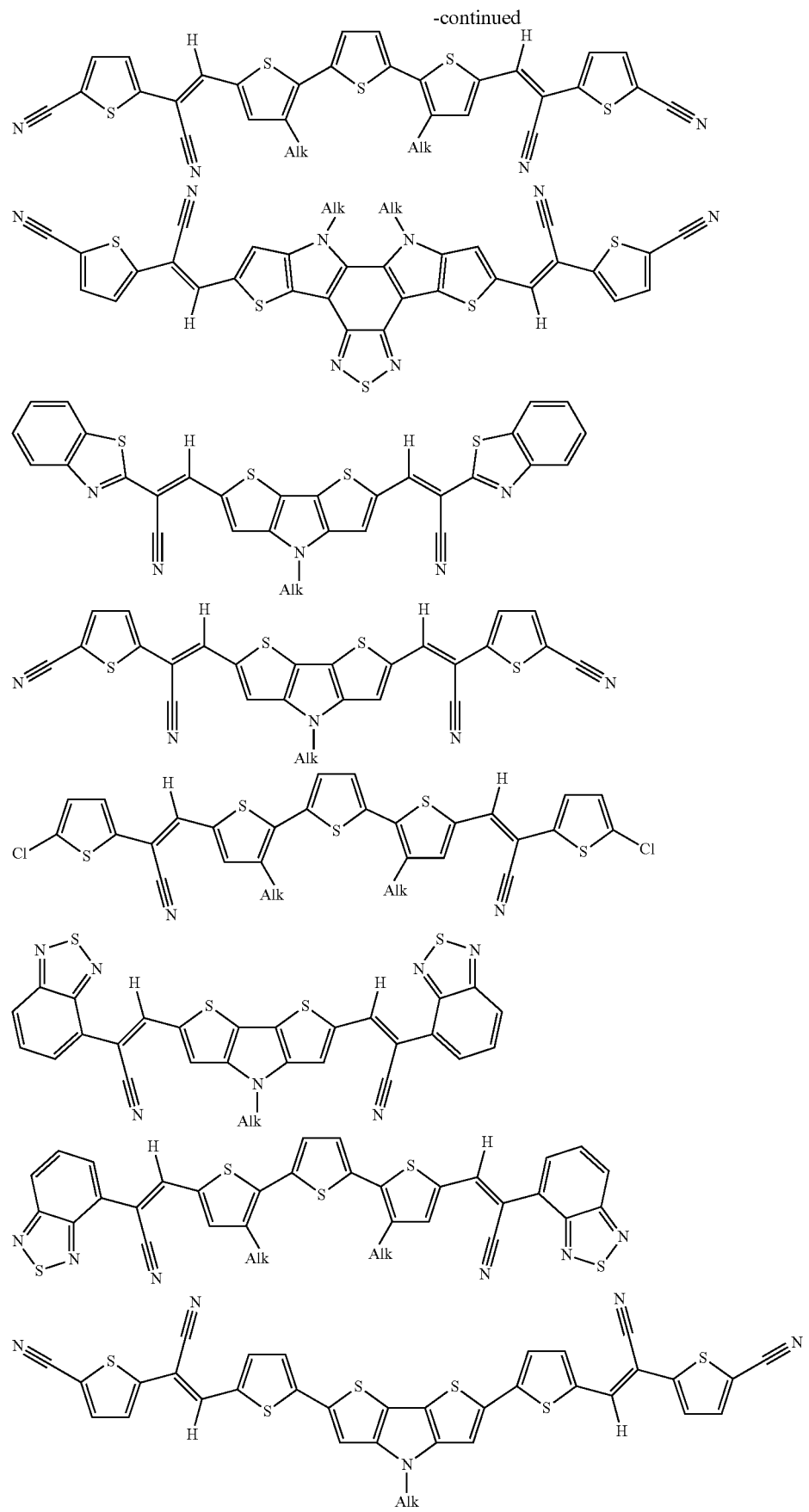

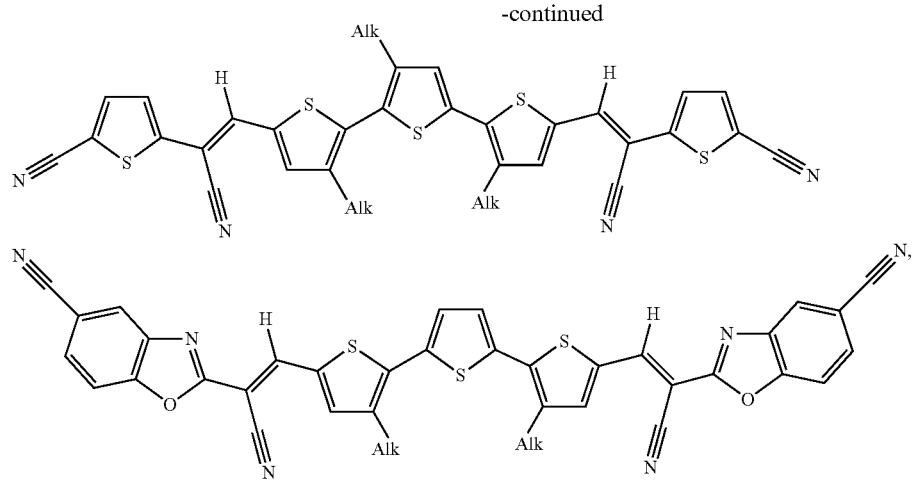
wherein Alk in each case is independently of each other either linear alkyl having 1 to 20 carbon atoms or branched alkyl having 1 to 20 carbon atoms.
According to the present invention it is even further preferred that the compound of formula (I) is selected from the group of compounds of formulae 1 to 51:
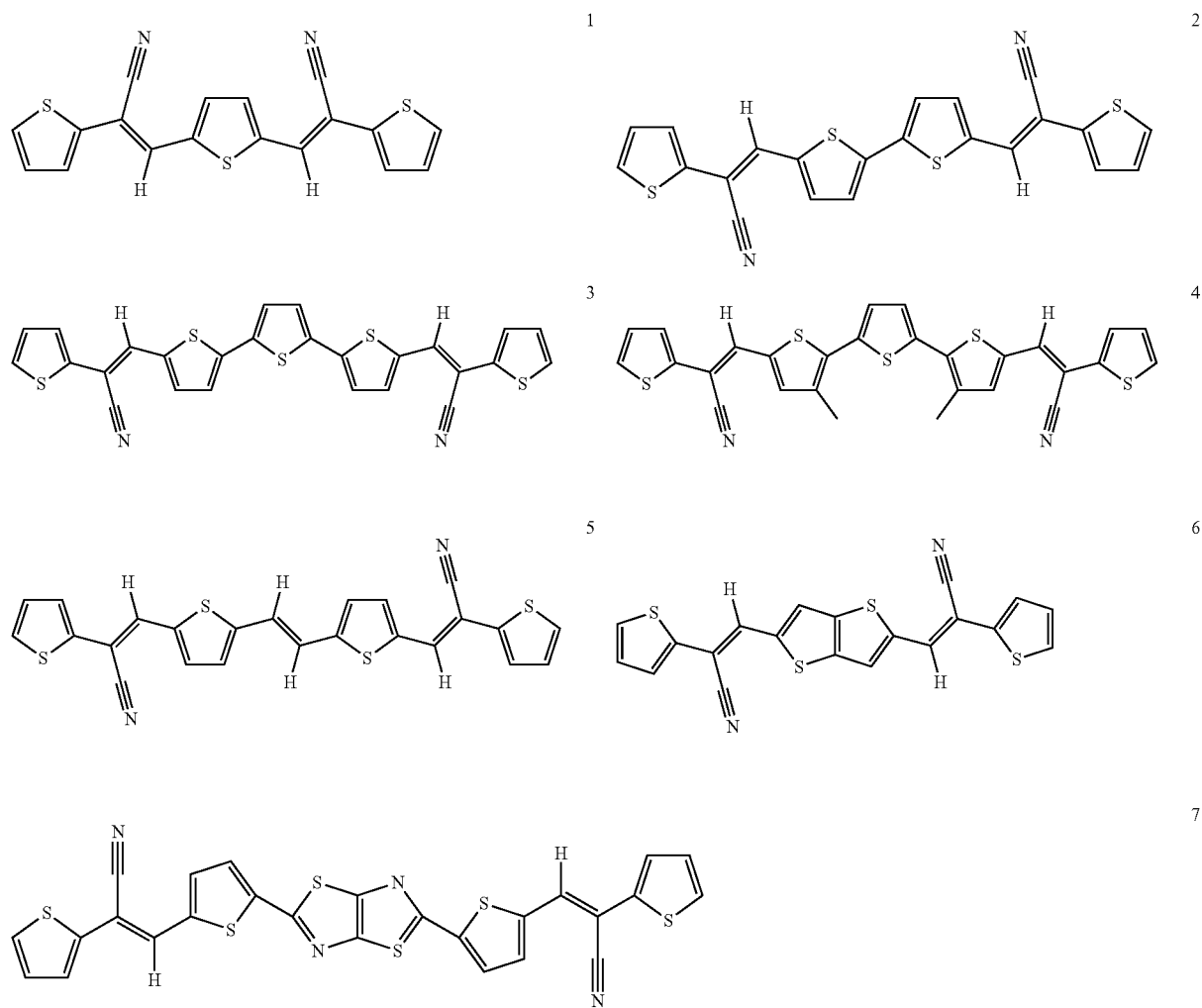

-continued
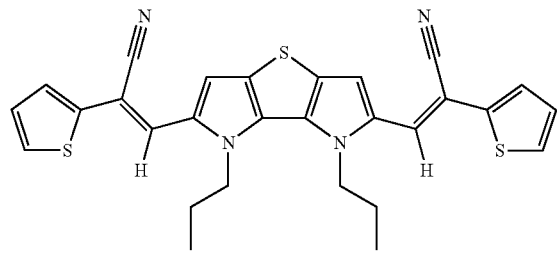
8
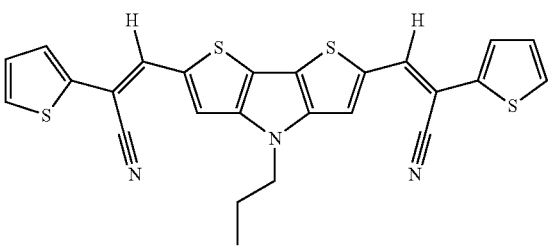
9
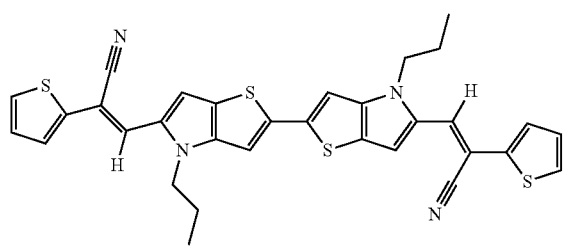
10
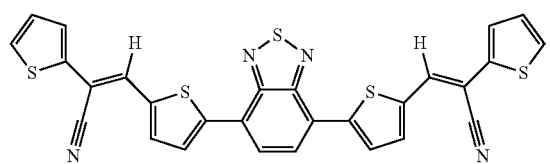
11
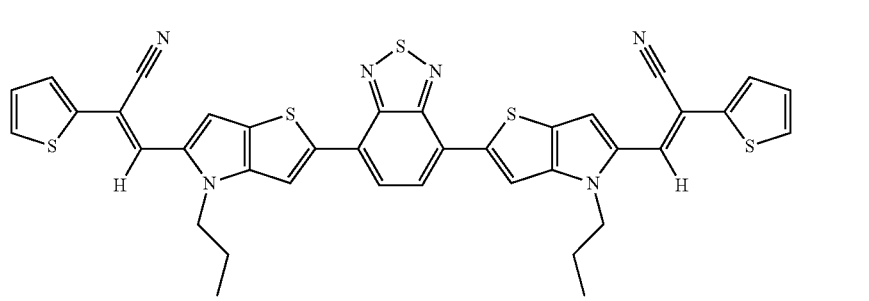
12
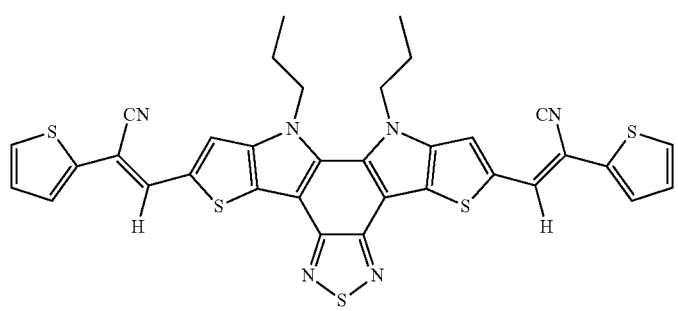
13
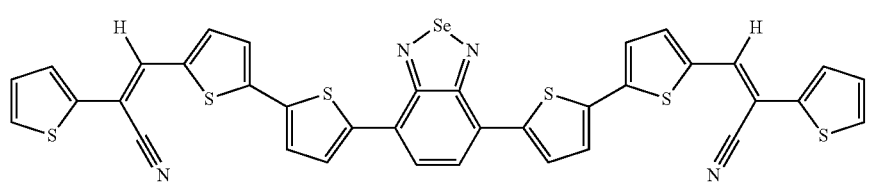
14
15

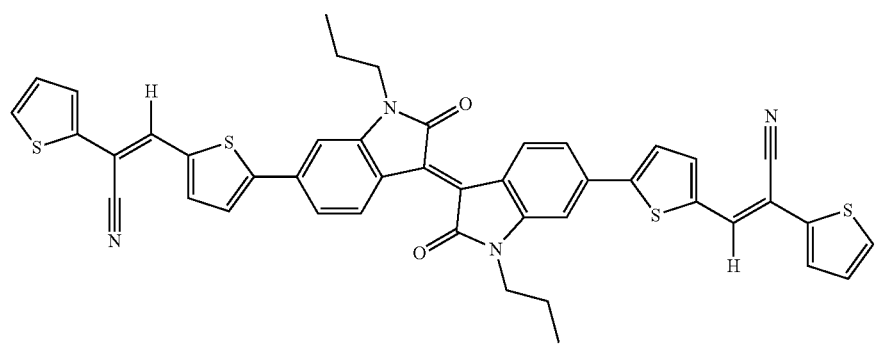
16
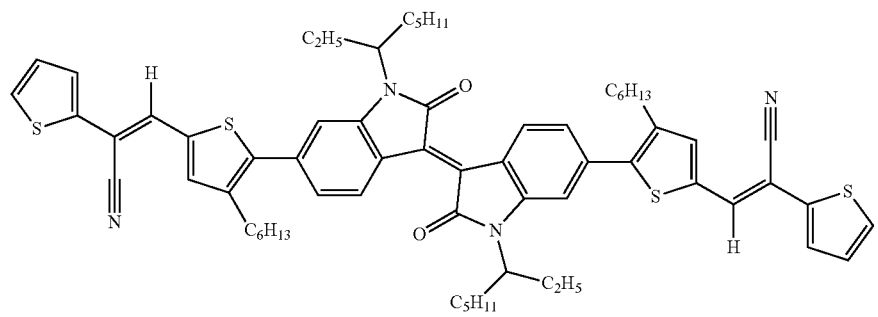
17
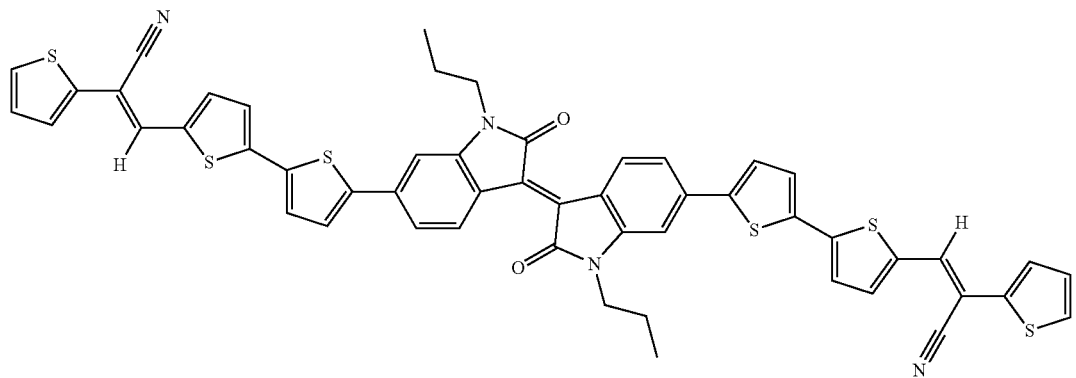
18
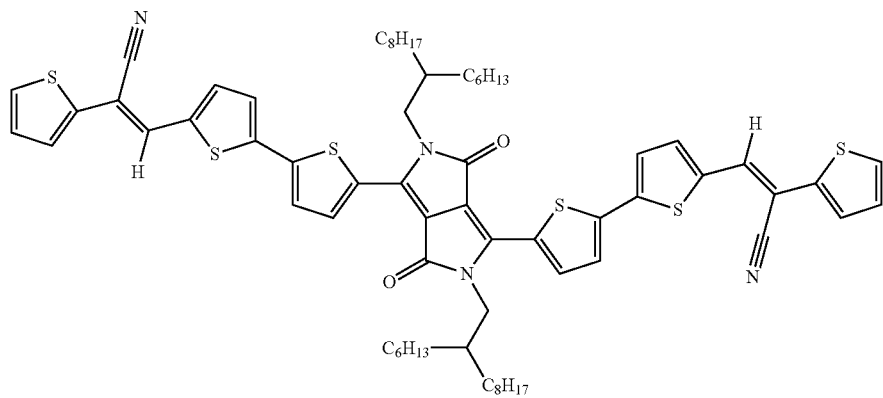
19

-continued
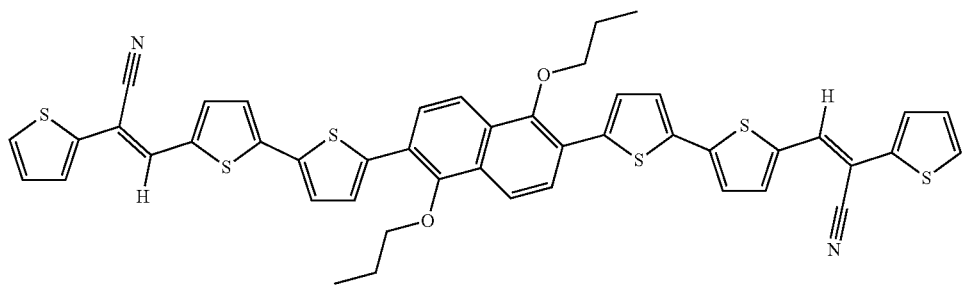
20
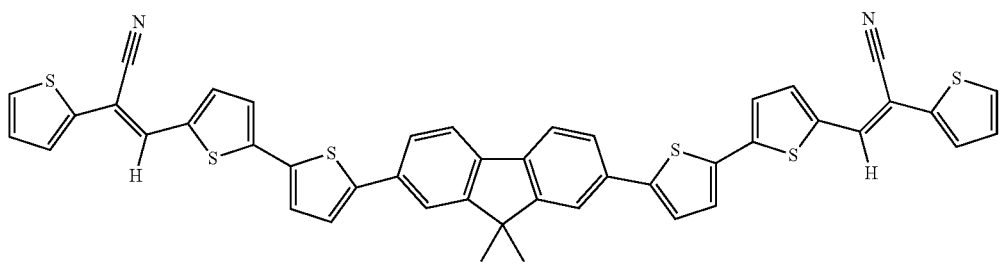
21
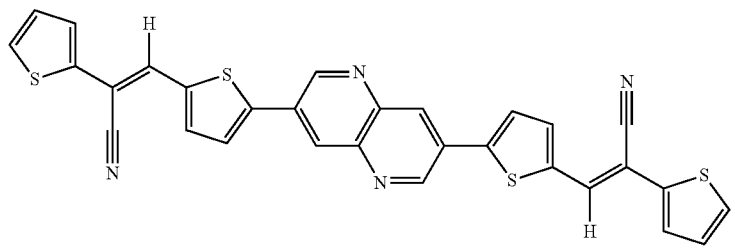
22
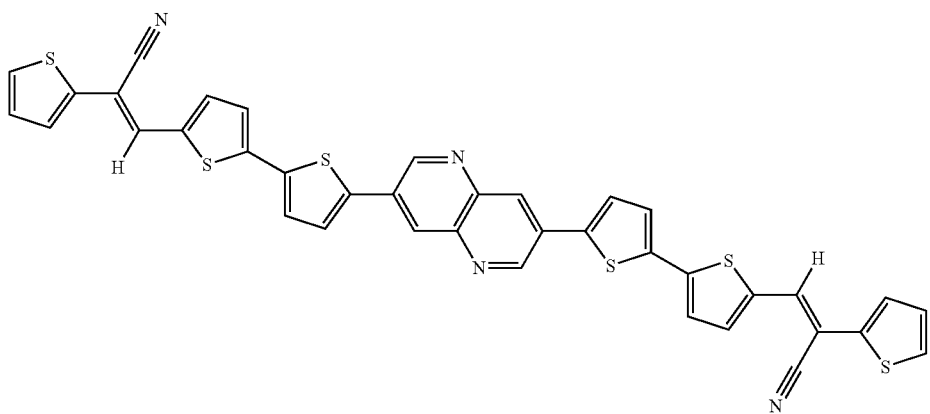
23
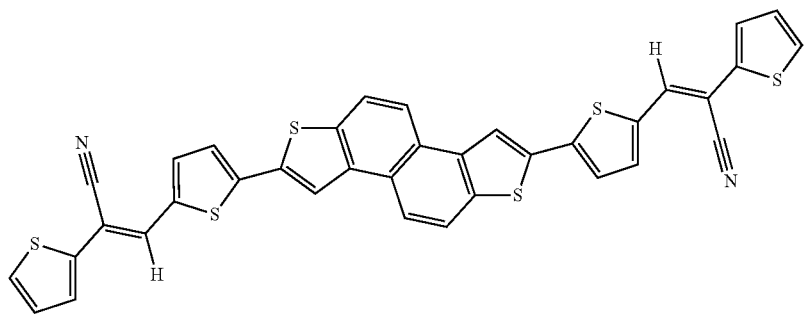
24

25
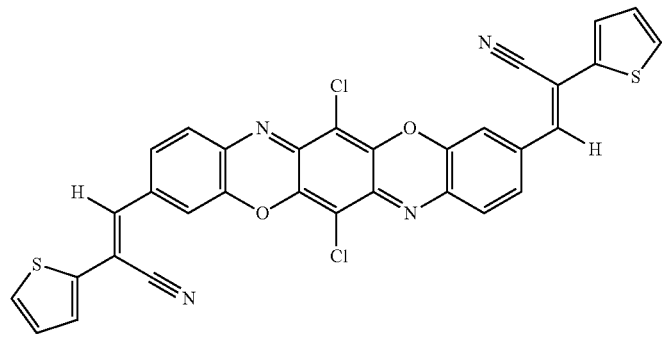
26
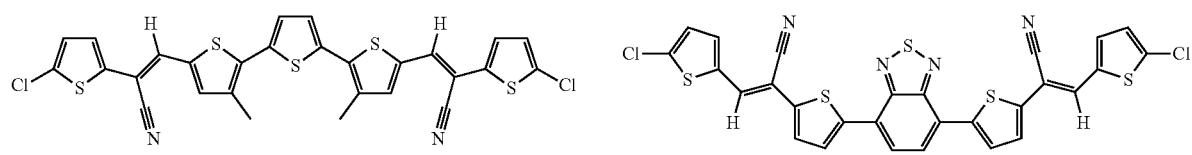
27
28
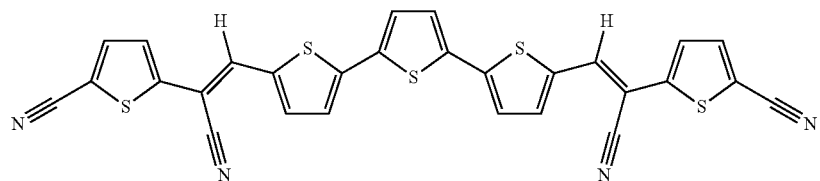
29
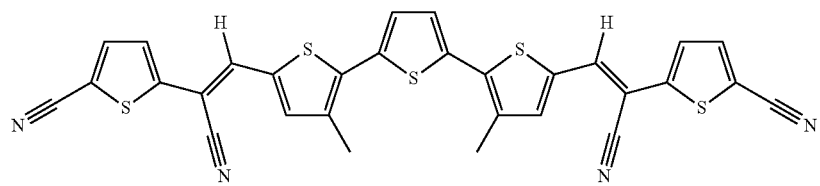
30
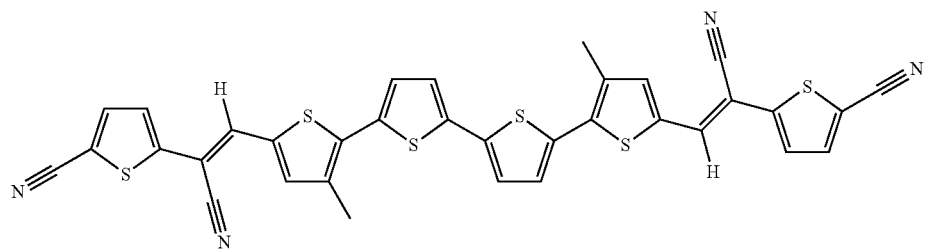
31
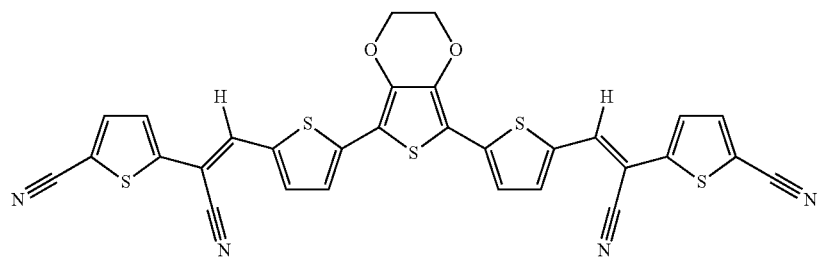

32
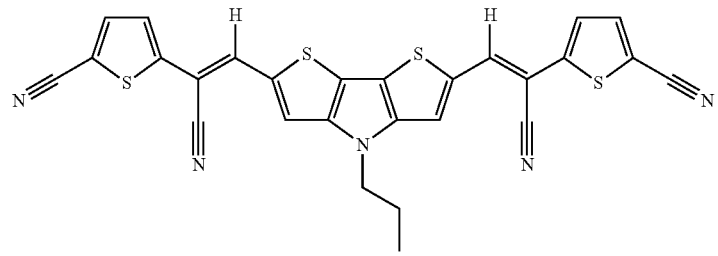
33
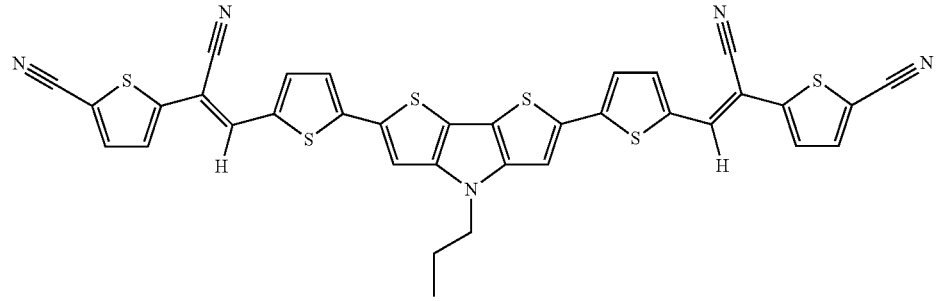
34
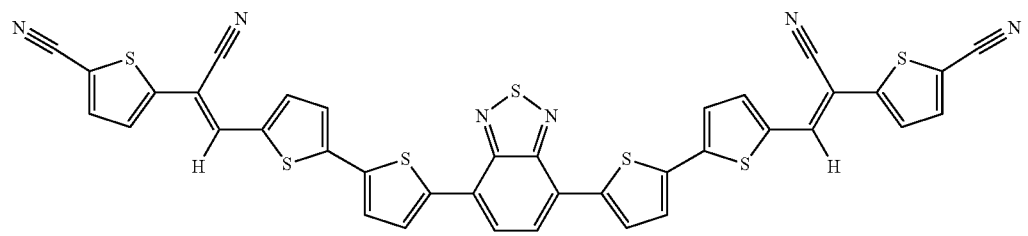
35
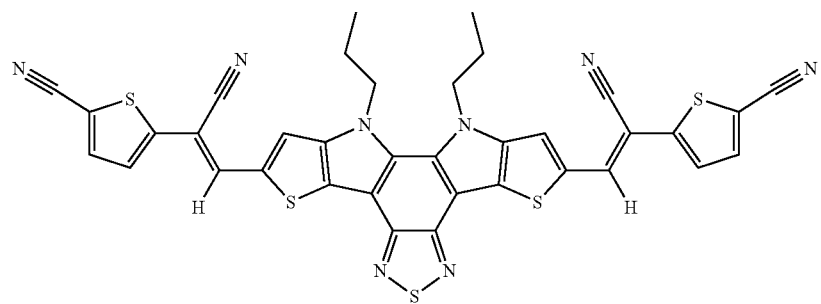
36
37
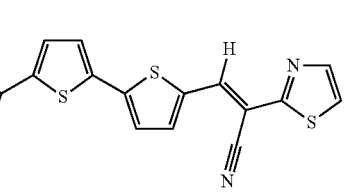
38
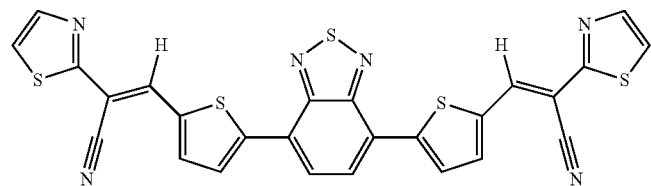

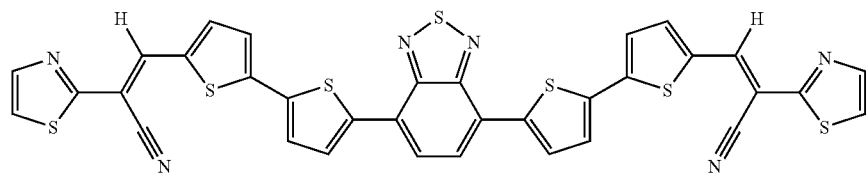
39
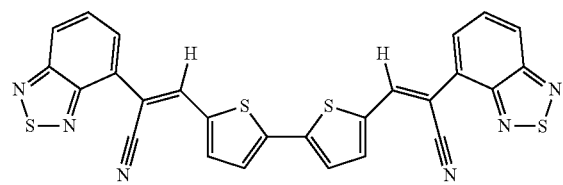
40
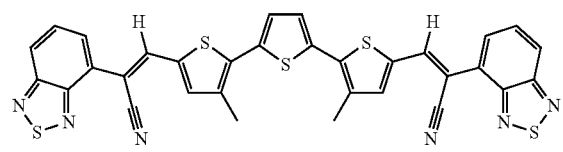
41
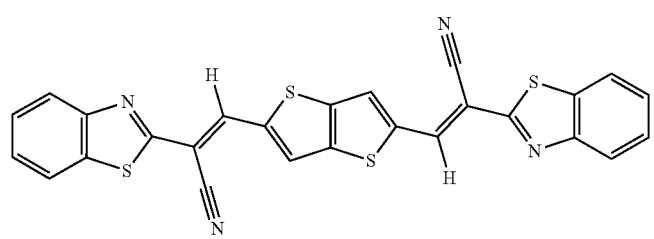
42
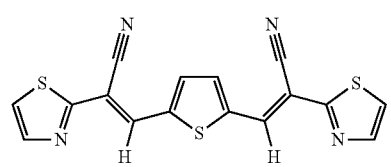
43
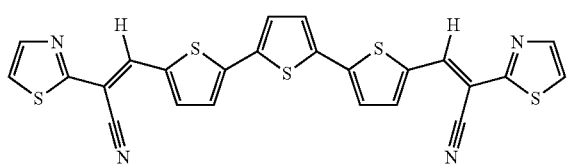
44
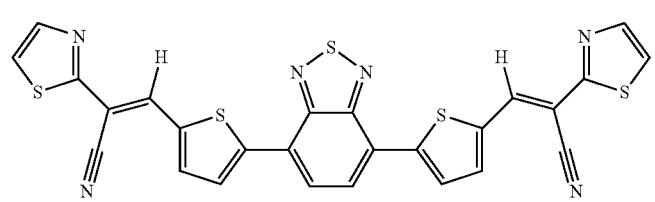
36
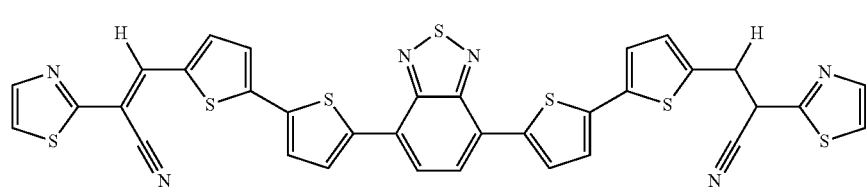
37
38
39

-continued
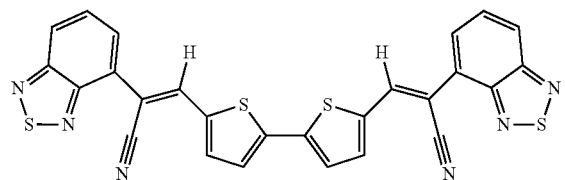
40
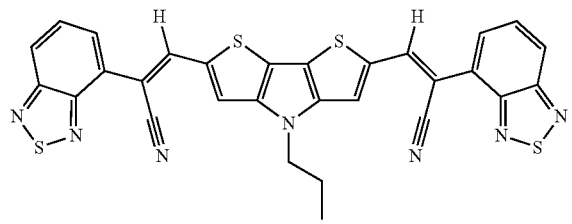
41
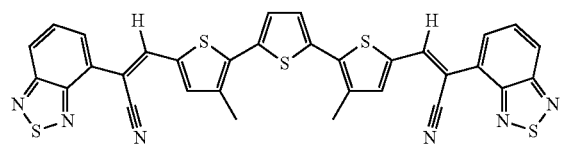
42
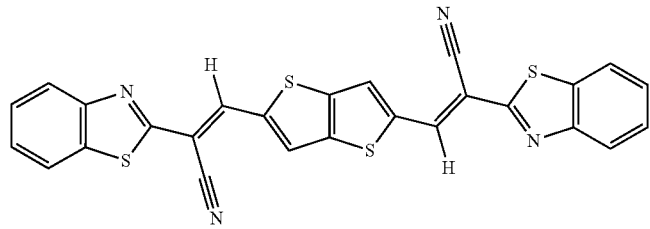
43
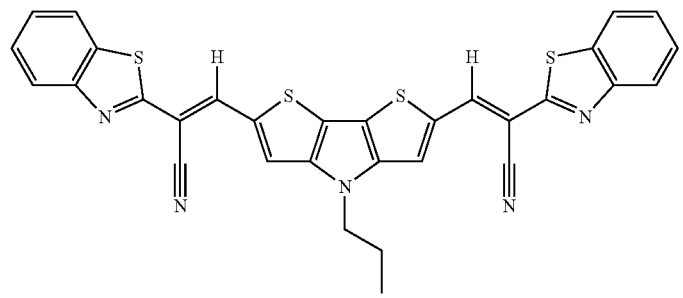
44
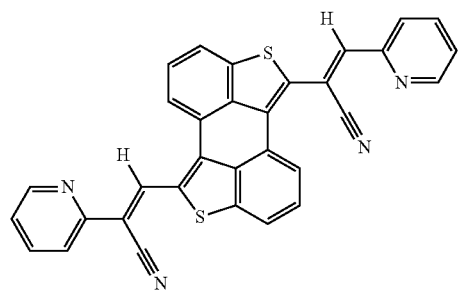
45
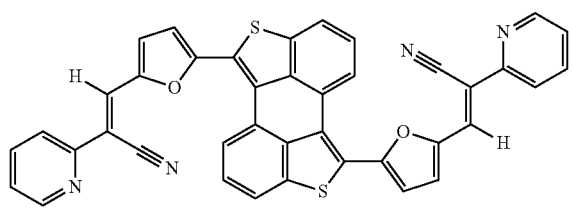
46
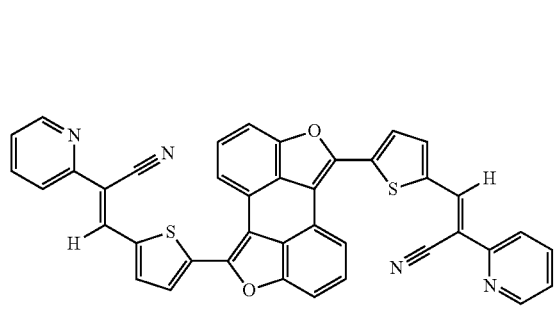
47
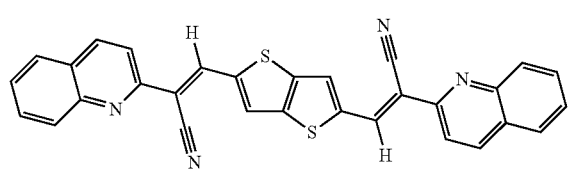
48
49

-continued

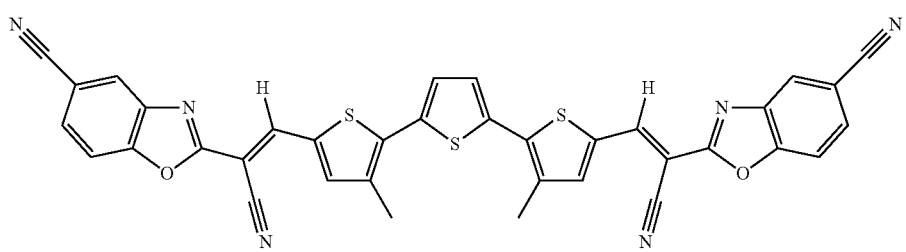

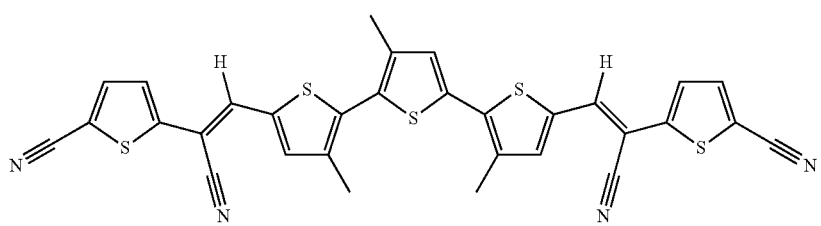

It is especially preferred that the compound of formula (I) is selected from the group of compounds of formulae 1 to 10 and 12 to 51.

For certain purposes, the compound of formula 11 is slightly less preferred than the compounds of formulae 1 to 10 and 12 to 51.

A compound of formula 11 is allegedly disclosed by J. A. Mikroyannidis et al. in "New 4,7-dithienebenzothiadiazole derivatives with cyano-vinylene bonds: Synthesis, photophysics and photovoltaics"; Synthetic Metals 2009, 159, 1471-1477. However, the analytical data, i.e. $^1$H-NMR and UV-vis, reported by J. A. Mikroyannidis et al. do not fit with the data obtained in own experiments. In detail, the UV-vis absorption spectrum of the compound of formula 11 in THF solvent shows an absorption $\lambda(\text{lambda})_{max}$ of 523 nm, whereas J. A. Mikroyannidis et al. give a value for $\lambda(\text{lambda})_{max}$ of 478 nm in THF. Further, according to own experiments the compound of formula 11 produces 7 sets of signals in its $^1$H-NMR spectrum measured in CDCl$_3$ corresponding to the presence of 7 different proton moieties, whereas J. A. Mikroyannidis et al. merely report the presence of 6 sets of signals.

In view of the above findings, for the skilled person it is clear that J. A. Mikroyannidis et al. in fact did not obtain a compound according to formula 11 above.

A compound of formula (I) as defined above may be synthesized using a compound of formula (III)

wherein A is defined as described above for the compound of formula (I).

Therefore, the present invention also provides the use of a compound of formula (III), wherein A is defined as described above, in the synthesis of a compound of formula (I) as defined above.

According to the present invention it is preferred that A is selected from the group consisting of:

The present invention also relates to a compound of formula (III)

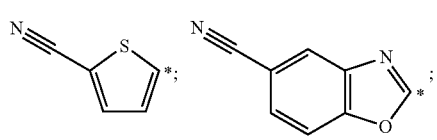

wherein A is selected from the group consisting of:

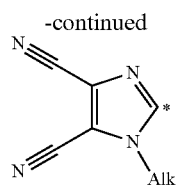

The compounds of formula (I) as defined above are especially suitable for use as donor substance or as acceptor substance in a photoactive material, wherein preferably the photoactive material is part of a layer of a donor-acceptor bilayer or part of a donor-acceptor mixed layer (bulk heterojunction, BHJ).

Thus, the present invention is also directed to the use of a compound of formula (I) as defined above as donor substance or as acceptor substance in a photoactive material, wherein preferably the photoactive material is part of a layer of a donor-acceptor bilayer or part of a donor-acceptor mixed layer (bulk heterojunction, BHJ), and/or wherein preferably the photoactive material is part of a solar cell or sensor.

According to the present invention it is preferred that the inventive photoactive material as described above further comprises one or more semiconductor material(s).

According to the present invention it is preferred that the photoactive material as described above comprises at least one compound of formula (I) as donor substance, which is in contact with at least one fullerene or fullerene derivative as acceptor substance, such as $C_{60}$, $C_{70}$, $C_{84}$, phenyl-$C_{61}$-butyric acid methyl ester ([60]PCBM), phenyl-$C_{71}$-butyric acid methyl ester ([70]PCBM), phenyl-$C_{85}$-butyric acid methyl ester ([84]PCBM), phenyl-$C_{61}$-butyric acid butyl ester ([60]PCBB), phenyl-$C_{61}$-butyric acid octyl ester ([60] PCBO), thienyl-$C_{61}$-butyric acid methyl ester ([60] ThCBM), [6,6]-phenyl-$C_{61}$-butyric acid methyl ester and mixtures thereof. Particular preference is given to $C_{60}$, $C_{70}$, [6,6]-phenyl-$C_{61}$-butyric acid methyl ester and mixtures thereof. Preference is also given to 3,4,9,10-perylenetetracarboxyl-bisbenzimidazole (PTCBI) as acceptor substance.

According to the present invention it is especially preferred that the photoactive material as described above comprises a donor substance and an acceptor substance, wherein the donor substance comprises or consists of one or more compounds of formula (I) described above, and wherein the acceptor substance comprises or consists of one or more compounds selected from the group of
 (i) fullerenes and fullerene derivatives, preferably selected from the group consisting of $C_{60}$, $C_{70}$ and [6,6]-phenyl-$C_{61}$-butyric acid methyl ester, and
 (ii) 3,4,9,10-perylenetetracarboxyl-bisbenzimidazole (PTCBI).

The invention also provides an organic solar cell or a sensor, the solar cell or sensor comprising a photoactive material as defined above.

In the context of the present invention a sensor is meant to cover both a light sensor and a chemical sensor.

Organic solar cells generally have a layer structure and generally comprise at least the following layers: anode, photoactive layer and cathode. These layers are generally applied to a substrate suitable for this purpose. The structure of organic solar cells is described, for example, in US 2005/0098726 and US 2005/0224905.

The inventive organic solar cell comprises at least one photoactive material. The photoactive material comprises a donor substance and an acceptor substance, wherein preferably the donor substance and the acceptor substance are part of respective layers of a donor-acceptor bilayer or part of a donor-acceptor mixed layer (bulk heterojunction, BHJ).

Organic solar cells with photoactive donor-acceptor transitions in the form of a bulk heterojunction are especially preferred according to the present invention.

Suitable substrates for organic solar cells are, for example, oxidic materials, polymers and combinations thereof. Preferred oxidic materials are selected from glass, ceramic, $SiO_2$, quartz, etc. Preferred polymers are selected from polyethylene terephthalates, polyolefins (such as polyethylene and polypropylene), polyesters, fluoropolymers, polyamides, polyurethanes, polyalkyl (meth)acrylates, polystyrenes, polyvinyl chlorides and mixtures and composites.

Suitable electrodes (cathode, anode) are in principle semiconductors, metal alloys, semiconductor alloys and combinations thereof. Preferred metals are those of groups 2, 8, 9, 10, 11 or 13 of the periodic table, e.g. Pt, Au, Ag, Cu, Al, In, Mg or Ca.

Preferred semiconductors are, for example, doped Si, doped Ge, indium tin oxide (ITO), fluorinated tin oxide (FTO), gallium indium tin oxide (GITO), zinc indium tin oxide (ZITO), etc. Preferred metal alloys are for example alloys based on Pt, Au, Ag, Cu, etc. Especially preferred are Mg/Ag alloys.

The material used for the electrode facing the light (the anode in a normal structure, the cathode in an inverse structure) is preferably a material at least partly transparent to the incident light. This preferably includes electrodes which have glass and/or a transparent polymer as a carrier material. Transparent polymers suitable as carriers are those mentioned above, such as polyethylene terephthalate. The electrical contact connection is generally effected by means of metal layers and/or transparent conductive oxides (TCOs). These preferably include ITO, doped ITO, FTO (fluorine doped tin oxide), AZO (aluminum doped tin oxide), ZnO, $TiO_2$, Ag, Au, Pt. Particular preference is given to ITO for contact connection. For electrical contact connection, it is also possible to use a conductive polymer, for example a poly-3,4-alkylenedioxy-thiophene, e.g. poly-3,4-ethyleneoxythiophene (PEDOT).

The electrode facing the light is configured such that it is sufficiently thin to bring about only minimal light absorption but thick enough to enable good charge transport of the extracted charge carriers. The thickness of the electrode layer (without carrier material) is preferably within a range from 20 to 200 nm.

According to the present invention it is preferred that the material used for the electrode facing away from the light (the cathode in a normal structure, the anode in an inverse structure) is a material which at least partly reflects the incident light. This includes metal films, preferably of Ag, Au, Al, Ca, Mg, In, and mixtures thereof. Preferred mixtures are Mg/Al. The thickness of the electrode layer is preferably within a range from 50 to 300 nm.

The photoactive region comprises or consists of at least one layer comprising or consisting of a photoactive material as defined above. In addition, the photoactive region may have one or more further layer(s). These are, for example, selected from
 layers with electron-conducting properties (electron transport layer, ETL),
 layers which comprise a hole-conducting substance (hole transport layer, HTL), which need not absorb any radiation,
 exciton- and hole-blocking layers (e.g. EBLs), which must not absorb, and
 multiplication layers.

Suitable materials for these layers are described in detail hereinafter. Suitable exciton and hole-blocking layers are described, for example, in U.S. Pat. No. 6,451,415. Suitable materials for exciton-blocking layers are, for example, bathocuproine (BCP), 4,4',4"-tris[3-methylphenyl-N-phenylamino]triphenylamine (m-MTDATA) or polyethylenedioxythiophene (PEDOT).

The inventive organic solar cells comprise at least one photoactive donor-acceptor heterojunction. Optical excitation of an organic substance generates excitons. In order that a photocurrent occurs, the electron-hole pair has to be separated, typically at a donor-acceptor interface between two unlike contact materials. At such an interface, the donor substance forms a heterojunction with an acceptor substance. When the charges are not separated, they can recombine in a process also known as "quenching", either radiatively by the emission of light of a lower energy than the incident light or nonradiatively by generation of heat. Both processes are undesired. According to the invention, at least one compound of formula (I) can be used as a charge generator (donor). In combination with an appropriate electron acceptor substance (ETM, electron transport material), radiative excitation is followed by a rapid electron transfer to the ETM. Suitable ETMs are $C_{60}$ and other fullerenes.

According to the present invention it is preferred that the heterojunction has a flat configuration, i.e. a bilayer configuration (see: Two layer organic photovoltaic cell, C. W. Tang, *Appl. Phys. Lett.* 1986, 48 (2), 183-185 or N. Karl, A. Bauer, J. Holzapfel, J. Marktanner, M. Mobus, F. Stolzle, *Mol. Cryst. Liq. Cryst.* 1994, 252, 243-258).

According to the present invention it is also preferred that the heterojunction is configured as a bulk (mixed) heterojunction, also referred to as an interpenetrating donor-acceptor network. Organic photovoltaic cells with a bulk heterojunction are described, for example, by C. J. Brabec, N. S. Sariciftci, J. C. Hummelen in *Adv. Funct. Mater.* 2001, 11 (1), 15 or by J. Xue, B. P. R and, S. Uchida and S. R. Forrest in *J. Appl. Phys.* 2005, 98, 124903. Bulk heterojunctions are discussed in detail hereinafter.

The compounds of the formula (I) can be used in a photoactive material in cells with MiM, pin, pn, Mip or Min structure (M=metal, p=p-doped organic or inorganic semiconductor, n=n-doped organic or inorganic semiconductor, i=intrinsically conductive system of organic layers; see, for example, J. Drechsel et al., *Org. Electron.* 2004, 5 (4), 175 or Maennig et al., *Appl. Phys. A* 2004, 79, 1-14).

The compounds of the formula (I) can also be used in a photoactive material in tandem cells. Suitable tandem cells are described, for example, by P. Peumans, A. Yakimov, S. R. Forrest in *J. Appl. Phys.* 2003, 93 (7), 3693-3723 (see also U.S. Pat. Nos. 4,461,922, 6,198,091 and 6,198,092) and are described in detail hereinafter. The use of compounds of the general formula (I) in tandem cells is preferred.

The compounds of the formula (I) can also be used in a photoactive material in tandem cells which are constructed from two or more than two stacked MiM, pin, Mip or Min structures (see DE 103 13 232.5 and J. Drechsel et al., *Thin Solid Films* 2004, 451-452, 515-517).

The layer thickness M, n, i and p layers is typically within a range from 10 to 1000 nm, more preferably from 10 to 400 nm. The layers which form the solar cell can be produced by customary processes known to those skilled in the art. These include vapor deposition under reduced pressure or in an inert gas atmosphere, laser ablation or solution or dispersion processing methods such as spincoating, knifecoating, casting methods, spray application, dipcoating or printing (e.g. inkjet, flexographic, offset, gravure; intaglio, nanoimprinting). According to the present invention it is preferred that the entire solar cell is produced by a gas phase deposition process.

In order to improve the efficiency of organic solar cells, it is possible to shorten the mean distance through which the exciton has to diffuse in order to arrive at the next donor-acceptor interface. To this end, it is possible to use mixed layers of donor substances and acceptor substances which form an interpenetrating network in which internal donor-acceptor heterojunctions are possible. This bulk heterojunction is a specific form of the mixed layer, in which the excitons generated need only travel a very short distance before they arrive at a domain boundary, where they are separated.

According to the present invention it is preferred that the photoactive donor-acceptor transitions in the form of a bulk heterojunction are produced by a gas phase deposition process (physical vapor deposition, PVD). Suitable processes are described, for example, in US 2005/0227406, to which reference is made here. To this end, a compound of the general formula (I) and a complementary semiconductor material can be subjected to a gas phase deposition in the manner of a cosublimation. PVD processes are performed under high-vacuum conditions and comprise the following steps: evaporation, transport, deposition. The deposition is effected preferably at a pressure within a range from about $10^{-2}$ mbar to $10^{-7}$ mbar, for example from $10^{-5}$ to $10^{-7}$ mbar. The deposition rate is preferably within a range from 0.01 to 10 nm/s. The deposition can be effected in an inert gas atmosphere, for example under nitrogen, helium or argon. The temperature of the substrate during the deposition is preferably within a range from −100 to 300° C., more preferably from −50 to 250° C.

The other layers of the organic solar cell can be produced by known processes. These include vapor deposition under reduced pressure or in an inert gas atmosphere, laser ablation, or solution or dispersion processing methods such as spincoating, knifecoating, casting methods, spray application, dipcoating or printing (e.g. inkjet, flexographic, offset, gravure; intaglio, nanoimprinting). According to the present invention it is especially preferred that the entire solar cell is produced by a gas phase deposition process.

The photoactive layer (homogeneous layer or mixed layer) can be subjected to a thermal treatment directly after production thereof or after production of further layers which form the solar cell. Such a heat treatment can in many cases further improve the morphology of the photoactive layer. The temperature is preferably within a range from about 60° C. to 300° C. The treatment time is preferably within a range from 1 minute to 3 hours. In addition or alternatively to a thermal treatment, the photoactive layer (mixed layer) can be subjected to a treatment with a solvent-containing gas directly after production thereof or after production of further layers which form the solar cell. In this respect, saturated solvent vapors in air are used at ambient temperature. Suitable solvents are toluene, xylene, chloroform, N-methylpyrrolidone, dimethylformamide, ethyl acetate, chlorobenzene, dichloromethane and mixtures thereof. The treatment time is preferably within a range from 1 minute to 3 hours.

According to the present invention it is preferred that the inventive organic solar cells are present as an individual cell with flat heterojunction normal structure. FIG. 1 shows an inventive solar cell with normal structure. It is especially preferred that the cell has the following structure:

an at least partly transparent conductive layer (top electrode, anode) (11)

a hole-conducting layer (hole transport layer, HTL) (12)
a layer which comprises a donor substance (13)
a layer which comprises an acceptor substance (14)
an exciton-blocking and/or electron-conducting layer (15)
a second conductive layer (back electrode, cathode) (16)

The donor substance preferably comprises at least one compound of formula (I) or consists of a compound of the formula (I). According to the present invention it is preferred that the acceptor substance comprises at least one fullerene or fullerene derivative, or consists of a fullerene or fullerene derivative. The acceptor substance preferably comprises $C_{60}$, $C_{70}$, [6,6]-phenyl-C61-butyric acid methyl ester or PTCBI (3,4,9,10-perylenetetracarboxyl-bisbenzimidazole).

The essentially transparent conductive layer (11) (anode) comprises a carrier, such as glass or a polymer (e.g. polyethylene terephthalate) and a conductive material, as described above. Examples include ITO, doped ITO, FTO, ZnO, AZO, etc. The anode material can be subjected to a surface treatment, for example with UV light, ozone, oxygen plasma, $Br_2$, etc. The layer (11) should be sufficiently thin to enable maximum light absorption, but also sufficiently thick to ensure good charge transport. The layer thickness of the transparent conductive layer (11) is preferably within a range from 20 to 200 nm.

The solar cell with normal structure according to FIG. 1 optionally has a hole-conducting layer (HTL). This layer comprises at least one hole-conducting substance (hole transport material, HTM). Layer (12) may be an individual layer of essentially homogeneous composition or may comprise two or more than two sublayers.

Hole-conducting materials (HTM) suitable for forming layers with hole-conducting properties (HTL) preferably comprise at least one substance with high ionization energy. The ionization energy is preferably at least 5.0 eV, more preferably at least 5.5 eV. The substance may be organic or inorganic. Organic substances suitable for use in a layer with hole-conducting properties are preferably selected from poly (3,4-ethylenedioxythiophene) poly(styrenesulfonate) (PEDOT-PSS), Ir-DPBIC (tris-N,N-diphenylbenzimidazol-2-ylideneiridium(III)), N,N'-diphenyl-N,N'-bis(3-methylphenyl)-1,1'-diphenyl-4,4'-diamine (a-NPD), 2,2',7,7'-tetrakis(N,N-di-p-methoxyphenylamine)-9,9'-spirobifluorene (spiro-MeOTAD), etc. and mixtures thereof. The organic substances may, if desired, be doped with a p-dopant which has a LUMO within the same range as or lower than the HOMO of the hole-conducting substance. Suitable dopants are, for example, 2,3,5,6-tetrafluoro-7,7,8,8-tetracyanoquinodimethane (F4TCNQ), $WO_3$, $MoO_3$, etc. Inorganic substances suitable for use in a layer with hole-conducting properties are preferably selected from $WO_3$, $MoO_3$, etc.

If present, the thickness of the layers with hole-conducting properties is preferably within a range from 5 to 200 nm, more preferably 10 to 100 nm.

Layer (13) comprises at least one compound of general formula (I). The thickness of the layer should be sufficient to absorb a maximum amount of light, but thin enough to enable effective dissipation of the charge. The thickness of layer (13) is preferably within a range from 5 nm to 1 µm, more preferably from 5 to 80 nm.

Layer (14) comprises at least one acceptor substance. According to the present invention it is preferred that the acceptor substance comprises at least one fullerene or fullerene derivative. The thickness of the layer should be sufficient to absorb a maximum amount of light, but thin enough to enable effective dissipation of the charge. The thickness of layer (14) is preferably within a range from 5 nm to 1 µm, more preferably from 5 to 80 nm.

The solar cell with normal structure according to FIG. 1 optionally comprises an exciton-blocking and/or electron-conducting layer (15) (EBUETL). Suitable substances for exciton-blocking layers generally have a greater band gap than the substances of layer (13) and/or (14). They are firstly capable of reflecting excitons and secondly enable good electron transport through the layer. The materials for the layer (15) may comprise organic or inorganic substances. Suitable organic substances are preferably selected from 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)-1,3,4-oxadiazo-5-yl]benzene (BPY-OXD), etc. The organic substances may, if desired, be doped with an n-dopant which has a HOMO within the same range as or lower than the LUMO of the electron-conducting substance. Suitable dopants are, for example, $Cs_2CO_3$, Pyronin B (PyB), Rhodamine B, cobaltocenes, etc. Inorganic materials suitable for use in a layer with electron-conducting properties are preferably selected from ZnO, etc. If present, the thickness of the layer (15) is preferably within a range from 5 to 500 nm, more preferably 10 to 100 nm.

Layer (16) is the cathode and preferably comprises at least one compound with low work function, more preferably a metal such as Ag, Al, Mg, Ca, etc. The thickness of the layer (16) is preferably within a range from about 10 nm to 10 µm, e.g. 10 nm to 60 nm.

According to the present invention it is preferred that the inventive solar cells are present as an individual cell with a flat heterojunction and inverse structure. FIG. 2 shows a solar cell with inverse structure. It is especially preferred that the cell has the following structure:

an at least partly transparent conductive layer (cathode) (11)
an exciton-blocking and/or electron-conducting layer (12)
a layer which comprises an acceptor substance (13)
a layer which comprises a donor substance (14)
a hole-conducting layer (hole transport layer, HTL) (15)
a second conductive layer (back electrode, anode) (16)

With regard to suitable and preferred materials for the layers (11) to (16), reference is made to the above remarks regarding the corresponding layers in solar cells with normal structure.

According to the present invention it is also preferred that the inventive organic solar cells are present as an individual cell with normal structure and have a bulk heterojunction. FIG. 3 shows a solar cell with a bulk heterojunction. It is especially preferred that the cell has the following structure:

an at least partly transparent conductive layer (anode) (21)
a hole-conducting layer (hole transport layer, HTL) (22)
a mixed layer which comprises a donor substance and an acceptor substance, which form a donor-acceptor heterojunction in the form of a bulk heterojunction (23)
an electron-conducting layer (24)
an exciton-blocking and/or electron-conducting layer (25)
a second conductive layer (back electrode, cathode) (26)

The layer (23) comprises at least one a photoactive material comprising at least one compound of general formula (I), especially as a donor substance. The layer (23) additionally comprises preferably at least one fullerene or fullerene derivative as an acceptor substance. The layer (23) preferably comprises $C_{60}$ or PTCBI (3,4,9,10-perylenetetracarboxyl-bisbenzimidazole) as an acceptor substance. With regard to layer (21), reference is made completely to the above remarks regarding layer (11).

With regard to layer (22), reference is made completely to the above remarks regarding layer (12).

Layer (23) is a mixed layer which comprises at least one compound of the general formula (I) as a donor substance. In addition, layer (23) comprises at least one acceptor substance. As described above, layer (23) can be produced by coevaporation or by solution processing using customary solvents. The mixed layer comprises preferably 10 to 90% by weight, more preferably 20 to 80% by weight, of at least one compound of the general formula (I), based on the total weight of the mixed layer. The mixed layer comprises preferably 10 to 90% by weight, more preferably 20 to 80% by weight, of at least one acceptor substance, based on the total weight of the mixed layer. The thickness of the layer (23) should be sufficient to absorb a maximum amount of light, but thin enough to enable effective dissipation of the charge. The thickness of the layer (23) is preferably within a range from 5 nm to 1 µm, more preferably from 5 to 200 nm, most preferably from 5 to 80 nm.

The solar cell with a bulk heterojunction according to FIG. 3 comprises an electron-conducting layer (24) (ETL). This layer comprises at least one electron transport material (ETM). Layer (24) may be a single layer of essentially homogeneous composition or may comprise two or more than two sublayers. Suitable materials for electron-conducting layers generally have a low work function or ionization energy. The ionization energy is preferably not more than 3.5 eV. Suitable organic substances are preferably selected from the aforementioned fullerenes and fullerene derivatives, 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)-1,3,4-oxadiazo-5-yl]benzene (BPY-OXD), etc. The organic substances used in layer (24) may, if desired, be doped with an n-dopant which has a HOMO within the same range as or lower than the LUMO of the electron-conducting substance. Suitable dopants are, for example, $Cs_2CO_3$, Pyronin B (PyB), Rhodamine B, cobaltocenes, etc. The thickness of the layer (23) is, if present, preferably within a range from 1 nm to 1 µm, more preferably from 5 to 60 nm.

With regard to layer (25), reference is made completely to the above remarks regarding layer (15).

With regard to layer (26), reference is made completely to the above remarks regarding layer (16).

The solar cell with a donor-acceptor heterojunction in the form of a bulk heterojunction can be produced by a gas phase deposition process as described above. With regard to deposition rates, substrate temperature during the deposition and thermal aftertreatment, reference is made to the above remarks.

According to the present invention it is also preferred that the inventive organic solar cells are present as an individual cell with inverse structure and have a bulk heterojunction. FIG. 4 shows a solar cell with a bulk heterojunction and inverse structure.

The present invention also provides a photoelectric conversion device comprising or consisting of two or more organic solar cells as described above, wherein preferably the solar cells are arranged as tandem cells (multi-junction solar cells).

A photoelectric conversion device consists of two or more than two (e.g. 3, 4, 5) solar cells. A single solar cell, some of the solar cells or all solar cells may have photoactive donor-acceptor heterojunctions. Each donor-acceptor heterojunction may be in the form of a flat heterojunction or in the form of a bulk heterojunction. Preferably, at least one of the donor-acceptor heterojunctions is in the form of a bulk heterojunction. According to the invention, the photoactive material of at least one solar cell comprises a compound of general formula (I). Preferably, the photoactive material of at least one solar cell comprises a compound of general formula (I) and at least one fullerene or fullerene derivative. More preferably, the semiconductor mixture used in the photoactive layer of at least one solar cell consists of a compound of formula (I) and $C_{60}$, $C_{70}$ or [6,6]-phenyl-$C_{61}$-butyric acid methyl ester.

The solar cells which are arranged as tandem cells may be connected in parallel or in series. The solar cells which are arranged as tandem cells are preferably connected in series. There is preferably an additional recombination layer in each case between the individual solar cells. The individual solar cells have the same polarity, i.e. generally either only cells with normal structure or only cells with inverse structure are combined with one another.

FIG. 5 shows the basic structure of a photoelectric conversion device in which the solar cells are arranged as tandem cells. Layer 31 is a transparent conductive layer. Suitable materials are those specified above for the individual cells.

Layers 32 and 34 constitute subcells. "Subcell" refers here to a cell as defined above without cathode and anode. The subcells may, for example, either all have a compound of general formula (I) used in accordance with the invention in the photoactive material (preferably in combination with a fullerene or fullerene derivative, especially $C_{60}$) or have other combinations of semiconductor materials, for example $C_{60}$ with zinc phthalocyanine, $C_{60}$ with oligothiophene (such as DCV5T). In addition, individual subcells may also be configured as dye-sensitized solar cells or polymer cells. In all cases, preference is given to a combination of materials which exploit different regions of the spectrum of the incident light, for example of natural sunlight. For instance, the combination of a compound of general formula (I) and a fullerene or a fullerene derivative used in accordance with the invention absorbs in the long-wave region of sunlight. Dibenzoperiflanthene(DBP)-$C_{60}$ absorbs primarily in the range from 400 nm to 600 nm. Zinc phthalocyanine-$C_{60}$ cells absorb primarily in the range from 600 nm to 800 nm. Thus, a photoelectric conversion device composed of a combination of these subcells should absorb radiation in the range from 400 nm to 800 nm. Suitable combination of subcells should thus allow the spectral range utilized to be extended. For optimal performance properties, optical interference should be considered. For instance, subcells which absorb at relatively short wavelengths should be arranged closer to the metal top contact than subcells with longer-wave absorption.

With regard to layer (31), reference is made completely to the above remarks regarding layers (11) and (21).

With regard to layers (32) and (34), reference is made completely to the above remarks regarding layers (12) to (15) for flat heterojunctions and (22) to (25) for bulk heterojunctions.

Layer (33) is a recombination layer. Recombination layers enable the charge carriers from one subcell to recombine with those of an adjacent subcell. Small metal clusters are suitable, such as Ag, Au or combinations of highly n- and p-doped layers. In the case of metal clusters, the layer thickness is preferably within a range from 0.5 to 5 nm. In the case of highly n- and p-doped layers, the layer thickness is preferably within a range from 5 to 40 nm. The recombination layer generally connects the electron-conducting layer of a subcell to the hole-conducting layer of an adjacent subcell. In this way, further cells can be combined to form the photoelectric conversion device.

Layer (36) is the top electrode. The material depends on the polarity of the subcells. For subcells with normal structure, preference is given to using metals with a low work function, such as Ag, Al, Mg, Ca, etc. For subcells with inverse structure, preference is given to using metals with a high work function, such as Au or Pt, or PEDOT-PSS.

In the case of subcells connected in series, the overall voltage corresponds to the sum of the individual voltages of all subcells. The overall current, in contrast, is limited by the lowest current of one subcell. For this reason, the thickness of each subcell should be optimized such that all subcells have essentially the same current.

Examples of different kinds of donor-acceptor heterojunctions are a donor-acceptor double layer with a flat heterojunction, or the heterojunction is configured as a hybrid planar-mixed heterojunction or gradient bulk heterojunction or annealed bulk heterojunction.

The production of a hybrid planar-mixed heterojunction is described in Adv. Mater. 2005, 17, 66-70. In this structure, mixed heterojunction layers, which were formed by simultaneous evaporation of acceptor and donor material, are present between homogeneous donor and acceptor material.

According to the present invention it is preferred that the organic solar cells of the inventive photoelectric conversion device are arranged as tandem cells (multi-junction solar cells) or as inverted tandem cells.

In addition to fullerenes, the semiconductor materials listed hereinafter are suitable in principle for use in the inventive organic solar cells. They serve as donors or acceptors for subcells of a tandem cell, which are combined with a subcell according to the present invention.

Suitable further semiconductors are phthalocyanines. These include phthalocyanines which are nonhalogenated or which bear 1 to 16 halogen atoms. The phthalocyanines may be metal-free or contain a divalent metal or a metal atom-containing group.

Preference is given to phthalocyanines based on zinc, copper, iron, titanyloxy, vanadyloxy, etc. Particular preference is given to copper phthalocyanines, zinc phthalocyanines, metal-free phthalocyanines. According to the present invention it is preferred that halogenated phthalocyanines are used. These include:

2,6,10,14-tetrafluorophthalocyanines, e.g. copper 2,6,10,14-tetrafluorophthalocyanine and zinc 2,6,10,14-tetrafluorophthalocyanine;

1,5,9,13-tetrafluorophthalocyanines, e.g. copper 1,5,9,13-tetrafluorophthalocyanines and zinc 1,5,9,13-tetrafluorophthalocyanines;

2,3,6,7,10,11,14,15-octafluorophthalocyanine, e.g. copper 2,3,6,7,10,11,14,15-octafluorophthalocyanine and zinc 2,3,6,7,10,11,14,15-octafluorophthalocyanine;

phthalocyanines which are suitable as acceptors are, for example, hexadecachlorophthalocyanines and hexadecafluorophthalocyanines, such as copper hexadecachlorophthalocyanine, zinc hexadecachlorophthalocyanine, metal-free hexadecachlorophthalocyanine, copper hexadecafluorophthalocyanine, hexadecafluorophthalocyanine or metal-free hexadecafluorophthalocyanine.

Preferred features of the present invention are explained in the claims and the specification. It is understood that combinations of preferred features are within the scope of the present invention.

The invention is hereinafter further illustrated by means of the following examples.

PREPARATION EXAMPLES OF COMPOUNDS OF FORMULA (I)

Synthesis of Acetonitriles
2-(5-Chloro-2-thienyl)acetonitrile (A1):

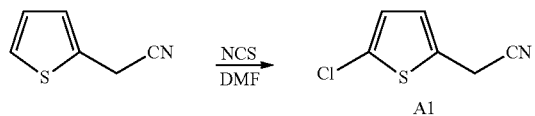

2-Thiopheneacetonitrile (3.69 g, 30 mmol) was dissolved in 15 mL of anhydrous DMF and N-chlorosuccinimide (4.54 g, 34 mmol) dissolved in 5 mL of anhydrous DMF solution was added drop-wise into the reaction. The reaction was stirred overnight in dark and under argon atmosphere at 22° C. Reaction was poured into water and extracted with diethyl ether and the organic layer was dried under sodium sulphate and concentrated to get the crude acetonitrile A1. The compound was purified by silica column chromatography using 100% hexane and gradually raising the polarity to 5% ethylacetate/hexane. Yield=3.77 g (80%). $^1$H-NMR (CDCl$_3$, 400 MHz, ppm): δ 6.85 (m, 1H), 6.80 (d, 1H), 3.82 (s, 2H).

2-(5-Cyano-2-thienyl)acetonitrile (A2):

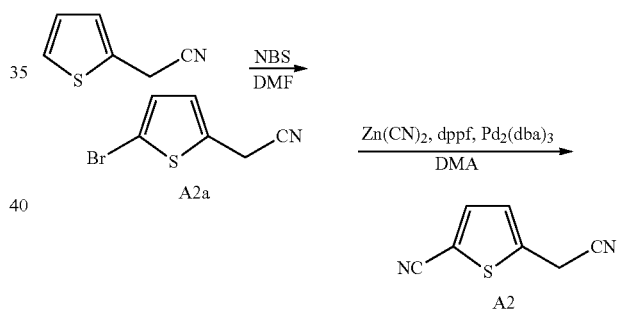

Step 1: 2-Thiopheneacetonitrile (6.16 g, 50 mmol) was dissolved in 25 mL of anhydrous DMF and N-bromosuccinimide (9.61 g, 54 mmol) dissolved in 10 mL of anhydrous DMF solution was added drop-wise into the reaction. The reaction mixture was stirred overnight under argon atmosphere under dark at 22° C. Reaction was poured into water and extracted with diethyl ether and the organic layer was dried under sodium sulphate and concentrated. Product A2a was purified by silica column chromatography by first using 100% hexane and gradually increasing the polarity to 5% ethyacetate/hexane. Yield=8.98 g (89%). $^1$H-NMR (CDCl$_3$, 400 MHz, ppm): δ 6.95 (d, 1H), 6.83 (d, 1H), 3.83 (s, 2H).

Step 2: Compound A2a (4.04 g, 20 mmol), Pd$_2$(dba)$_3$ (0.55 g, 0.6 mmol), dppf (0.55 g, 1 mmol), Zn(CN)$_2$ (3.47 g, 29.6 mmol), and Zn dust (0.42 g, 6.4 mmol) were dried under vacuum for 10 minutes. Anhydrous DMA (40 mL) was added under argon to the reaction flask and the resulting solution was stirred at 120° C. under argon atmosphere for 5 hours. The reaction mixture was cooled down and diluted with dichloromethane and filtered. The filtrate was concentrated and subjected to column chromatography (combi-flash) in silica using hexane and ethyl acetate as eluents.

Acetonitrile A2 started to elute from 15-25% ethylacetate concentration. Pale yellow liquid obtained turned to solid upon drying. Yield=2.37 g (80%). $^1$H-NMR (CDCl$_3$, 400 MHz, ppm): δ 7.54 (d, 1H), 7.12 (d, 1H), 3.96 (s, 2H).

2-(2,1,3-Benzothiadiazol-4-yl)acetonitrile (A3):

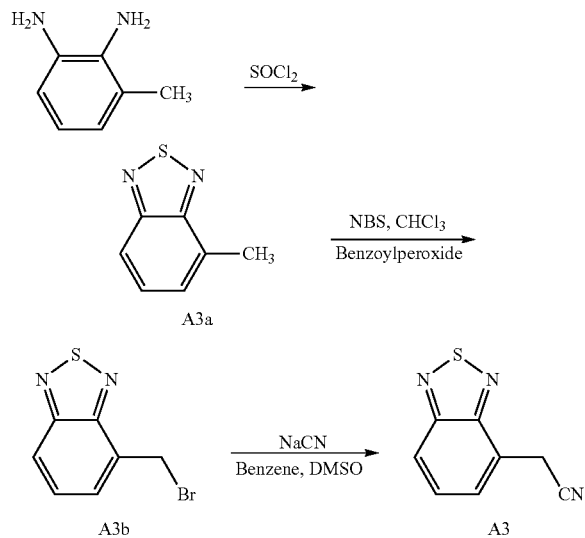

Step 1: SOCl$_2$ (16.6 g, 140 mmol) was added to a solution of 2,3-diaminotoluene (7.1 g, 58 mmol) in benzene (50 mL) drop wise at 22° C. The reaction mixture was stirred for 24 hours at 70° C. After cooling to 22° C., the reaction mixture was diluted with water and extracted with diethyl ether. The combined extracts were washed with brine and dried over Na$_2$SO$_4$. After removal of the solvent by rotary evaporation, followed by column chromatography in hexane: ethyl acetate (9:1), 4-methyl-2,1,3-benzothiadiazole A3a was obtained as a light-yellow liquid in 70% yield (6.9 g). $^1$H-NMR (CDCl$_3$, 400 MHz, ppm): δ 7.83 (d, 1H), 7.49 (dd, 1H), 7.36 (d, 1H), 2.73 (s, 3H).

Step 2: Compound A3a (6 g, 40 mmol) was mixed with NBS (8.0 g, 45 mmol) and benzoyl peroxide (100 mg) in CHCl$_3$ (100 mL). The mixture was heated to reflux and 1 mL of 33% HBr and 1 mL AcOH was added. The reaction was further refluxed for 8 hours. The mixture was evaporated, and the residue was dissolved in CH$_2$Cl$_2$ (200 mL). The organic phase was washed with water (3×200 mL), dried over MgSO$_4$, and evaporated to dryness. The semisolid A3b obtained was used as such in the next step. Yield=5.49 g (60%). $^1$H-NMR (CD$_2$Cl$_2$, 400 MHz, ppm): δ 7.99 (d, 1H), 7.67 (d, 1H), 7.59 (dd, 1H), 5.0 (s, 2H).

Step 3: Compound A3b (3.43 g, 15 mmol) was dissolved in DMSO (5 mL) and benzene (5 mL) mixture. NaCN (1.23 g, 25 mmol) was added in portion wise over a time of 30 minutes and stirred for 5 hours at 22° C. The reaction mixture was poured into ice-cold water and extracted with ethyl acetate. The organic phase was washed with brine solution and dried over MgSO$_4$ and concentrated to give brownish semiliquid which on column chromatography in silica using hexane: ethyl acetate (4:1) yielded the pure compound A3 in 70% yield. $^1$H-NMR (CD$_2$Cl$_2$, 400 MHz, ppm): δ 8.01 (d, 1H), 7.68 (dd, 1H), 7.61 (m, 1H), 4.26 (s, 2H).

2-(2-Quinolyl)acetonitrile (A4):

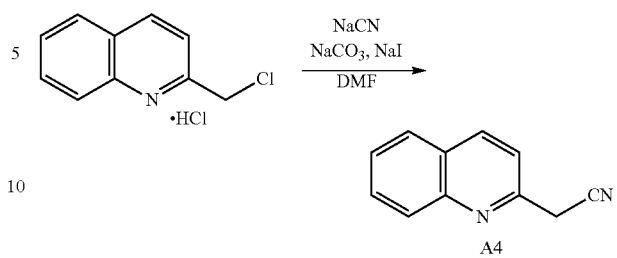

Step 1: DMF (28 mL) was added to 2-chloromethylquinoline (10 g, 46.7 mmol) followed by NaHCO$_3$ (4.07 g, 48.45 mmol) and the reaction mixture was stirred for 1.5 hours. The mixture was then cooled in an ice bath and NaCN (4.6 g, 93.88 mmol) was added portion wise over an hour, followed by the addition of KI (0.69 g, 4.6 mmol). The mixture was warmed to 22° C. and heated at 60° C. for 18 hours. The reaction mixture was cooled to 22° C. and DMF was removed under reduce pressure. Water was added to the residue which was extracted with diethyl ether. The etheral extract was dried with Na$_2$SO$_4$. Removal of solvent afforded, 5 g of dark brown liquid which was further purified by distillation using a Kugelrohr apparatus to yield 3.6 g of A4 as a yellow solid. Yield=46%. $^1$H-NMR (CD$_2$Cl$_2$, 400 MHz, ppm): δ 8.24 (d, 1H), 8.04 (d, 1H), 7.87 (d, 1H), 7.76 (t, 1H), 7.60 (dd, 1H), 7.48 (d, 1H), 4.12 (s, 2H).

2-(Cyanomethyl)-1,3-benzoxazole-5-carbonitrile (A5)

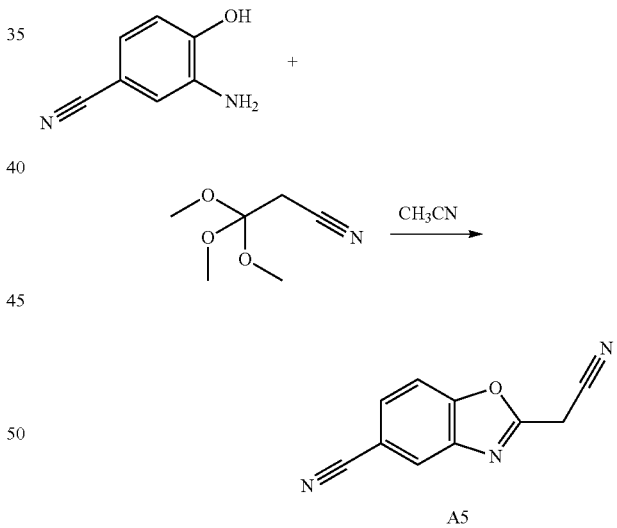

A mixture of 3-amino-4-hydroxy-benzonitrile (10.06 g, 75 mmol) and 3,3,3-trimethoxypropanenitrile (15.52 g, 93 mmol) in acetonitrile (225 mL) was refluxed for 5 hours. After the solvent was removed in vacuo, the residue was diluted in toluene (225 mL) and refluxed for 12 hours in a dean stark reaction. The reaction mixture was cooled to 22° C. and cyclohexane (150 mL) was added and stirred for 30 minutes. The brownish solid precipitated was filtered, washed with n-pentane to yield 2-(cyanomethyl)-1,3-benzoxazole-5-carbonitrile. Yield=13.06 g (95%). $^1$H-NMR (CD$_2$Cl$_2$, 400 Mhz, ppm): δ 8.09 (dd, 1H), δ 7.75-7.67 (m, 2H), δ 4.19 (s, 2H).

2-(Cyanomethyl)-1H-imidazole-4,5-dicarbonitrile (A6)

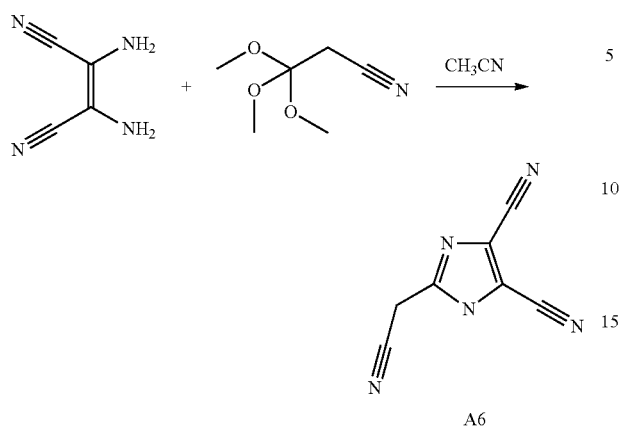

A mixture of diaminomaleonitrile (4.85 g, 44 mmol) and 3,3,3-trimethoxypropanenitrile (8.80 g, 54 mmol) in acetonitrile (132 mL) was refluxed for 5 hours. After the solvent was removed in vacuo, the residue was diluted in toluene (132 mL) and refluxed for 12 hours in a dean stark reaction. The reaction mixture was cooled to 22° C. and cyclohexane (88 mL) was added and stirred for 30 minutes. The brownish solid precipitated was filtered, washed with n-pentane to yield 2-(cyano methyl)-1H-imidazole-4,5-dicarbonitrile Yield=5.35 g (70%). $^1$H-NMR (DMSO, 400 MHz, ppm): δ 5.31 (s, 2H).

2-(5-phenyl-1,3,4-thiadiazol-2-yl)acetonitrile (A7)

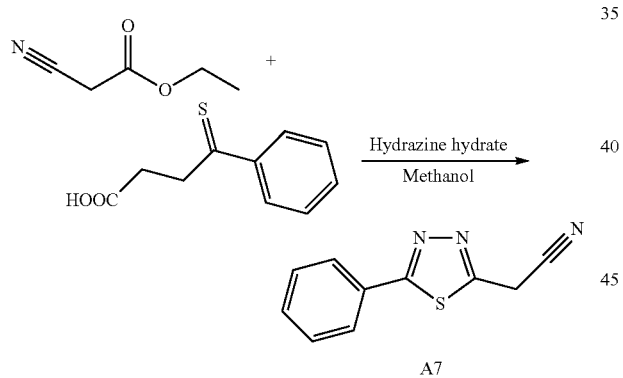

Ethyl-2-cyanoacetate (5.49 g, 48.5 mmol) was dissolved in 45 mL Methanol. Hydrazine hydrate (2.41 g, 47.1 mmol) was added drop-wise into the reaction mixture (below 30° C.) and the resulting mixture was stirred at 40° C. for 3 hours. The reaction mixture was cooled to 30° C. 2-(benzenecarbonothioylsulfanyl)aceticacid (10.0 g, 46.6 mmol) was added. A solution of ice (2.4 g) and sodium hydroxide 50% (4.0 g) was added and the reaction was stirred at 40° C. for 2 hours. Then a solution of ice (7.0 g) and sulfuric acid 97% (2 mL) was added. Reflux for 1 hour. Activated carbon (2.0 g) was added and stirred for 30 minutes at 67° C. Insoluble solids were filtered off. The filtrate was cooled to 22° C. The orange solid precipitated was filtered, washed with saturated sodium bicarbonate solution and water to yield 2-(5-phenyl-1,3,4-thiadiazol-2-yl)acetonitrile. Yield=3.80 g (40.5%). $^1$H-NMR (CD$_2$Cl$_2$, 400 MHz, ppm): δ 7.95 (dd, 2H), δ 7.55-7.48 (m, 3H), δ 4.28 (s, 2H).

Synthesis of Compounds of Formula I

Compound 1:

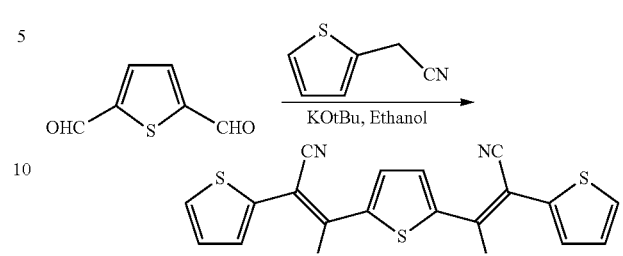

Potassium tert-butoxide (0.56 g, 5 mmol) was dissolved in anhydrous ethanol (50 mL). 2-Thiopheneacetonitrile (3.08 g, 25 mmol) was added and stirred for 10 minutes at 22° C. 2,5-Thiophenedicarboxaldehyde (0.7 g, 5 mmol) was then added and the resulting reaction mixture was stirred at 22° C. for 30 minutes and later stirred at 60° C. for 2 hours. Finally the reaction mixture was cooled down and the solid precipitated was filtered, washed with more ethanol and water. Orange red solid obtained was washed well with hot acetonitrile and methanol to yield the title compound 1, 1.41 g (81%). UV-vis (THF): $\lambda_{max}$=471 & 447 nm; $^1$H-NMR (CD$_2$Cl$_2$, 400 MHz, ppm): δ 7.67 (d, 2H), 7.50 (s, 2H), 7.39-7.37 (m, 4H), 7.11-7.09 (m, 2H).

Compound 2:

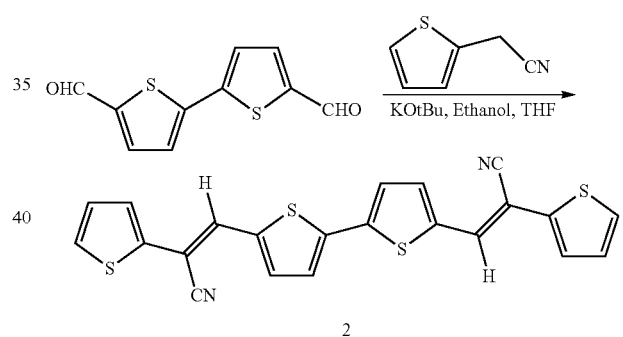

Potassium tert-butoxide (0.22 g, 2 mmol) was dissolved in anhydrous ethanol (40 mL). 2-Thiopheneacetonitrile (0.74 g, 6 mmol) was added and stirred for 10 minutes at 22° C. 5,5'-Bithiophenedicarboxaldehyde (0.44 g, 2 mmol) dissolved in 20 mL of THF was then added and the resulting reaction mixture was stirred at 22° C. for 30 minutes and later stirred at 70° C. for 2 hours. Reaction mixture was cooled down and the solid precipitated was filtered, washed with more ethanol and water. Orange red solid obtained was washed well with hot acetonitrile and methanol to yield the title compound 2, 0.79 g (91%). UV-vis (THF): $\lambda_{max}$=473 nm. $^1$H-NMR (C$_2$D$_2$Cl$_4$, 400 MHz, ppm): δ 7.54 (d, 2H), 7.45 (s, 2H), 7.39-7.35 (m, 4H), 7.13-7.10 (m, 2H).

Compound 3:

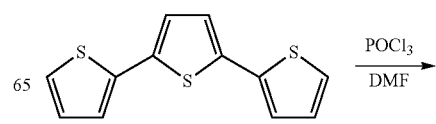

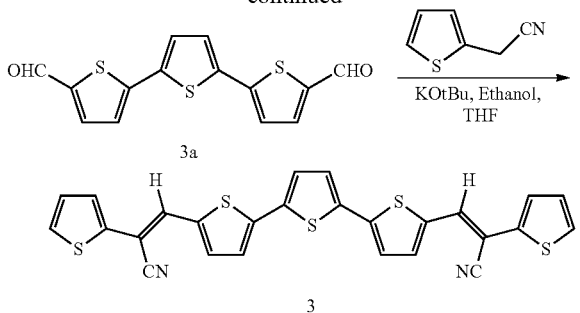

Compound 3 was Synthesized in a Two-step Reaction as Follows

Step 1: Commercially available terthiophene (1.24 g, 5 mmol) was dissolved in DMF (10 mL). POCl$_3$ (10 mL) was added at 22° C. and the resulting reaction mixture was stirred at 100° C. for 3 hours. The reaction mixture was cooled down and poured into ice-cold saturated sodium acetate solution. The yellowish solid precipitated was filtered, washed with water and methanol to yield compound 3a. Yield=1.4 g (92%). $^1$H-NMR (CDCl$_3$, 400 MHz, ppm): δ 9.86 (s, 2H), 7.68 (d, 2H), 7.30 (d, 2H), 7.28 (d, 2H).

Step 2: Potassium tert-butoxide (0.11 g, 1 mmol) was dissolved in ethanol (10 mL). 2-Thiopheneacetonitrile (0.49 g, 4 mmol) was added. Compound 3a (0.3 g, 1 mmol) was dissolved in THF (15 mL) and added to the reaction mixture. The resulting reaction mixture was refluxed for 5 hours. Reaction mixture was diluted with methanol and the solid precipitated was filtered, washed with water and methanol to give the pure compound. Yield=0.42 g (82%). UV-vis (THF): $\lambda_{max}$=488 nm; $^1$H-NMR (DMSO, 400 MHz, ppm): δ 7.98 (s, 2H), 7.68 (d, 2H), 7.64 (dd, 2H), 7.54 (d, 2H), 7.51 (s, 2H), 7.36 (dd, 2H), 7.13 (dd, 2H).

Compound 4:

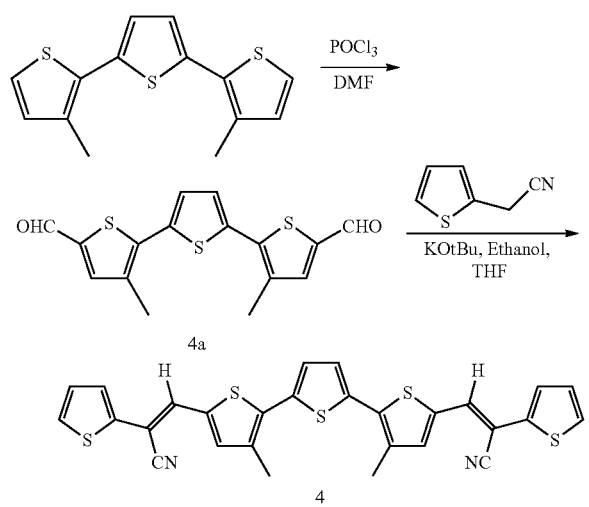

Compound 4 was synthesized in a two step reaction starting from 2,5-bis(3-methyl-2-thienyl)thiophene as described below.

Step 1: 2,5-bis(3-methyl-2-thienyl)thiophene (1.38 g, 5 mmol) was dissolved in DMF (10 mL). POCl$_3$ (10 mL) was added at 22° C. and the resulting reaction mixture was stirred at 100° C. for 3 hours. The reaction mixture was cooled down and poured into ice-cold saturated sodium acetate solution. The yellowish solid precipitated was filtered, washed with water and methanol to yield compound 4a. Yield=1.5 g (90%). $^1$H-NMR (C$_2$D$_2$Cl$_4$, 400 MHz, ppm): δ 9.81 (s, 2H), 7.59 (s, 2H), 7.35 (d, 2H), 2.5 (s, 6H).

Step 2: Potassium tert-butoxide (0.11 g, 1 mmol) was dissolved in anhydrous ethanol (10 mL). 2-Thiopheneacetonitrile (0.37 g, 3 mmol) was added and stirred for 10 minutes at 22° C. Compound 4a (0.33 g, 1 mmol) dissolved in 20 mL of THF was added and the resulting reaction mixture was stirred at 22° C. for 30 minutes and later stirred at 70° C. for 2 hours. Reaction mixture was cooled down and the solid precipitated was filtered, washed with more ethanol and water. Brownish black solid obtained was washed well with hot acetonitrile and methanol and recrystallized from boiling 1,2-dichlorobenzene to yield the title compound 4, 0.4 g (74%). UV-vis (THF): $\lambda_{max}$=477 nm; $^1$H-NMR (C$_2$D$_2$Cl$_4$, 400 MHz, ppm): δ 7.38 (s, 4H), 7.34 (d, 4H), 7.36 (s, 2H), 7.10 (t, 2H), 2.48 (s, 6H).

Compound 5:

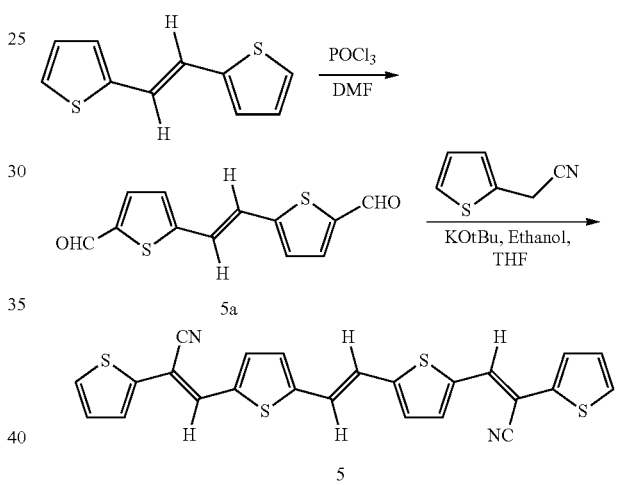

Compound 5 was synthesized in two steps starting from 2-[(E)-2-(2-thienyl)vinyl]thiophene.

Step 1: 2-[(E)-2-(2-thienyl)vinyl]thiophene (1.92 g, 10 mmol) was dissolved in 10 mL of DMF (N,N-dimethylformamide). POCl$_3$ (10 mL) was added slowly at 0° C. and the resulting reaction mixture was stirred at 22° C. for 20 minutes and later at 100° C. for 3 hours. The reaction mixture was cooled down and quenched with ice-cold water. The solid precipitated was filtered, washed with more water and methanol to get the pure compound 5a. Yield=1.9 g (77%).

Step 2: Potassium tert-butoxide (0.22 g, 2 mmol) was dissolved in ethanol (25 mL). 2-Thiopheneacetonitrile (0.99 g, 8 mmol) was added along with THF (tetrahydrofuran, 10 mL). Compound 5a (0.5 g, 2 mmol) was added and stirred at 22° C. for 30 minutes and stirred at 50° C. for 3 hours. The reaction mixture was cooled down filtered. The solid precipitated was filtered off, washed with methanol, ethanol, water and acetonitrile to yield compound 5 in pure form. Yield=0.7 g (76%). UV-vis (THF): $\lambda_{max}$=521 nm; $^1$H-NMR (C$_2$D$_2$Cl$_4$, 400 MHz, ppm): δ 7.45 (d, 4H), 7.36 (d, 4H), 7.21(s, 2H), 7.14 (d, 2H), 7.11 (d, 2H).

Compound 6:

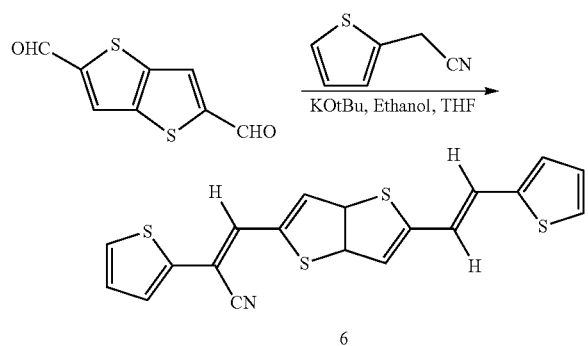

Potassium tert-butoxide (0.17 g, 1.5 mmol) was dissolved in anhydrous ethanol (20 mL). 2-Thiopheneacetonitrile (0.55 g, 4.5 mmol) was added and stirred for 10 minutes at 22° C. Thieno[3.2b]thiophenedicarboxaldehyde (0.3 g, 1.5 mmol) dissolved in 20 mL of THF was added and the resulting reaction mixture was stirred at 22° C. for 30 minutes and later stirred at 70° C. for 2 hours. Reaction mixture was cooled down and the solid precipitated was filtered, washed with more ethanol and water. Orange red solid obtained was washed well hot acetonitrile and methanol to yield the title compound 6, 0.5 g (82%). MALDI-TOF Ms.: 411.54 (without matrix); UV-vis (THF): $\lambda_{max}$=483 nm; $^1$H-NMR (THF-d$_8$, 400 MHz, ppm): δ 7.90 (s, 2H), 7.83 (s, 2H), 7.5(d, 2H), 7.4 (d, 2H), 7.11-7.09 (m, 2H).

Compound 7:

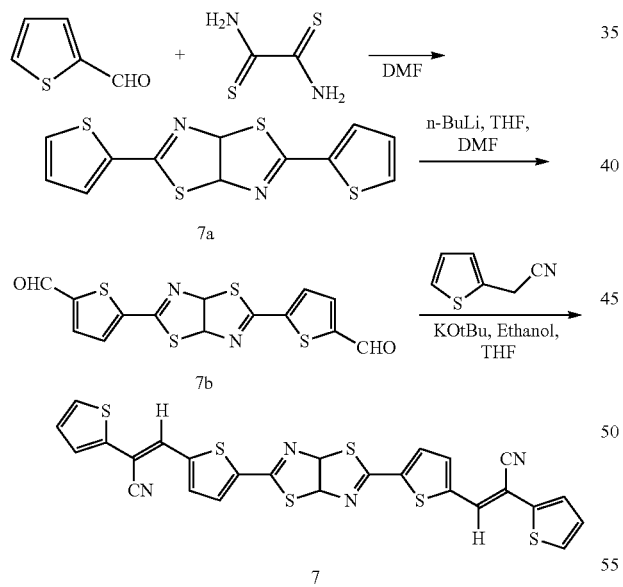

Compound 7 was prepared in a three step procedure starting from 2-thiophenecarboxaldehyde as follows.

Step 1: A solution of 2-thiophenecarboxaldehyde (5.89 g, 52.2 mmol) and dithiooxamide (3 g, 25 mmol) in DMF (25 mL) was heated under reflux for 3 hours. The reaction mixture was cooled down to 22° C., poured into water and extracted with DCM (dichloromethane). The organic layer was washed with water and dried under sodium sulphate. The organic phase was concentrated and recrystallized from methanol to give 3.1 g of the compound 7a (40%).

Step 2: n-BuLi (2M) 5.2 mL was added to THF (20 mL) cooled at 0° C. 7a (1.53 g, 5 mmol) was dissolved in THF (30 mL) and added drop wise. The resulting reaction mixture was stirred for 2 hours. This was followed by the drop wise addition of DMF (2 mL), and then the reaction mixture stirred at 22° C. for 17 hours. The reaction mixture was then diluted with 50 mL of ice-cold saturated solution of ammonium chloride. The yellowish solid precipitated was filtered off, washed with more ammonium chloride solution and with water. After drying, the solid was finally washed with diethyl ether to yield 1.1 g of the desired product 7b (61%).

Step 3: Potassium tert-butoxide (0.11 g, 1 mmol) was dissolved in ethanol (10 mL). 2-Thiopheneacetonitrile (0.42 g, 3.4 mmol) was added to it and stirred for 10 minutes. 7b (0.3 g, 0.85 mmol) was dissolved in THF (20 mL) and added to the reaction mixture. The stirring was continued for 30 minutes at 22° C. and then the temperature was increased to 100° C. and stirred for 5 hours. The reaction was cooled down and filtered. The solid obtained after filtration was washed with methanol and later by water. The yellowish brown solid obtained was refluxed in acetonitrile and filtered to give the desired compound 7. Yield=0.36 g (74%). MALDI-TOF Ms.: 574.62 (without matrix); UV-vis (THF): $\lambda_{max}$=518 & 491 nm; $^1$H-NMR (DMSO-d$_6$, 400 MHz, ppm): δ 7.93 (s, 2H), 7.84 (d, 2H), 7.74 (d, 2H), 7.63 (d, 2H), 7.43 (d, 2H), 7.15-7.13 (m, 2H).

Compound 8:

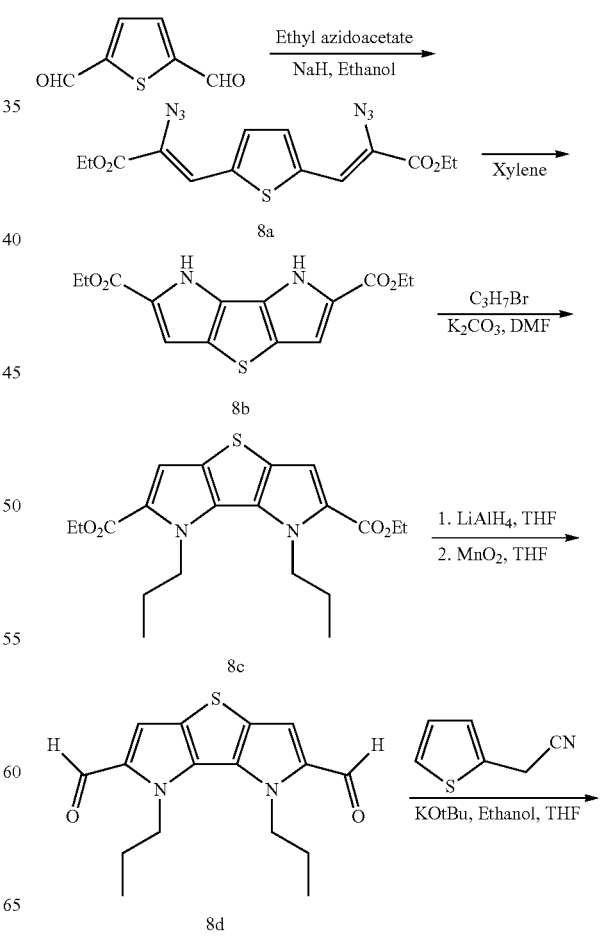

-continued

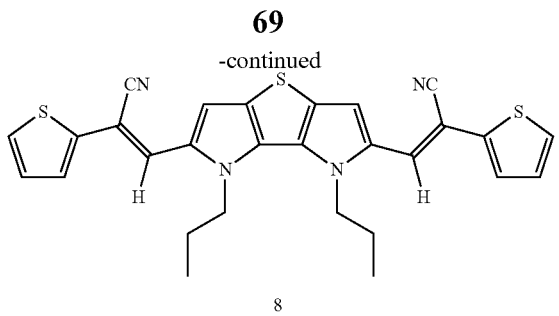

8

Compound 8 was prepared in a five step synthetic procedure starting from 2,5-thiophenedicarboxaldehyde as follows.

Step 1: NaH (1.44 g, 60 mmol) was suspended in anhydrous ethanol (80 mL) at −40° C. To the cold suspension was added 2,5-thiophenedicarboxaldehyde (2.1 g, 15 mmol) and stirred for 10 minutes. Ethylazidoacetate (7.74 g, 60 mmol) was dissolved in ethanol (20 mL) and added drop wise. The resulting suspension was stirred at −40° C. for 17 hours. The reaction mixture was quenched with cold saturated solution of ammonium chloride. The solid precipitated was filtered, washed with cold water. The solid was dried under vacuum for 7 hours to yield 3 g of the pure compound 8a (57%).

Step 2: 8a (2.6 g, 7.2 mmol) was dissolved in xylene (100 mL) and heated at 120° C. for 6 hours. The reaction mixture was cooled down and the solid precipitated was filtered and washed with hexane to yield 2 g of the desired dithienopyrrole compound 8b (90%).

Step 3: 1.6 g (5 mmol) of 8b and $K_2CO_3$ (4.14 g, 30 mmol) were dissolved in DMF (20 mL) and stirred at 22° C. for 20 minutes. 1-Bromopropane (2.4 g, 20 mmol) was added and stirred at 22° C. for 17 hours. The reaction mixture was poured into ice-cold water and the solid precipitated was filtered and washed well with water. The solid was dried under vacuum for 7 hours to yield 1.6 g of N-propylated compound 8c (82%).

Step 4: 1.56 g (4 mmol) of 8c was dissolved in THF (20 mL) and added to $LiAlH_4$ (2M) 8 mL in THF (20 mL) at 0° C. The resulting reaction mixture was stirred at 22° C. for 17 hours. 3 mL of methanol was added drop wise to the reaction mixture and stirred for 30 minutes. The reaction mixture was cooled down and ice-cold water was added to the reaction mixture and extracted using ethyl acetate. The organic phase was dried under sodium sulphate, filtered and concentrated to give a pale yellow liquid (corresponding alcohol). Yield=0.9 g (73%). The corresponding alcohol (0.87 g, 2.85 mmol) was dissolved in THF (50 mL) and $MnO_2$ (2.47 g, 28.5 mmol) was added. The resulting reaction mixture was stirred at 22° C. for 17 hours. The reaction mixture was diluted with more THF and filtered through celite. The organic solvent was removed and the solid obtained was dried under vacuum for 5 hours to yield compound 8d, 0.72 g (84%). $^1$H-NMR ($CD_2Cl_2$, 400 MHz, ppm): δ 9.52 (s, 2H), 7.06 (s, 2H), 4.59 (t, 4H), 1.82-1.76 (m, 4H), 0.90 (t, 6H).

Step 5: Potassium tert-butoxide (0.11 g, 1 mmol) was dissolved in ethanol (10 mL). 2-Thiopheneacetonitrile (0.44 g, 3.6 mmol) was added and stirred at 22° C. for 10 minutes. 0.36 g (1.2 mmol) of 8d was dissolved in THF (30 mL) and added to the ethanolic solution. The resulting solution was stirred at 90° C. for 5 hours. The reaction mixture was concentrated to remove THF. Methanol was added and the solid precipitated was filtered and washed well with methanol, water and acetonitrile to yield 0.32 g (52%) of the title compound 8. MALDI-TOF Ms.: 511.34 (without matrix); UV-vis (THF): $\lambda_{max}$=533 nm; $^1$H-NMR ($CDCl_3$, 400 MHz, ppm): δ 7.67 (s, 2H), 7.31-7.29 (dd, 2H), 7.22 (s, 2H), 7.24 (d, 2H), 7.09-7.06 (m, 2H), 4.26 (t, 4H), 1.94-1.88 (m, 4H), 1.03 (t, 6H).

Compound 9

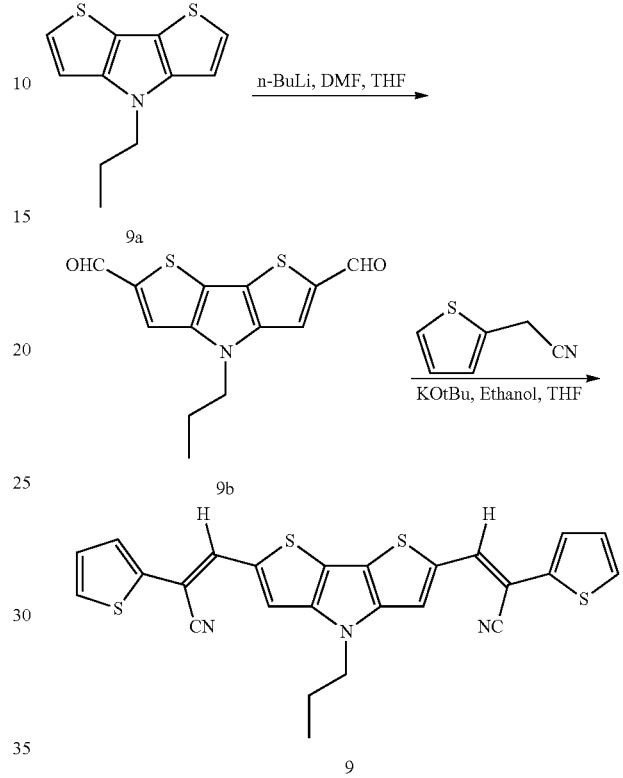

Compound 9 was synthesized in a two step procedure as described below starting from Compound 9a which in turn was synthesized according to the reported literature.

Step 1: n-BuLi (2M) 4.4 mL was added to THF (20 mL) cooled at 0° C. 9a (0.88 g, 4 mmol) was dissolved in THF (30 mL) and added drop wise. The resulting reaction mixture was stirred for 2 hours. This was followed by the drop wise addition of DMF (2 mL), and then the reaction mixture stirred at 22° C. for 17 hours. The reaction mixture was then diluted with 50 mL of ice-cold saturated solution of ammonium chloride. The yellowish solid precipitated was filtered off, washed with more ammonium chloride solution and with water. After drying, the solid was finally washed with diethyl ether to yield 0.61 g of the desired product 9b (55%).

Step 2: Potassium tert-butoxide (0.37 g, 3.3 mmol) was dissolved in ethanol (10 mL). 2-Thiopheneacetonitrile (1.02 g, 8.25 mmol) was added and stirred at 22° C. Compound 9b (0.46 g, 1.65 mmol) was dissolved in 20 mL of THF and added and the resulting reaction mixture was stirred at 22° C. for 30 minutes. The resulting reaction mixture was later heated to 60° C. and stirred for 1 hour. The reaction mixture was cooled down and filtered. The solid obtained after filtration was washed thoroughly with ethanol and acetonitrile. Yield=0.63 g (80%). The solid was dissolved in chlorobenzene and recrystallized to yield Compound 9, 0.52 g. UV-vis (THF): $\lambda_{max}$=523 nm; $^1$H-NMR ($C_2D_2Cl_4$, 400 MHz, ppm): δ 7.55 (s, 2H), 7.46 (s, 2H), 7.34 (d, 4H), 7.1 (t, 2H), 4.20 (t, 2H) 1.95-1.92 (m, 2H), 0.98 (t, 3H).

Compound 10:

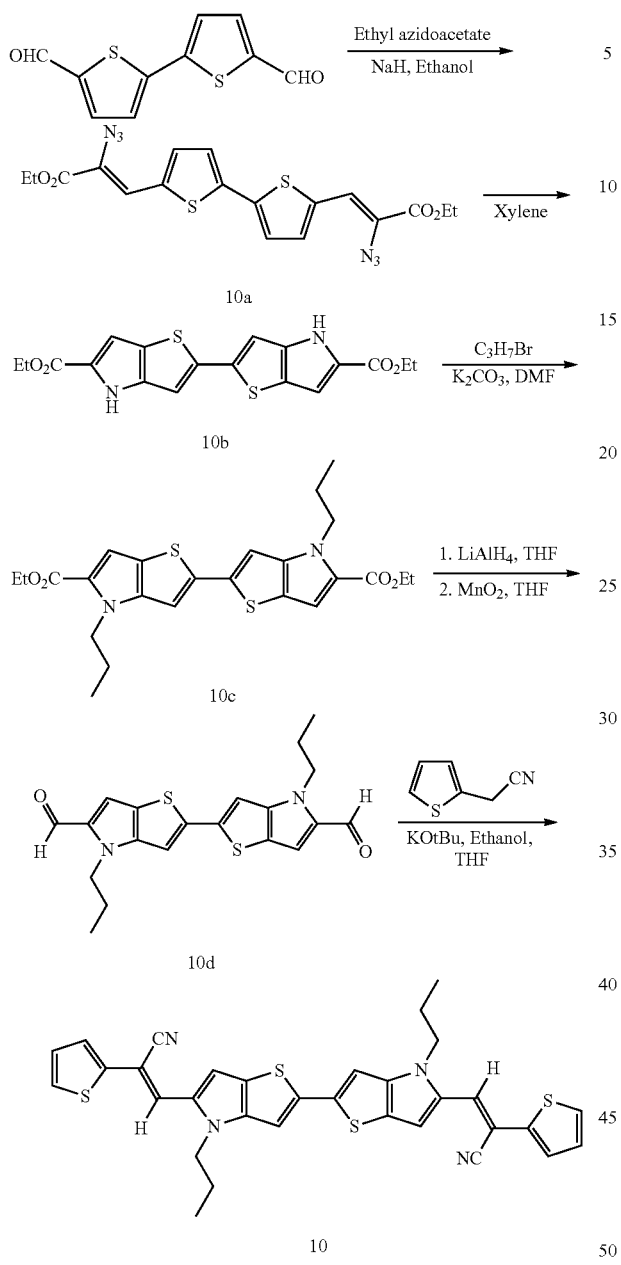

Compound 10 was prepared in a five step reaction procedure similar to compound 8 starting from 2,2'-bithiophenedicarboxaldehyde.

Step 1: 1.92 g (80 mmol) of NaH was suspended in 80 mL of ethanol at −40° C. 2.2 g (10 mmol) of 2,2'-bithiophenedicarboxaldehyde was added and stirred for 10 minutes. 10.32 g (80 mmol) of ethylazidoacetate was dissolved in 20 mL of ethanol and added drop-wise. The resulting solution was stirred at −40° C. for 17 hours. The reaction mixture was quenched with 150 mL of cold saturated solution of ammonium chloride. The solid precipitated was filtered, washed with cold water. The solid was dried under vacuum for 7 hours to yield 2.6 g of 10a (59%).

Step 2: 2.4 g (5.5 mmol) of 10a was dissolved in 100 mL of xylene and heated at 120° C. for 6 hours. The reaction mixture was cooled down and the solid precipitated was filtered and washed with hexane to yield 1.55 g of 10b (73%).

Step 3: 1.5 g (3.86 mmol) of 10b and 1.59 g (11.58 mmol) of $K_2CO_3$ were dissolved in 20 mL of DMF and stirred for 20 minutes. 0.95 g (7.76 mmol) of 1-bromopropane was added and the resulting reaction mixture was stirred at 22° C. for 17 hours. The reaction mixture was poured into ice-cold water and the solid precipitated was filtered off and washed thoroughly with water and dried under vacuum for 6.5 hours to yield 1.75 g of 10c (96%).

Step 4: 1.42 g (3 mmol) of 10c was dissolved in 20 mL of THF and added dropwise to the cooled 6 mL of (2M) $LiAlH_4$ in 10 mL of THF at 0° C. The resulting solution was stirred at 22° C. for 17 hours. Methanol (3 mL) was added and stirred for 30 minutes. The reaction mixture was poured into ice-cold water and extracted using ethyl acetate. The organic layer was dried under sodium sulphate and concentrated to give yellowish liquid to yield 1.05 g of corresponding alcohol (90.5%). 1 g (2.58 mmol) of the alcohol was dissolved in 30 mL of THF and 2.24 g (25.8 mmol) of 85% $MnO_2$ was added. The resulting reaction mixture was stirred at 22° C. for 17 hours. The reaction mixture was diluted with more THF and filtered through celite. The filtrate was concentrated and subjected to column chromatography in silica using DCM: hexane as eluents (4:1) to yield the compound 10d in pure form. Yield=0.85 g (86%). $^1$H-NMR ($CDCl_3$, 400 MHz, ppm): δ 9.61 (s, 2H), 7.09 (d, 2H), 7.07 (d, 2H), 4.46 (t, 4H), 1.89-1.83 (m, 4H), 0.93 (t, 6H).

Step 5: Potassium tert-butoxide (0.11 g, 1 mmol) was dissolved in 10 mL of ethanol. 0.28 g (2.34 mmol) of 2-thiopheneacetonitrile was added and stirred for 20 minutes. Compound 10d (0.3 g, 0.78 mmol) was dissolved in 30 mL of THF and added. The resulting solution was stirred at 90° C. for 5 hours. The reaction mixture was concentrated to remove THF. Methanol was added and the solid precipitated was filtered off, washed with water and methanol. The residue was washed thoroughly with acetonitrile and finally with ethanol to yield 0.25 g of the compound 10 (54%). MALDI-TOF Ms.: 593.18 (without matrix); UV-vis (THF): $\lambda_{max}$=543 nm; $^1$H-NMR (THF-$d_8$, 400 MHz, ppm): δ 7.61 (s, 2H), 7.4 (d, 4H), 7.31 (d, 2H), 7.28 (s, 2H), 7.08-7.06 (m, 2H), 4.29 (t, 4H), 1.87-1.81 (m, 4H), 0.95 (t, 6H).

Compound 11:

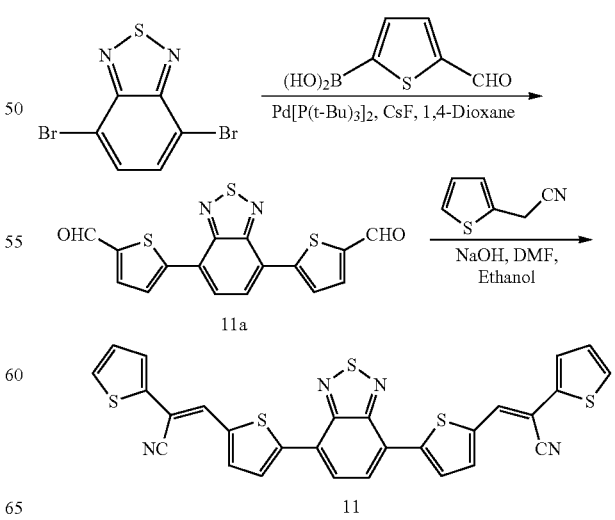

Compound 11 was prepared in a two-step reaction as follows starting from 4,7-dibromobenzothiadiazole.

Step 1: 4,7-Dibromobenzothiadiazole (0.29 g, 1 mmol), CsF (0.6 g, 4 mmol), 5-formyl-thiophene-2-boronic acid (0.47 g, 3 mmol) and Pd[P(t-Bu)$_3$]$_2$ (10 mg) were dried under vacuum. Argon purged 1,4-dioxane (20 mL) and water (1 mL) were added and the resulting reaction mixture was stirred at 90° C. for 6 hours. The reaction mixture was cooled down and the solid precipitated was filtered, washed well with water and methanol to yield 0.32 g of 11a (90%). $^1$H-NMR (C$_2$D$_2$Cl$_4$, 400 MHz, ppm): δ 9.98 (s, 2H), 8.23 (d, 2H), 8.08 (d, 2H), 7.89 (d, 2H).

Step 2: 0.3 g (0.85 mmol) of 11a and 0.42 g (3.4 mmol) was dissolved in DMF (10 mL). NaOH (0.17 g, 4.25 mmol) was dissolved in ethanol (5 mL) and added to the reaction mixture. The resulting reaction mixture was stirred at 60° C. for 2 hours. The reaction mixture was cooled down and the solid precipitated was filtered, washed well with water, methanol and acetonitrile. The solid was suspended in acetonitrile and refluxed for 5 hours and filtered hot to get the pure compound 11. Yield=0.4 g (83%). MALDI-TOF Ms.: 565.11 (without matrix); UV-vis (THF): λ$_{max}$=523 nm; $^1$H-NMR (THF-d$_8$, 400 MHz, ppm): δ 8.33 (d, 2H), 8.17 (s, 2H), 7.79 (d, 2H), 7.77 (d, 2H), 7.48 (d, 2H), 7.40 (d, 2H), 7.12-7.10 (m, 2H).

Compound 12:

10 mL of DMF and added drop wise to the dichloromethane solution and the resulting reaction mixture was stirred at 22° C. for 17 hours. The reaction mixture was concentrated to remove the dichloromethane. The remaining DMF solution was poured into ice-cold water. The solid precipitated was filtered and washed thoroughly with water. The compound 12a was purified by column chromatography in silica using DCM as the eluent. Yield=0.95 g (69%).

Step 2: 0.25 g (0.55 mmol) of 12a, 0.33 g (2.2 mmol) of CsF, 0.26 g (1.65 mmol) of 5-formyl-thiophene-2-boronic acid, 6 mg (0.011 mmol) of Pd[P(t-Bu)$_3$]$_2$ were dried under vacuum. Argon purged 1,4-dioxane (25 mL) and water (1 mL) were added to the solids and stirred at 90° C. for 3 hours. The reaction mixture was cooled down and methanol was added. The solid precipitated was filtered off, washed with water and ethanol to get the desired product. The compound 12b was dried under vacuum for 3 hours. Yield=0.25 g (87%). $^1$H-NMR (THF-d$_8$, 400 MHz, ppm): δ 9.86 (s, 2H), 8.20 (d, 2H), 8.12 (d, 2H) 7.82 (d, 2H), 7.58 (d, 2H), 7.51 (d, 2H).

Step 3: 0.23 g (0.435 mmol) of compound 12b and 0.21 g (1.74 mmol) of 2-thiopheneacetonitrile were dissolved in DMF (25 mL). 0.09 g (2.18 mmol) of NaOH was dissolved in 5 mL of ethanol and added to the reaction mixture. The resulting reaction mixture was stirred at 60° C. for 2 hours. The reaction mixture was cooled down and filtered the solid

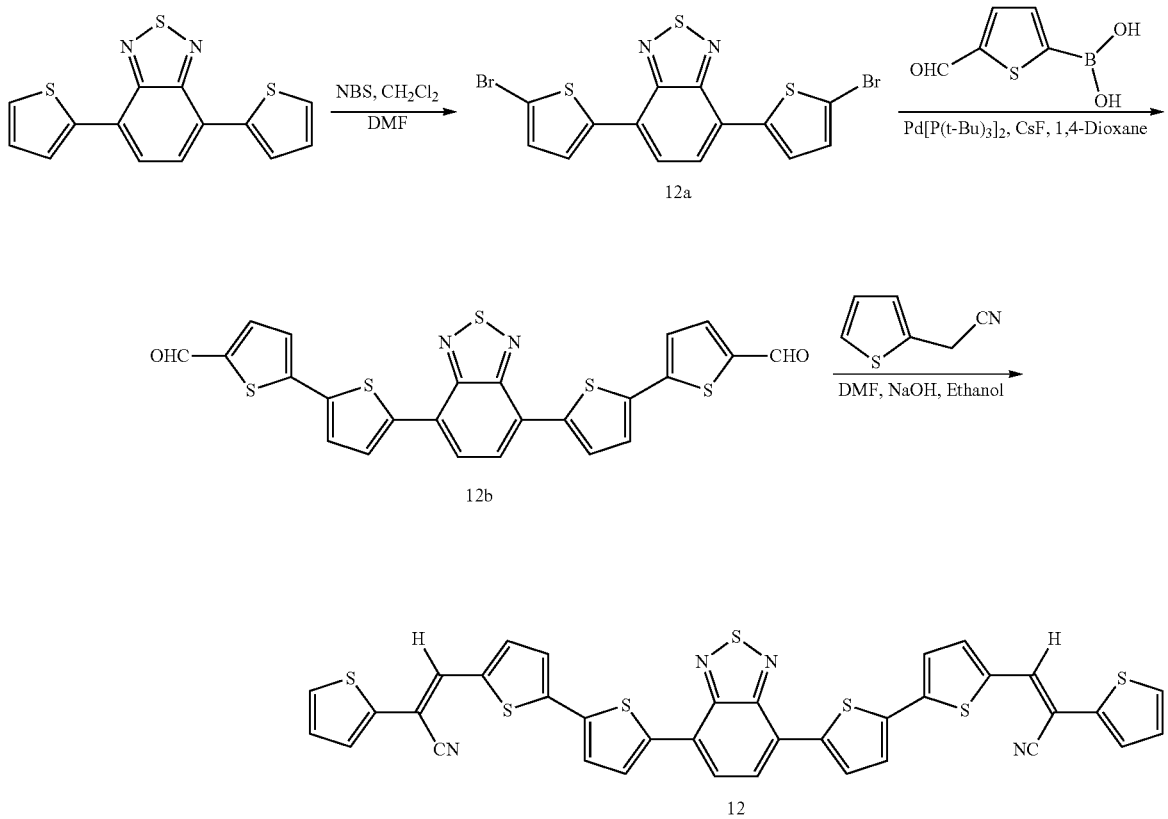

12a

12b

12

Compound 12 was synthesized in a three step reaction procedure starting from 4,7-bis(2-thienyl)-2,1,3-benzothiadiazole.

Step1: 4,7-bis (2-thienyl)-2,1,3-benzothiadiazole (0.9 g, 3 mmol) was dissolved in 20 mL of dichloromethane. 1.24 g (7 mmol) of NBS (N-bromosuccinimide) was dissolved in filtered was washed well with water, methanol and acetonitrile to give the compound 12. Yield=0.25 g (79%). MALDI-TOF Ms.: 728.75 (with ANT matrix); UV-vis (THF): λ$_{max}$=540 nm; $^1$H-NMR (THF-d$_8$, 400 MHz, ppm): δ 8.22 (d, 2H), 8.11 (s, 2H), 7.72 (d, 2H), 7.61 (d, 2H), 7.55 (d, 2H), 7.46-7.43 (m, 4H), 7.37 (d, 2H), 7.10-7.08 (m, 2H).

Compound 13:

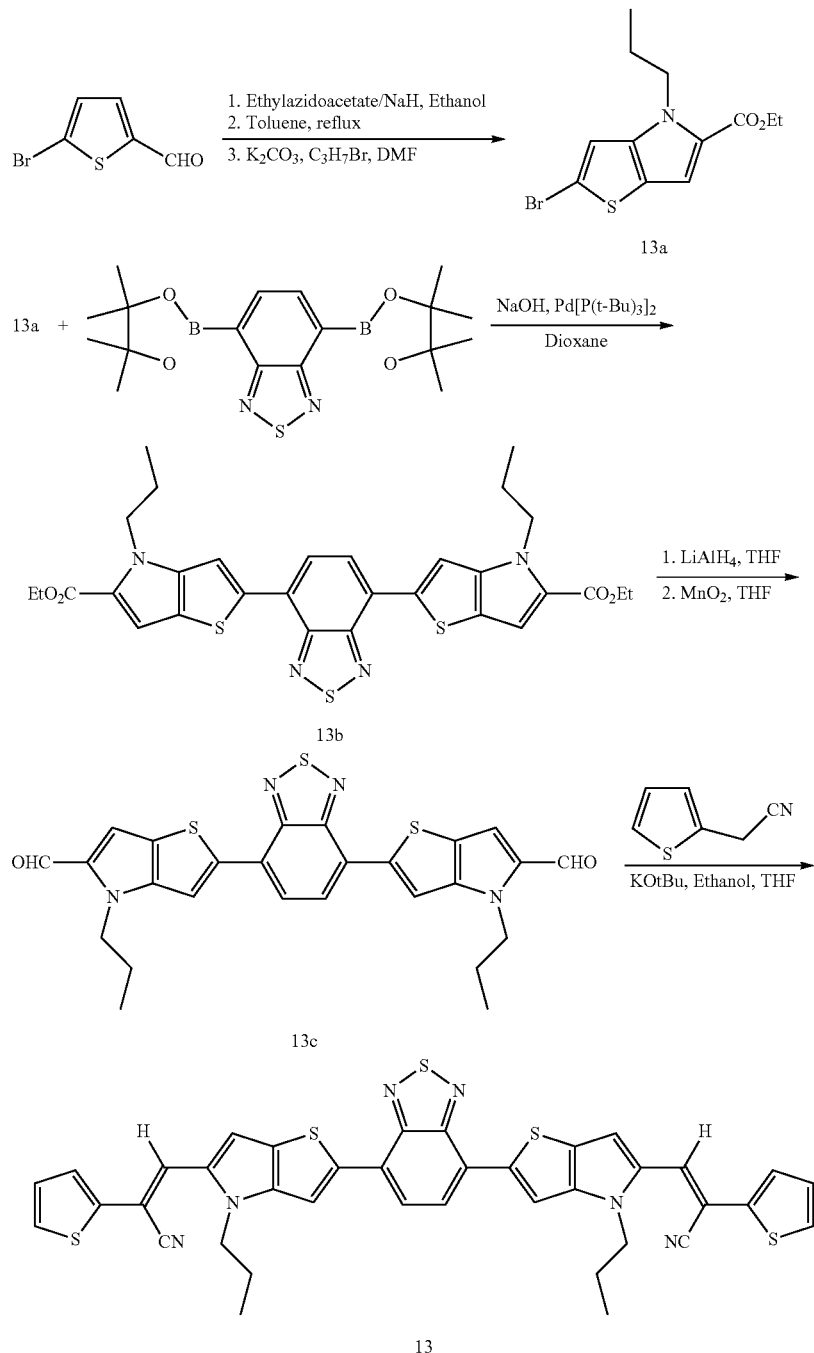

Compound 13 was prepared from 13a in a three step reaction.

Synthesis of 13a: NaH (1.92 g, 80 mmol) was suspended in 25 mL of ethanol. 5-Bromo-thiophene-2-carboxaldehyde (3.8 g, 20 mmol) was dissolved in 10 mL of ethanol and added to the NaH suspension at 0° C. Ethylazidoacetate (10.32 g, 80 mmol) was dissolved in ethanol (15 mL) added drop wise at 0° C. and stirring was continued for 17 hours. The reaction mixture was quenched with saturated ammonium chloride solution. The solid precipitated was filtered and washed with water and dried under vacuum to yield 4.6 g (76%) of the bromothiophene azido acetate which was dissolved in xylene and heated at 120° C. to give bromothienopyrrole carboxylate in 84% yield. Bromothienopyrrole on alkylation with 1-bromopropane using DMF and $K_2CO_3$ give the corresponding alkylated product 13a in 95% yield.

Step 1: 13a (0.79 g, 2.5 mmol) prepared as above and 4,7-bis(4,4,5,5-tetramethyl-1,3,2-dioxaborolan-2-yl)-2,1,3-benzothiadiazole (0.388 g, 1 mmol) and then $Pd[P(t-Bu)_3]_2$ (10 mg, 0.014 mmol) were dried under vacuum. 1,4-Dioxane (10 mL) was added to the solids. Argon purged 1 mL 5N NaOH solution was added and stirred at 22° C. for 4 hours. The reaction mixture was poured into ice-cold water. The solid precipitated was filtered and washed with more water. The solid collected was washed thoroughly with methanol and hexane to yield compound 13b, 0.59 g (97%).

Step 2: 13b (0.5 g, 0.83 mmol) was dissolved in THF (10 mL) and added to LiAlH$_4$ (2M) 2 mL in THF (10 mL) at 0° C. The resulting reaction mixture was stirred at 22° C. for 17 hours. 2 mL of methanol was added drop wise to the reaction mixture and stirred for 30 minutes. The reaction mixture was cooled down and ice-cold water was added to the reaction mixture and extracted using ethyl acetate and dichloromethane. The organic phase was dried under sodium sulphate, filtered and concentrated to give pale yellow liquid (corresponding alcohol). Yield=0.31 g (72%). The corresponding alcohol (0.28 g, 0.54 mmol) was dissolved in THF (50 mL) and MnO$_2$ (0.47 g, 5.4 mmol) was added. The resulting reaction mixture was stirred at 22° C. for 17 hours. The reaction mixture was diluted with more THF and filtered through celite. The organic solvent was removed and the solid obtained was dried under vacuum for 5 hours to yield 13c, 0.19 g (68%). $^1$H-NMR (CDCl$_3$, 400 MHz, ppm): δ 9.65 (s, 2H), 8.32 (s, 2H), 7.91 (s, 2H), 7.13 (s, 2H), 4.59 (t, 4H), 1.92-1.95 (m, 4H), 0.99 (t, 6H).

Step 3: Potassium tert-butoxide (0.11 g, 1 mmol) was dissolved in ethanol (5 mL). 2-Thiopheneacetonitrile (0.15 g, 1.2 mmol) was added and stirred for 10 minutes. Corresponding dialdehyde (13c) (0.16 g, 0.3 mmol) was dissolved in THF (30 mL) and added. The resulting reaction mixture was stirred at 90° C. for 4 hours. The reaction mixture was concentrated to remove THF. Methanol was added and the solid precipitated was filtered, washed with water, methanol and acetonitrile to get the title compound 13, yield=0.17 g (76%). MALDI-TOF Ms.: 727.1 (without matrix); UV-vis (THF): λ$_{max}$=584 nm; $^1$H-NMR (CDCl$_3$, 400 MHz, ppm): δ 8.28 (s, 2H), 7.84 (s, 2H), 7.68 (d, 2H), 7.52 (s, 2H), 7.32 (d, 2H) 7.08-7.07 (m, 2H), 6.99 (s, 2H), 4.24 (t, 2H), 1.93-1.89 (m, 2H), 1.02 (t, 6H).

Compound 14:

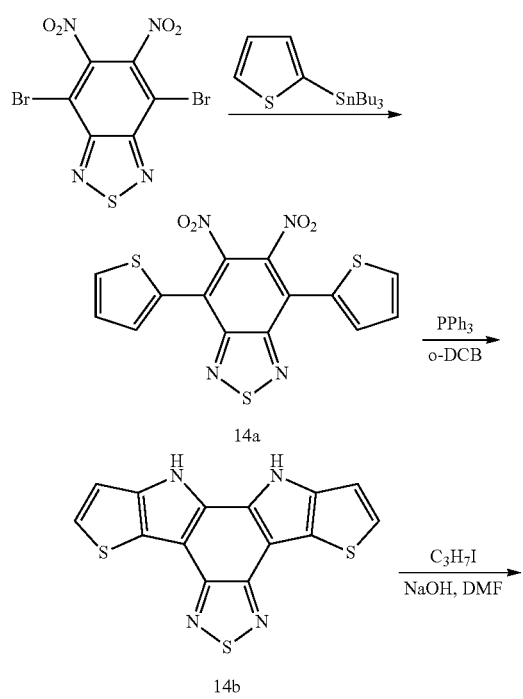

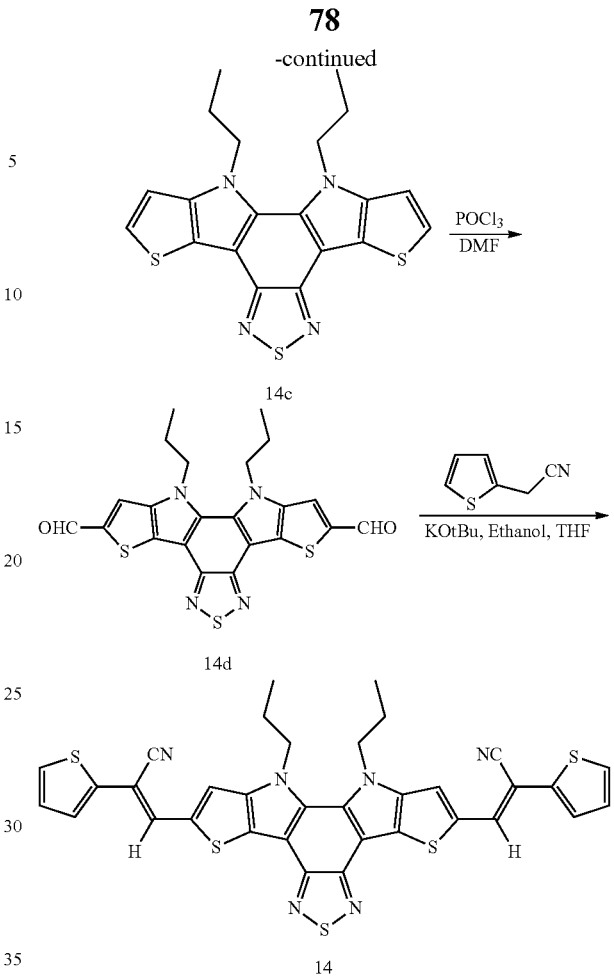

Compound 14 was synthesized in a five step reaction starting from 4,7-dibromo-5,6-dinitro-2,1,3-benzothiadiazole as described below.

Step 1: A mixture of 4,7-dibromo-5,6-dinitro-2,1,3-benzothiadiazole (1.53 g, 4 mmol) and tributyl(2-thienyl)tin (1.56 g, 4.2 mmol) in THF (50 mL) was bubbled with argon for 20 min. PdCl$_2$(PPh$_3$)$_2$ (280 mg, 0.4 mmol) was added to the reaction mixture. The reaction mixture was heated to reflux for 8 hours. The reaction mixture was cooled down and the solvent was removed by rotary evaporation. The residue was dissolved in CH$_2$Cl$_2$ and filtered through celite. The filtrate was concentrated and the residue was washed with hexane and methanol to yield the compound 14a in 80% yield.

Step 2: A mixture of compound 14a (1.17 g, 3 mmol) and PPh$_3$ (3.54 g, 30 mmol) was dissolved in o-dichlorobenzene (40 mL) and purged with argon for 15 minutes and later stirred at 185° C. for 8 hours. The reaction mixture was cooled down and the solvent was removed by rotary evaporation. The residue was washed with hexane and subjected to column chromatography in silica using toluene: ethyl acetate (2:1) to yield compound 14b. Yield=0.82 g (84%).

Step 3: Compound 14b (0.65 g, 2 mmol) was dissolved in DMF (10 mL). Iodopropane (2.2 g, 13 mmol) and NaOH (0.8 g, 20 mmol) was added and the resulting reaction mixture was heated at 50° C. for 5 hours. The reaction mixture was cooled down and poured into ice-cold water and extracted using dichloromethane. The organic layer was concentrated and subjected to column chromatography in silica (Combiflash) using hexane and ethyl acetate (3:2). The solid obtained was washed with methanol to give the pure compound in orange red color to yield compound 14c. Yield=0.75 g (91%).

Step 4: Compound 14c (0.7 g, 1.7 mmol) was dissolved in 1,2-dichloroethane (25 mL). DMF (4 mL) was added and the resulting reaction mixture was cooled to 0° C. POCl$_3$ (4 mL) was added drop wise and stirred at the same temperature for 20 minutes. The resulting reaction mixture was refluxed for 6 hours. The reaction mixture was cooled down and quenched with saturated sodium acetate solution. The solid precipitated was filtered, washed well with water and methanol to yield the corresponding dialdehyde 14d in pure form. Yield=0.74 g (93%). $^1$H-NMR (CD$_2$Cl$_2$, 400 MHz, ppm): δ 10.05 (s, 2H), 7.88 (s, 2H), 4.58 (t, 4H), 1.97 (m, 4H), 0.89 (t, 6H).

Step 5: Compound 14d (0.7 g, 1.5 mmol) was suspended in ethanol (10 mL) and THF (20 mL) mixture. 2-Thiopheneacetonitrile (0.74 g, 6 mmol) was added. Potassium tert-butoxide (0.672 g, 6 mmol) was added and the resulting reaction mixture was stirred at 50° C. for 20 minutes and later heated at 90° C. for 2 hours. The reaction mixture was filtered hot. The solid obtained after filtration was washed with methanol and acetonitrile. Yield=0.73 g (72%). Purification: 0.62 g of the solid was dissolved in boiling dichlorobenzene and allowed to crystallize. Yield=0.56 g (90%). UV-vis (THF): λ$_{max}$=539 nm; $^1$H-NMR (C$_2$D$_2$Cl$_4$, 400 MHz, ppm): δ 7.88 (s, 2H), 7.56 (s, 2H), 7.40 (dd, 4H), 7.15 (t, 2H), 4.57 (t, 4H) 1.99-1.98 (m, 4H), 0.89 (t, 6H).

Compound 15:

After evaporation of the solvent, 200 mL of water was added, and the mixture was extracted with ether. The extract was washed with brine and dried over anhydrous sodium sulfate to give 2.3 g (87%) of the pure compound 15a.

Step 2: To a solution of 3,6-dibromo-1,2-phenylenediamine (15a) (2.12 g, 8 mmol) in refluxing ethanol (50 mL) was added a solution of selenium dioxide (1.17 g, 8.5 mmol) in hot water (20 mL). The mixture was heated under reflux for 2 hours. Filtration of the yellow precipitates and recrystallization from ethyl acetate gave 4,7-dibromo-2,1,3-benzoselenadiazole (15b) 2.2 g in 81% yield as golden yellow needles. $^1$H-NMR (CDCl$_3$, 400 MHz, ppm): δ 7.63 (s, 2H).

Step 3: 4,7-Dibromo-2,1,3-benzoselenadiazole (15b) (0.34 g, 1 mmol), CsF (0.6 g, 4 mmol), [5-(5-formyl-2-thienyl)-2-thienyl]boronic acid (0.6 g, 2.5 mmol) and Pd[P(t-Bu)$_3$]$_2$ (30 mg) were dried under vacuum. Argon purged 1,4-dioxane (25 mL) and water (1 mL) were added and the resulting reaction mixture was stirred at 100° C. for 7 hours. The reaction mixture was cooled down and the solid precipitated was filtered, washed well with water and methanol to yield 15c, 0.52 g (92%). $^1$H-NMR (C$_2$D$_2$Cl$_4$, 400 MHz, ppm): δ 9.89 (s, 2H), 8.02 (d, 2H), 7.91 (d, 2H), 7.74 (d, 2H), 7.50 (d, 2H) 7.43 (d, 2H).

Step 4: 15c (0.37 g, 0.65 mmol) and 2-thiopheneacetonitrile (0.4 g, 3.25 mmol) was dissolved in DMF (10 mL). NaOH (0.13 g, 3.25 mmol) was dissolved in ethanol (5 mL) and added to the reaction mixture. The resulting reaction mixture was stirred at 60° C. for 4 hours. The reaction mixture was cooled down and the solid precipitated was

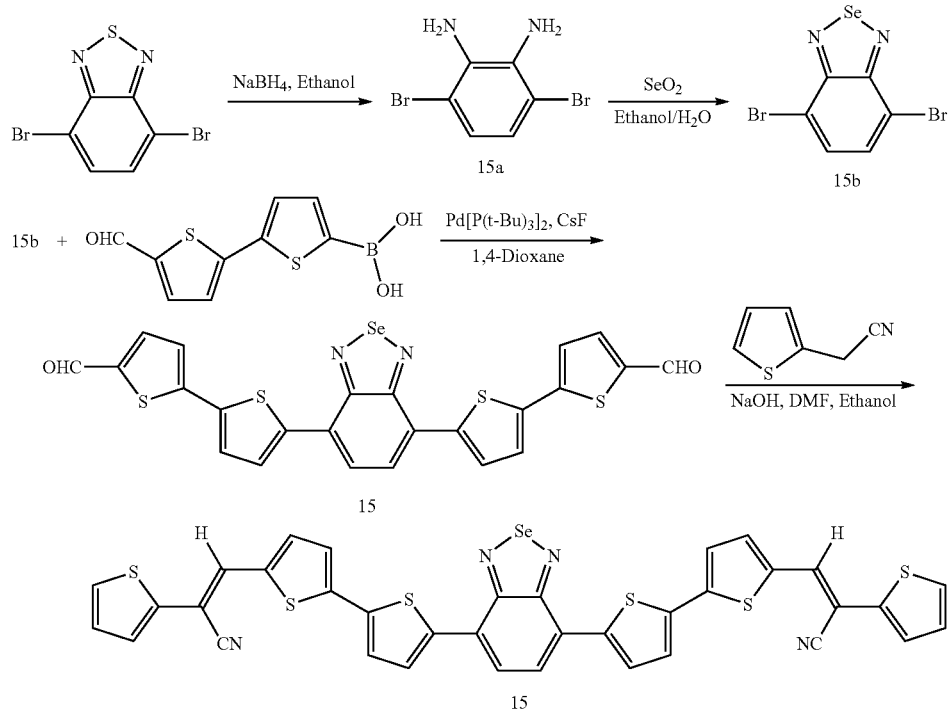

Compound 15 was prepared from a four step reaction starting from 4,7-dibromo-2,1,3-benzothiadiazole.

Step 1: 4,7-Dibromo-2,1,3-benzothidiazole 2.93 g (10 mmol) was dissolved in ethanol (200 mL). NaBH$_4$ 7.57 g (200 mmol) was added very slowly (portion wise) to the reaction flask at 0° C. After being stirred at 0° C. for 10 minutes, the reaction mixture was stirred at 22° C. for 3 h.

filtered, washed well with water, methanol and acetonitrile. The solid was suspended in acetonitrile and refluxed for 5 hours and filtered hot to get the title compound 15. Yield=0.41 g (81%). UV-vis (THF): λ$_{max}$=564 nm; $^1$H-NMR (C$_2$D$_2$Cl$_4$, 400 MHz, ppm): δ 8.06 (d, 2H), 7.87 (s, 2H), 7.58 (d, 2H), 7.47 (s, 2H), 7.45 (d, 2H) 7.40 (d, 2H), 7.37 (d, 4H), 7.14-7.12 (m, 2H).

Compound 16:

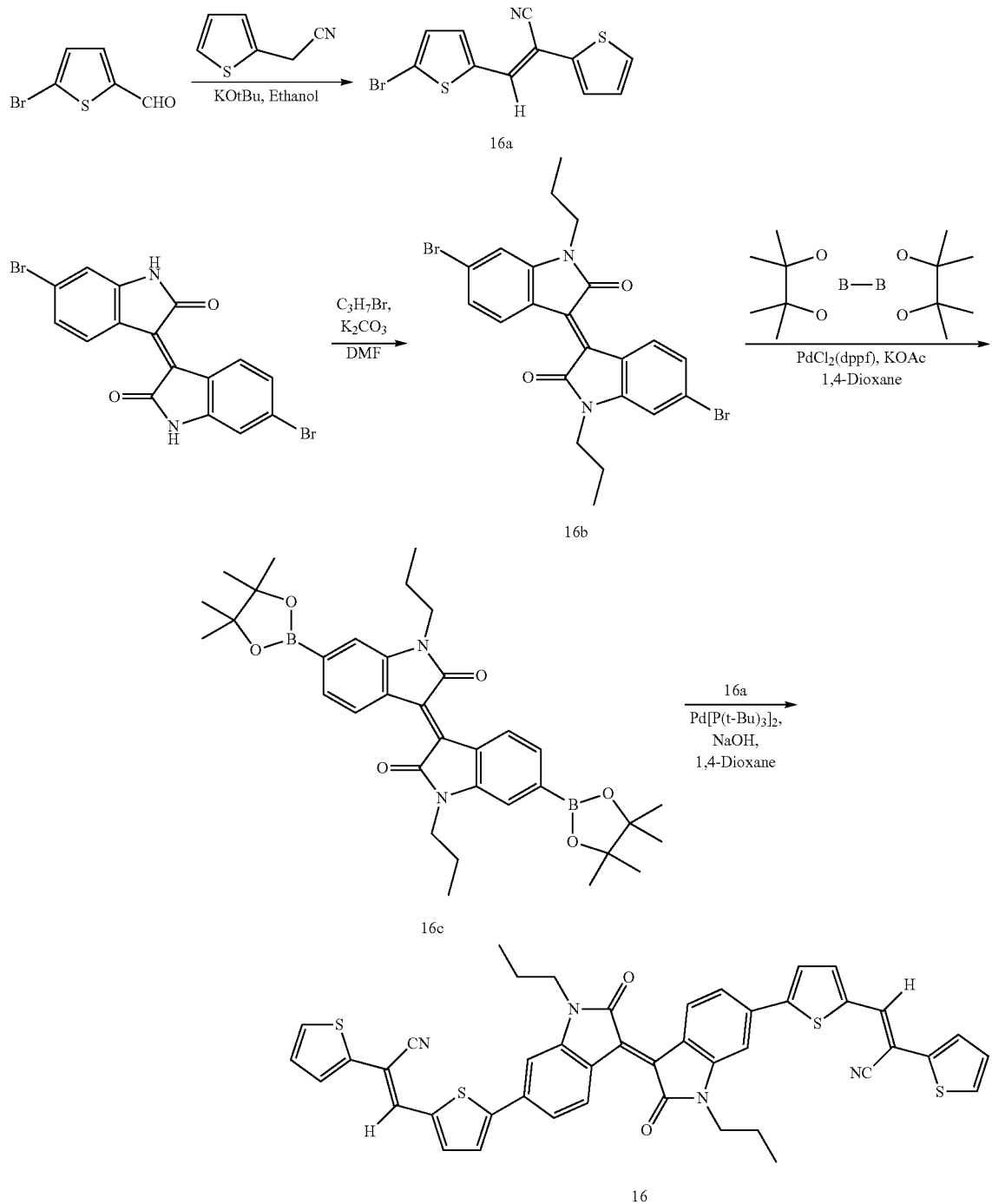

Compound 16 was prepared in a four step reaction starting from 6,6'-dibromoisoindigo as follows:

Step 1: Potassium tert-butoxide (1.12 g, 10 mmol) was dissolved in anhydrous ethanol (50 mL). 2-Thiopheneacetonitrile (3.08 g, 25 mmol) was added and stirred for 10 minutes at 22° C. 5-Bromo-thiophene-2-carbaldehyde (1.91 g, 10 mmol) was added and the resulting reaction mixture was stirred at 22° C. for 30 minutes. Reaction mixture was cooled down and the solid precipitated was filtered, washed with more ethanol and water. Orange red solid obtained was washed well with methanol to yield the compound 16a, 2.3 g (78%).

Step 2: 16a (2.1 g, 5 mmol) and potassium carbonate (3.45 g, 25 mmol) were dried under vacuum for 30 minutes. DMF (100 mL) was added to the solids and the resulting reaction mixture was stirred at 22° C. for 10 minutes. 1-Bromopropane (3.07 g, 25 mmol) was added and resulting reaction mixture was heated at 80° C. for 20 hours. The reaction mixture was cooled down and poured to ice-cold water. The solid precipitated was filtered, washed thoroughly with water and dried under vacuum for 7 hours to yield 16b, 2.4 g (95%).

Step 3: 16b (1 g, 2 mmol), bispinacolato diboron (1.16 g, 4.58 mmol), Potassium acetate (1.15 g, 11.74 mmol) and PdCl$_2$(dppf) (0.3 g, 0.36 mmol) were vacuum dried and 1,4-dioxane was (20 mL) added to the solids. The resulting reaction mixture was stirred at 80° C. for 18 hours. The reaction mixture was cooled down and quenched with water. The solid precipitated was filtered off, washed with more water and dried under vacuum for 8 hours to yield 16c, 0.9 g (75%).

Step 4: 16c (0.36 g, 0.6 mmol), 16a (0.44 g, 1.5 mmol), Pd[P(t-Bu)$_3$]$_2$ (30 mg) were dried under vacuum. Argon purged 1,4-dioxane (50 mL) was added followed by addition of 0.6 mL of 5N NaOH solution. The resulting reaction mixture was stirred at 60° C. for 17 hours. The reaction mixture was cooled down and quenched with water. The solid precipitated was filtered off, washed with more water followed by ethanol, methanol, acetonitrile, DCM, THF and chlorobenzene. Subsequently, the solid was refluxed for 2 hours in acetonitrile followed by chlorobenzene and then THF to yield the title compound 16, 0.42 g (90%). MALDI-TOF Ms.: 776.53 (without matrix); UV-vis (chlorobenzene): $\lambda_{max}$=684 nm.

Compound 17:

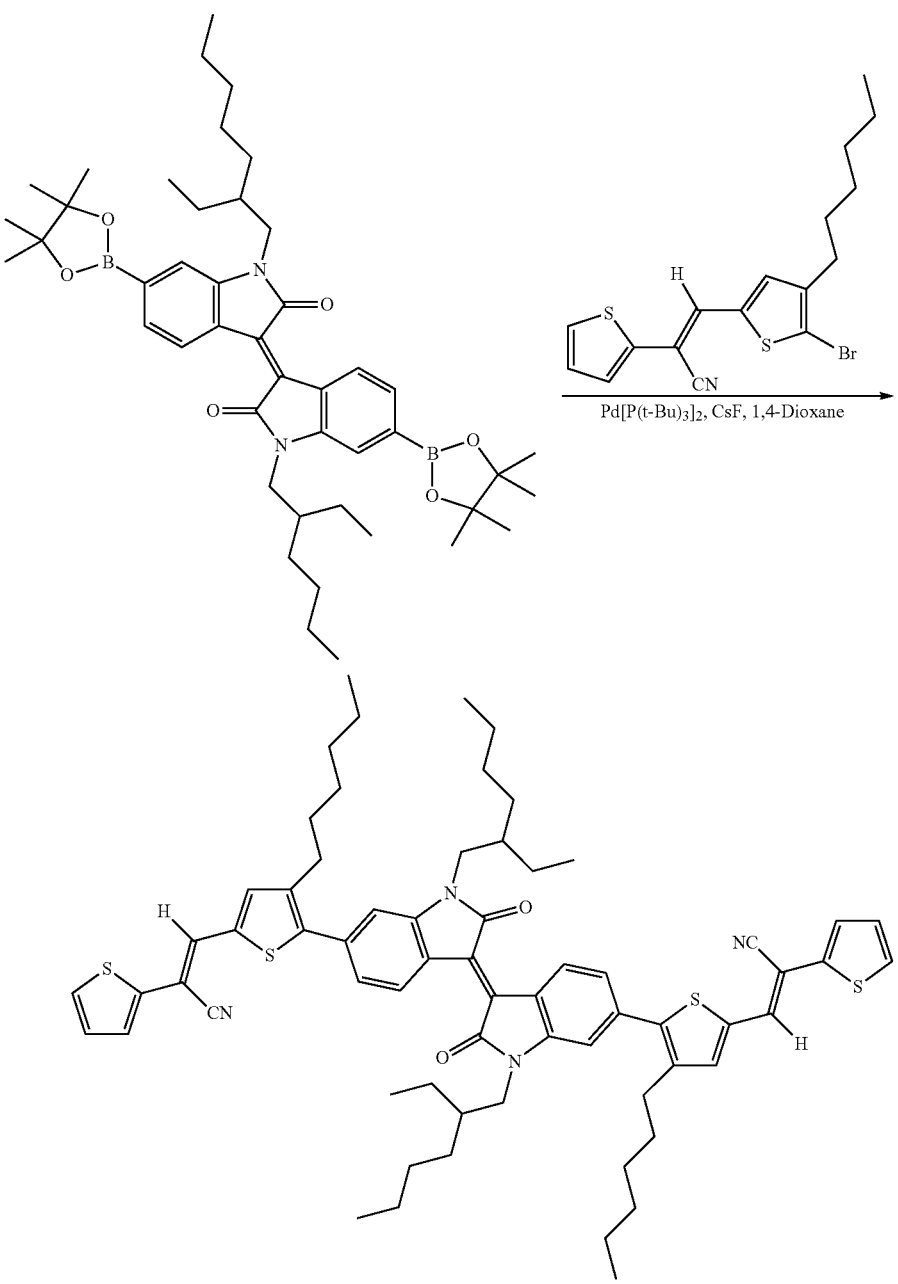

Compound 17, a soluble version of example 16 was prepared following a similar experimental procedure analogous to that of compound 16. UV-vis (Chlorobenzene): $\lambda_{max}$=560 nm; $^1$H-NMR (CD$_2$Cl$_4$, 400 MHz, ppm): δ 9.25 (d, 2H), 7.50 (d, 4H), 7.34 (d, 4H), 7.25-7.21 (dd, 2H), 7.10-7.08 (m, 2H) 6.94 (d, 2H), 3.75 (t, 4H), 2.78 (t, 4H), 1.95 (m, 2H), 1.68-1.61 (m, 4H), 1.52-1.29 (m, 28H), 0.98 (t, 6H), 0.88 (m, 12H).

Compound 18:

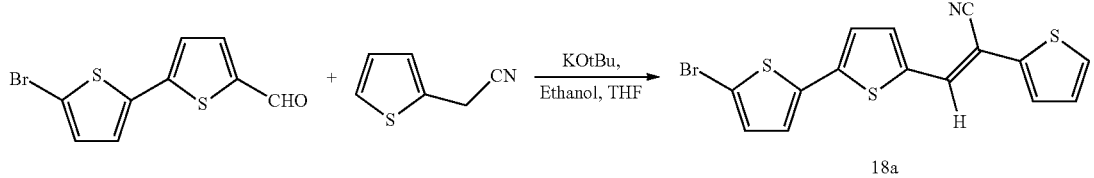

18a

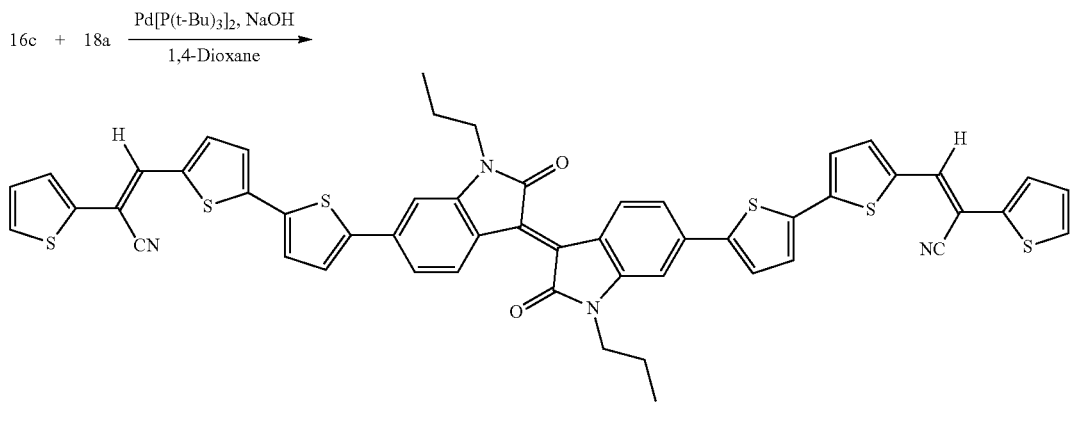

18

Compound 18 was synthesized in a similar manner to compound 16 starting from 6,6'-dibromoisoindigo and 5-bromo-5'-formyl-2,2'-bithiophene. The compound 14 was synthesized by Suzuki coupling of 16c with 18a to yield compound 18 (81%).

Synthesis of 18a: Potassium tert-butoxide (0.34 g, 3 mmol) was dissolved in ethanol (40 mL). 2-Thiopheneacetonitrile (1.1 g, 9 mmol) was added and stirred for 10 minutes at 22° C. 5-Bromo-5'-formyl-2,2'-bithiophene (0.82 g, 3 mmol) was dissolved in THF (20 mL) and added drop wise to the reaction mixture. The resulting reaction mixture was stirred for 1 hour at 22° C. and heated at 50° C. and again stirred for 1 more hour. The reaction mixture was cooled down and concentrated to remove THF. The solid was filtered, washed with more ethanol. The solid was washed with water and acetonitrile to yield the compound 18a in pure form Yield=1.08 g (95%).

Compound 18: MALDI-TOF Ms.: 941.45. (DHB matrix); UV-vis (Chlorobenzene): $\lambda_{max}$=707 nm.

Compound 19:

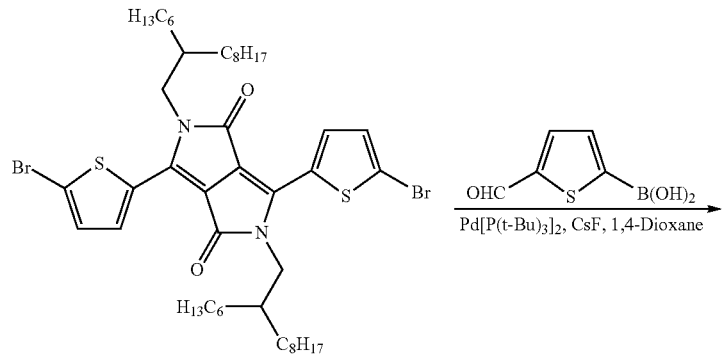

19a

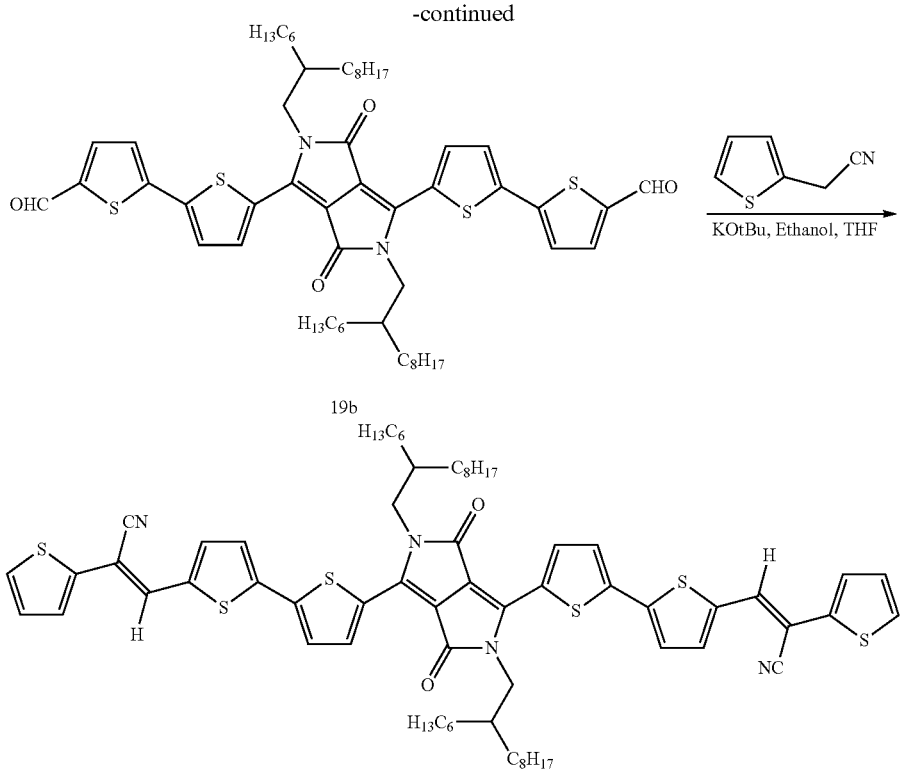

19

Compound 19 was synthesized in a two-step reaction starting from 19a as described below.

Step 1: 0.84 g (0.9 mmol) of compound 19a, 0.54 g (3.6 mmol) of CsF, 36 mg of Pd[P(t-Bu)$_3$]$_2$ and 0.42 g (2.7 mmol) of 5-formyl-2-thiopheneboronic acid were dried under vacuum. Argon purged 1,4-dioxane (20 mL) and water (1 mL) were added and stirred for 3 hours at 85° C. The reaction mixture was cooled down and diluted with methanol. The dark blue solid precipitated was filtered off and washed thoroughly with water and methanol. The compound 19b obtained was dried under vacuum for 4 hours. Yield=0.83 g (93%). $^1$H-NMR (CDCl$_3$, 400 MHz, ppm): δ 9.89 (s, 2H), 8.88 (d, 2H), 7.70 (d, 2H), 7.47 (d, 2H), 7.41 (d, 2H), 4.02 (d, 4H), 3.74 (t, 4H), 1.89-1.86 (m, 2H), 1.32-1.1.20 (m, 40H), 0.82 (t, 12H).

Step 2: 0.028 g (0.25 mmol) of potassium tert-butoxide was dissolved in 10 mL of ethanol. 0.084 g (0.69 mmol) of 2-thiopheneacetonitrile was added and stirred for 10 minutes at 22° C. Compound 19b (0.23 g, 0.23 mmol) was dissolved in THF (20 mL) and added to the ethanolic solution and the resulting reaction mixture was stirred at 22° C. for 1 hour and then heated to 70° C. for 5 hours. The reaction mixture was cooled down and diluted with methanol. The dark bluish green solid precipitated was filtered off and washed thoroughly with water and methanol. The product obtained was washed with acetonitrile and ethanol to yield the pure compound 19 and dried under vacuum for 4 hours. Yield=0.25 g (93%). MALDI-TOF Ms.: 1174.37 (without matrix); UV-vis (THF): λ$_{max}$=630 nm; $^1$H-NMR (CDCl$_3$, 400 MHz, ppm): δ 8.91 (d, 2H), 7.52 (d, 2H), 7.42 (d, 4H), 7.36 (s, 2H), 7.31 (d, 4H), 7.09-7.08 (m, 2H), 7.37 (d, 2H), 4.05 (t, 4H), 3.74 (t, 4H), 1.96-1.95 (m, 2H), 1.86-1.85 (m, 4H), 1.33-1.1.23 (m, 40H), 0.84 (t, 12H).

Compound 20:

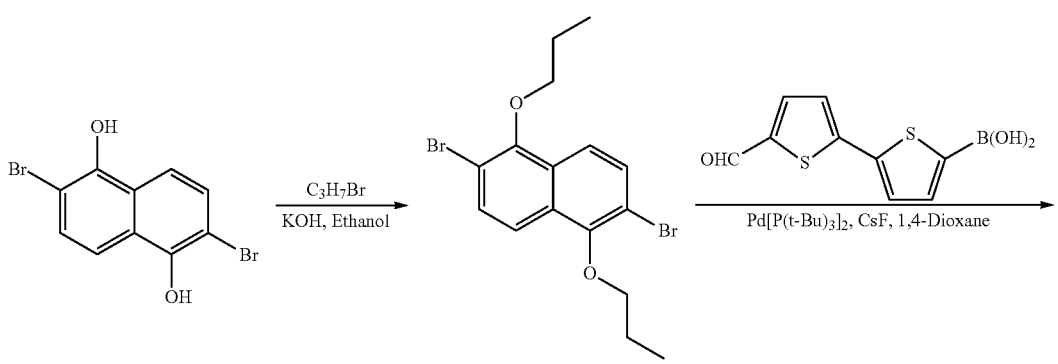

20a

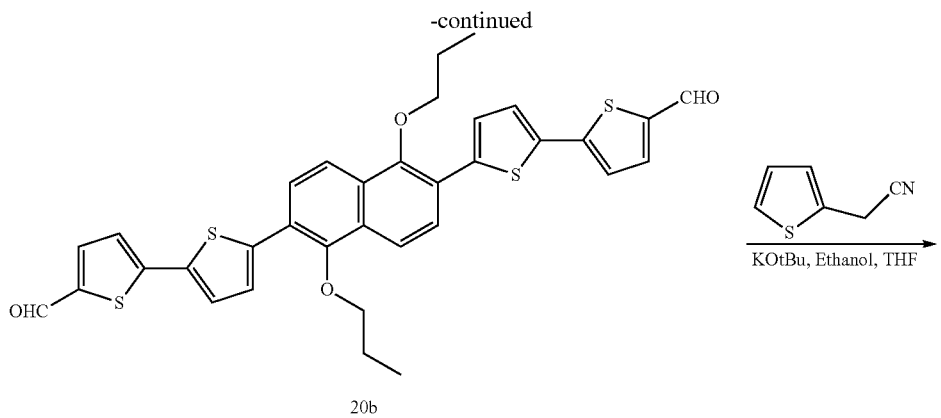

20b

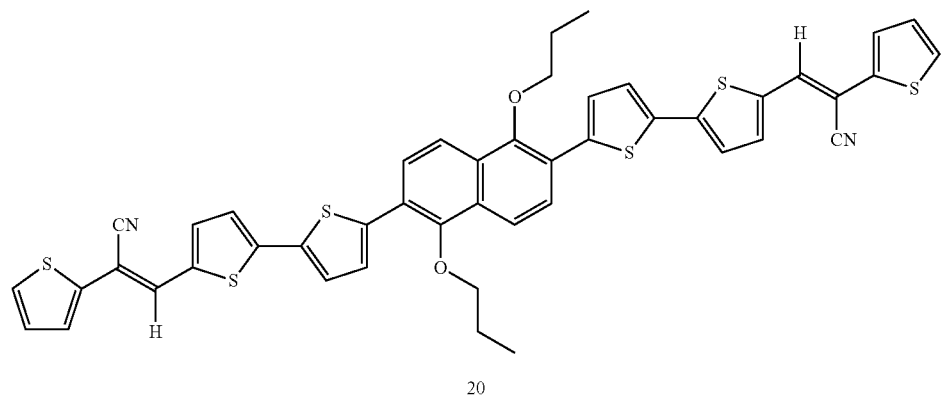

20

Compound 20 was prepared in three steps starting from 2,6-dibromo-1,5-dihydroxy naphthalene as described below.

Step 1: 1.59 g (5 mmol) of 1,5-dihydroxy-2,6-dibromonaphthalene and 0.84 g (15 mmol) of KOH in ethanol (25 mL) were refluxed for 20 minutes. 1.84 g (15 mmol) of 1-bromopropane was added drop wise under argon and the resulting reaction mixture was refluxed for 8 hours. The reaction mixture was cooled down. The reaction mixture was poured to ice-cold water and extracted using DCM. The DCM extract was dried under sodium sulphate and filtered to give colorless solid 20a. Yield=1.31 g (65%).

Step 2: 2,6-Dibromo-1,5-dipropoxy naphthalene 20a (0.5 g, 1.25 mmol), 5'-formyl-2,2'-bithiophene-5-boronic acid (0.64 g, 2.7 mmol), CsF (0.75 g, 5 mmol) and Pd[P(t-Bu)$_3$]$_2$ catalyst (0.02 g, 0.024 mmol) were dried under vacuum. 10 mL of 1,4-dioxane and 0.5 mL of water were purged under argon and added to the solids. The resulting reaction mixture was stirred at 85° C. for 17 hours. The reaction mixture was cooled down and poured into ice-cold water. The solid precipitated was filtered, washed with more water. The solid was then washed with methanol, ethanol and hexane to get the yellowish solid 20b. Yield=0.6 g (76%).

Step 3: Potassium tert-butoxide (0.07 g, 0.6 mmol) was dissolved in ethanol (5 mL) and THF (10 mL). 0.3 g (2.4 mmol) of 2-thiopheneacetonitrile was added. 0.38 g (0.6 mmol) of compound 20b was added and the resulting reaction mixture was stirred at 22° C. for 20 minutes and later heated at 80° C. for 5 hours. The reaction mixture was cooled down and filtered. The solid precipitated was filtered, washed with water. The solid was then washed with methanol, ethanol and hexane to get a dark drown solid 20. Yield=0.38 g (75%). UV-vis (THF): $\lambda_{max}$=471 nm; $^1$H-NMR (THF-d$_8$, 400 MHz, ppm): δ 8.19 (s, 2H), 8.01 (d, 2H), 7.93 (d, 2H), 7.81 (d, 2H), 7.73 (d, 2H) 7.61 (d, 2H), 7.49 (d, 2H).

Compound 21:

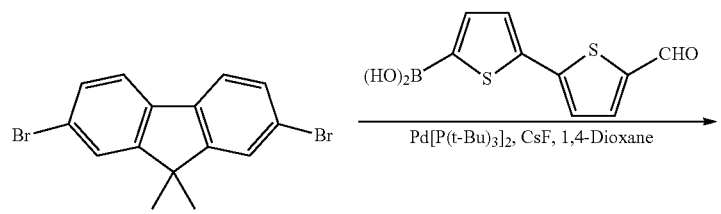

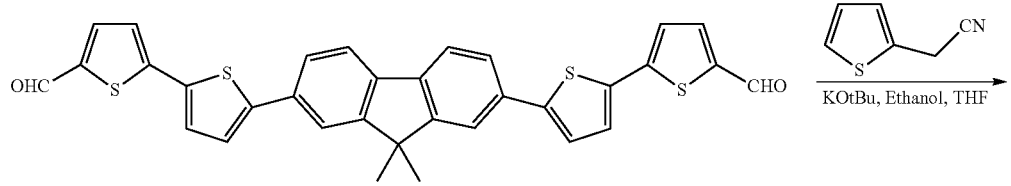

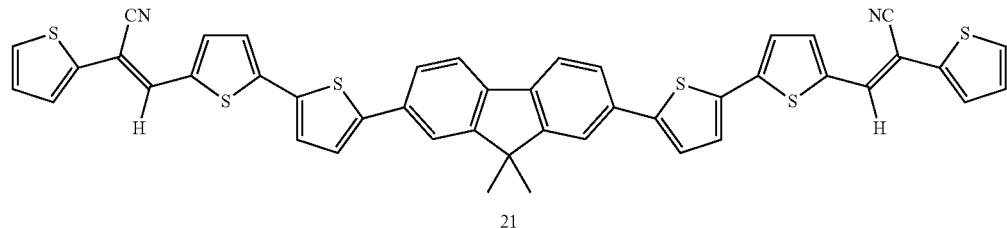

Compound 21 was synthesized in a two-step reaction starting from 2,7-dibromofluorene as described below.

Step 1: 0.35 g (1 mmol) of 2,7-dibromofluorene, 0.6 g (2.5 mmol) of 5'-formyl-2,2'-bithiophene-5-boronic acid and Pd[P(t-Bu)$_3$]$_2$ catalyst (0.03 g) were dried under vacuum. 25 mL of argon purged 1,4-dioxane along with 1 mL of water was added. The resulting reaction mixture was stirred at 85° C. for 17 hours. The reaction mixture was cooled down, diluted with methanol and filtered. The solid obtained was washed with water, methanol, hexane, and acetonitrile to give the pure compound 21a. Yield=0.55 g (95%). $^1$H-NMR (CDCl$_3$, 400 MHz, ppm): δ 9.87 (s, 2H), 7.75 (d, 2H), 7.70 (d, 2H), 7.66 (d, 2H), 7.62 (dd, 2H) 7.38-7.34 (m, 4H), 7.29 (d, 2H), 1.59 (s, 6H).

Step 2: 0.52 g (0.9 mmol) of compound 21a, 0.44 g (3.6 mmol) of 2-thiopheneacetonitrile was dissolved in ethanol (10 mL) and THF (10 mL). 0.11 g (1 mmol) of potassium tert-butoxide was dissolved in 5 mL of ethanol and added drop wise and the resulting reaction mixture was stirred for 30 minutes at 22° C. and at 60° C. for 2 hours. The reaction mixture was cooled down and filtered. The solid filtered was washed thoroughly with water, methanol, ethanol and acetonitrile to yield the pure compound 21. Yield=0.55 g (78%). UV-vis (THF): λ$_{max}$=464 nm; $^1$H-NMR (C$_2$D$_2$Cl$_4$, 400 MHz, ppm): δ 7.76 (d, 2H), 7.68 (s, 2H), 7.64 (d, 2H), 7.49 (d, 2H), 7.39 (d, 2H) 7.36-7.34 (m, 6H), 7.26 (d, 2H), 7.11-7.09 (m, 2H), 1.61 (s, 6H).

Compound 22:

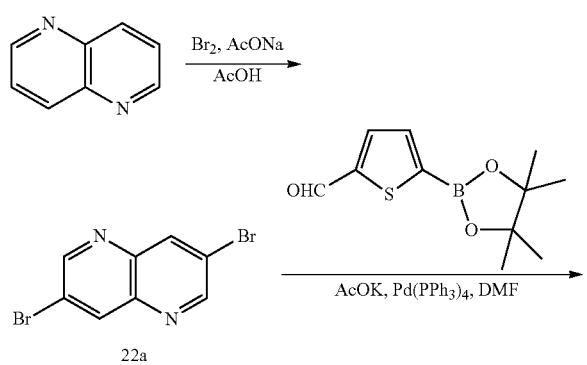

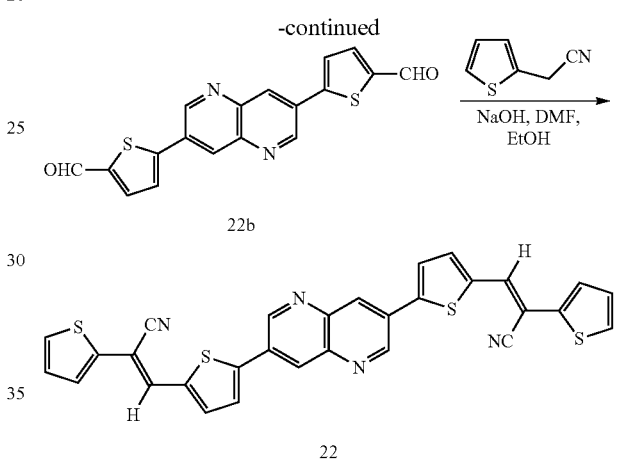

Step 1: To a mixture of naphthyridine (3.00 g, 23.05 mmol) and sodium acetate (7.6 g, 92.2 mmol) in acetic acid (20 mL) at 85° C. was added dropwise bromine (8.1 g, 50.71 mmol) in acetic acid (10 mL) under N$_2$ gas. The resulting suspension was stirred at 85° C. for 2.5 hours. After the reaction mixture was cooled at 22° C., it was poured into water. The formed precipitate was collected by filtration, was washed with water, and was dried over in vacuo. The solid was washed with hot ethyl acetate to yield 22a. Yield=5.1 g (77%).

Step 1: To a solution of 3,7-diboromo-1,5-naphthylidine (22a) (0.5 g, 1.74 mmol) in dimethylformamide (25 mL) were added 5-(4,4,5,5-tetramethyl-1,3,2-dioxaborolan-2-yl)-2-thiophenecarboxaldehyde (1.03 g, 4.34 mmol) and potassium acetate (0.51 g, 5.21 mmol). After Pd(PPh$_3$)$_4$ (0.2 g, 0.17 mmol) was added there, the mixture was stirred at 95° C. for 22 hours. After the reaction mixture was cooled at 22° C., the solid was collected by filtration, and washed with dimethylformamide and water to give 22b as a yellow solid. Yield=0.2 g (33%).

Step 2: To a suspension of 22b (0.2 g, 0.57 mmol) in dimethylformamide (20 mL) were added 2-thiopheneac-etonitrile (0.28 g, 2.28 mmol) and a solution of sodium hydroxide (0.11 g, 2.85 mmol) in ethanol (5 mL). The mixture was stirred at 22° C. for 30 minutes and at 60° C. for 2 hours. After the reaction mixture was cooled at 22° C., the solid was collected by filtration, and washed with ethanol, water, and methanol. It was dried over in vacuo to give 22 as a brown solid. Yield=0.16 g (50%), MALDI-TOF Ms.: 561.09 (with matrix).

Compound 23:

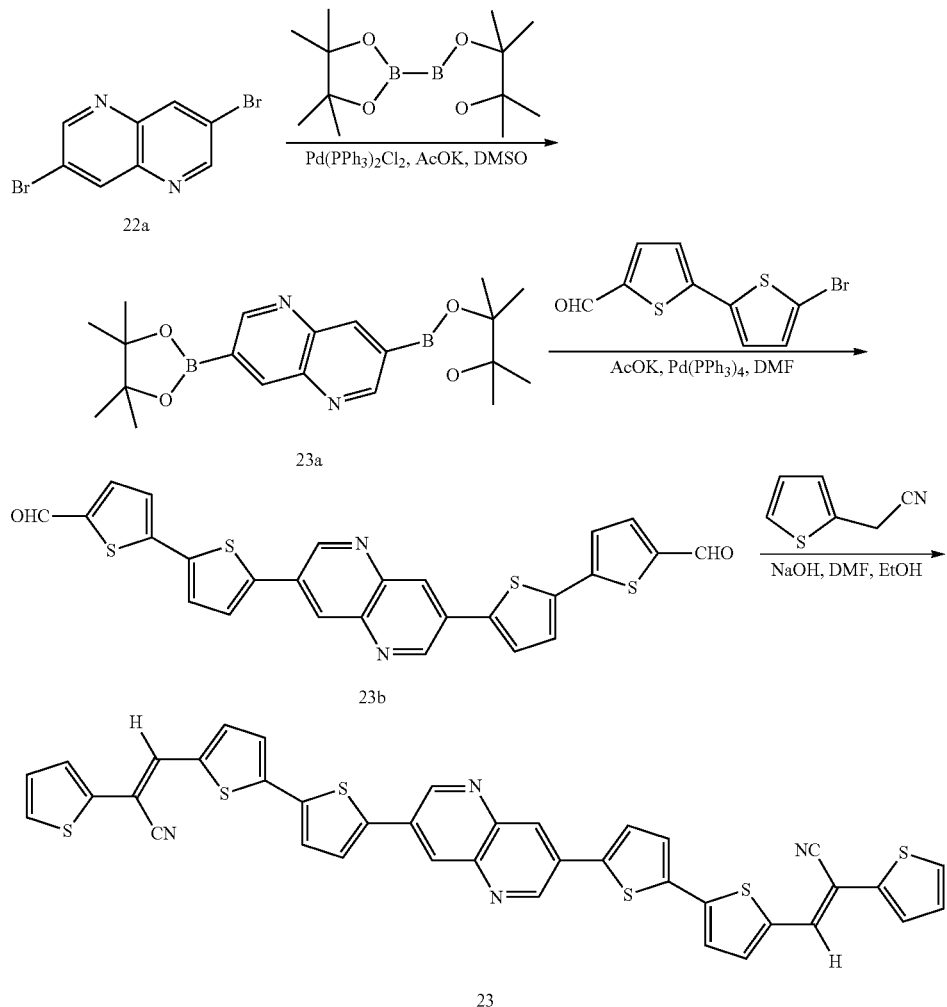

Step 1: To a solution of 22a (2.00 g, 6.95 mmol) in DMSO (dimethyl sulfoxide, 40 mL) under Ar gas, were added bispinacolato diboron (3.9 g, 15.28 mmol), potassium acetate (4.6 g, 47.23 mmol), and bistriphenylphosphine palladium dichloride (0.34 g, 0.49 mmol). After the mixture was stirred at 22° C. for 15 minutes, it was stirred at 85° C. for 24 hours. After it was cooled at 22° C., it was poured into water (200 mL). The formed solid was collected by filtration, and then it was washed with ethyl acetate to yield 23a. Yield=1.6 g (60%).

Step 3: To a solution of 23a (0.70 g, 1.83 mmol) in DMF (50 mL) under Ar gas, were added 5-bromo-2,2'-bithiophene-5'-aldehyde (1.1 g, 4.03 mmol) and potassium acetate (1.1 g, 10.99 mmol). After the mixture was stirred at 22° C. for 1 hour, Pd(PPh$_3$)$_4$ (0.32 g, 0.27 mmol) was added. The mixture was stirred at 85° C. for 18 hours. After the reaction mixture was cooled at 22° C., dichloromethane and 0.5M HCl were entered, and then it was stirred for 20 minutes. After the formed solid was collected by filtration, it was washed with water, dichloromethane, and methanol to yield 23b. Yield=0.8 g (85%).

Step 4: To a suspension of 23b (0.3 g, 0.58 mmol) in DMF (20 mL) under Ar gas, was added 2-thiopheneacetonitrile (0.29 g, 2.33 mmol) and a solution of NaOH (0.12 g, 2.91 mmol) in ethanol (5 mL). After the mixture was stirred at 22° C. for 30 minutes and stirred at 60° C. for 2 hours. After the reaction mixture was cooled at 22° C., it was washed with EtOH, water, and methanol to yield 23. Yield=0.35 g (83%). MALDI-TOF Ms.: 723.98 (without matrix); UV-vis (THF): $\lambda_{max}$=469 nm.

Compound 24:

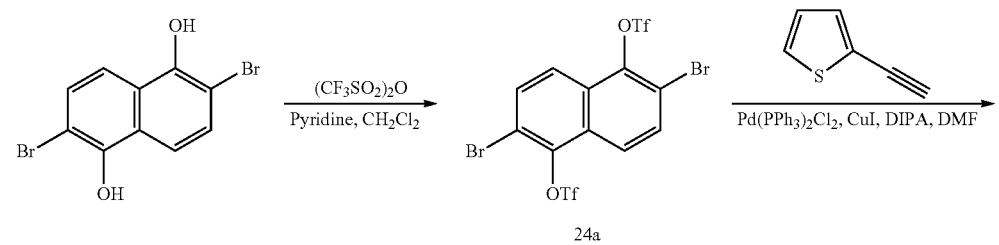

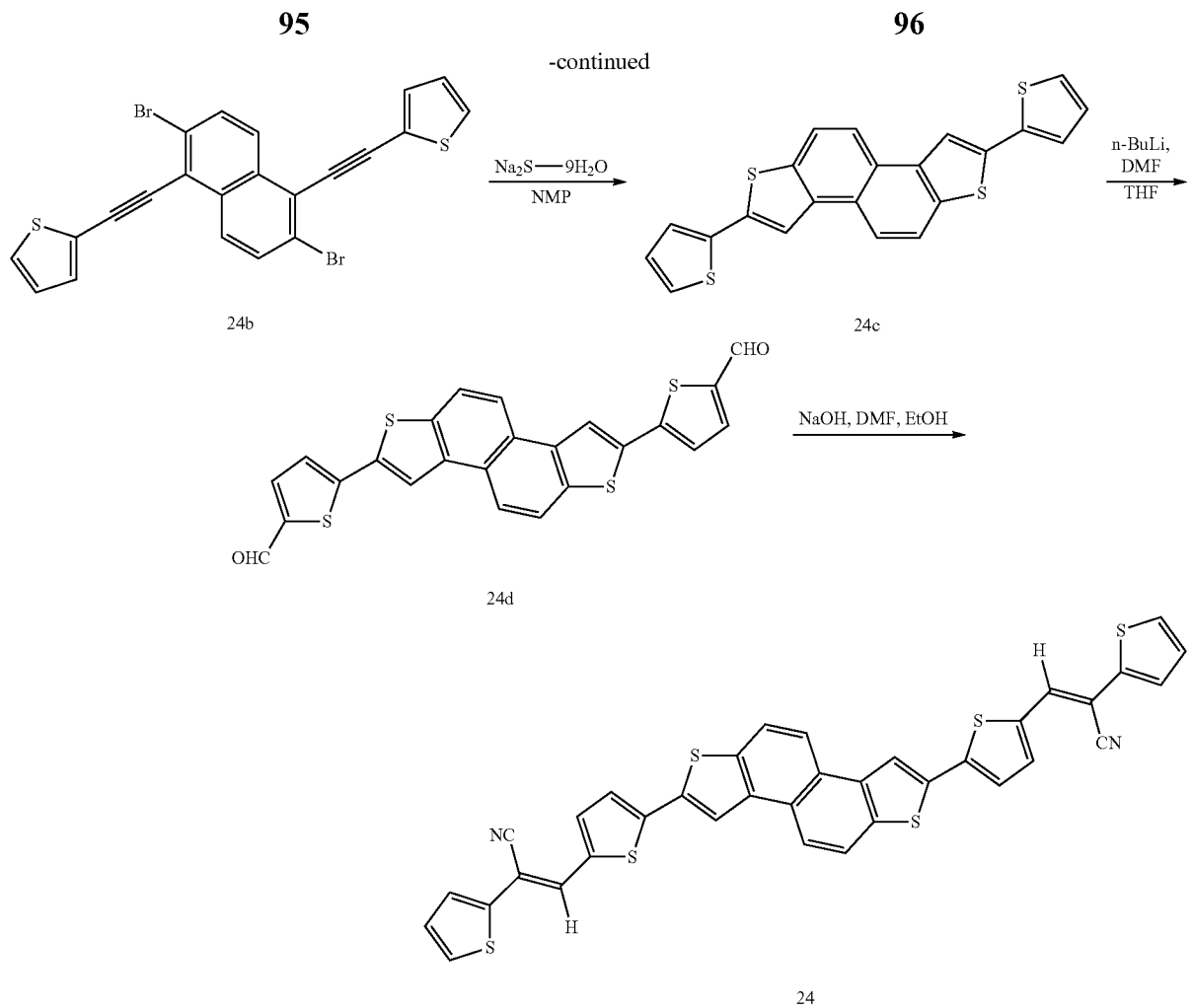

Step 1: To a suspension of dibromodihydroxylnaphthalene (3.3 g, 9.4 mmol), pyridine (4.5 mL) in dichloromethane (90 mL) was slowly added trifluoromethanesuflonic anhydride (3.3 mL, 21 mmol) at 0° C. After the mixture was stirred at 22° C. for 4 hours, water and 1M hydrochloric acid (10 mL) were added. The resulting mixture was extracted with dichloromethane, and combined organic layer was dried ($MgSO_4$) and concentrated in vacuo. The residue was purified by column chromatography on silica gel eluted with dichloromethane to give 24a as a white solid. Yield=2.82 g (51%).

Step 2: To a solution of 24a (620 mg, 1.07 mmol) in DMF (7.5 mL) and diisopropylamine (7.5 mL) was added $Pd(PPh_3)_2Cl_2$ (75 mg, 0.054 mmol), CuI (41 mg, 0.22 mmol) and 2-ethynylthiophene (243 mg, 2.14 mmol). After the mixture was stirred at 22° C. for 11 hours, water and 1M hydrochloric acid were added. The resulting mixture was extracted with dichloromethane, and the combined organic layer was dried ($MgSO_4$) and concentrated in vacuo. The residue was dissolved in dichloromethane, and it was recrystallized at 0° C. to give 24b as a pale yellow solid. Yield=270 mg (9%).

Step 3: To a suspension of $Na_2S.9H_2O$ (1.86 g, 7.7 mmol) in N-methylpyrrolidone (55 mL) was added 24b (900 mg, 1.84 mmol), and the mixture was stirred at 185° C. for 12 hours. After the reaction mixture was cooled at the same temperature, the resulting mixture was added into aqueous ammonium chloride. The resulting precipitate was collected by filtration and washed with water, methanol, and hexane. The crude product was washed with hot dichloromethane to give 168 mg of 24c and the solid formed in the mother liquid was collected by filtration to give 93 mg of 24c. Yield=262 mg (43%).

Step 4: To a solution of 24c (275 mg, 0.68 mmol) in THF (10 mL) was added dropwise n-BuLi (1.02 mL, 1.6 mmol) at −70° C. After the reaction mixture was stirred at 22° C. for 1 hour, DMF (110 μL, 1.6 mmol) was added. The reaction mixture was stirred for 2 hours. After addition of water into the reaction mixture, the solid was collected by filtration to give 24d as a yellow solid. Yield=181 mg (58%).

Step 5: To a suspension of 24d (206 mg, 0.45 mmol) in DMF (15 mL) were added 2-thiopheneacetonitrile (230 mg, 1.8 mmol) and a solution of NaOH (90 mg, 2.25 mmol) in EtOH (4 mL). The mixture was stirred at 22° C. for 30 min, and then stirred at 60° C. for 2 h. After the reaction mixture was cooled at 22° C., the solid was collected by filtration, and then washed with ethanol, water, and MeOH. The solid was stirred in 50 mL of MeOH under reflux for 2 hours. After the suspension was cooled at 22° C., the solid was collected by filtration, and then it was dried in vacuo to give 24 as a dark purple solid. Yield=155 mg (51%). MALDI-TOF Ms.: 669.96 (with matrix); UV-vis (DMSO): $\lambda_{max}$=452 nm.

Compound 25

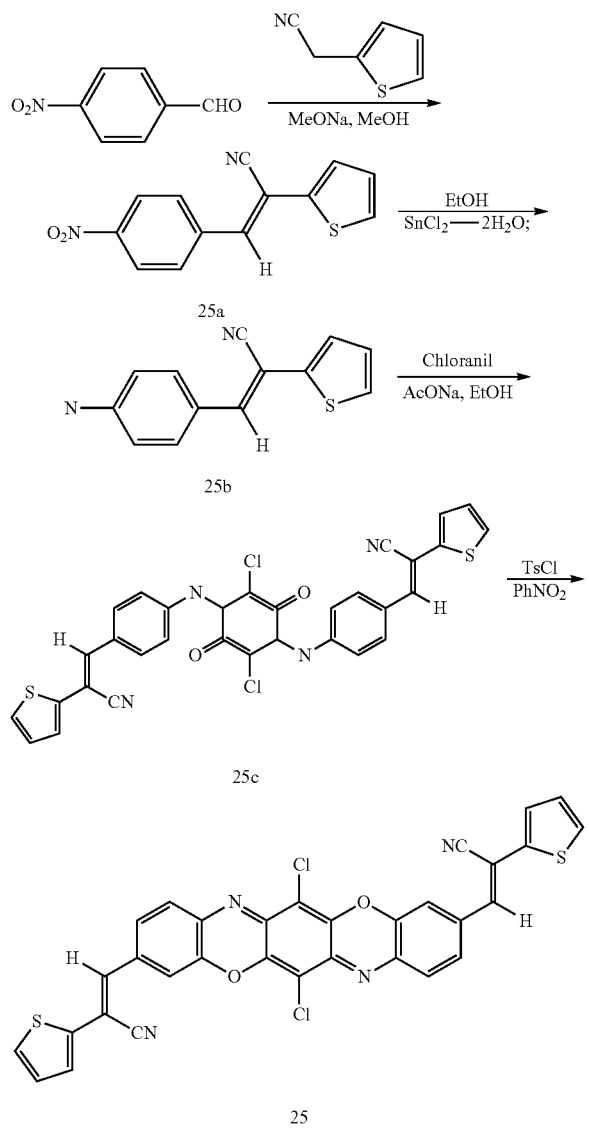

Compound 25 was synthesized in three steps as described below.

Step 1: In a 100 mL reactor 1.51 g (10 mmol) of p-nitrobenzaldehyde, 1.23 g (10 mmol) of 2-thiopheneacetnitrile, 0.27 g (5 mmol) of MeONa and 20 mL of methanol were placed under $N_2$ atmosphere. The mixture was stirred at 22° C. for 6 hours. After the reaction was completed, the mixture was filtrated, then the residue was washed with methanol, $H_2O$, methanol. 1.92 g of 25a was obtained after drying under reduced pressure as a yellow solid. Yield=75%.

Step 2: In a 50 mL reactor 0.5 g (1.95 mmol) of 25a and 20 mL of Ethanol were placed. 2.2 g (9.75 mmol) of $SnCl_2.2H_2O$ was added to the solution, the mixture was stirred at reflux for 2 hours. After the reaction was completed, the mixture was diluted with dichloromethane and washed with $NaHCO_3$aq, water, NaClaq. The organic layer was dried over $MgSO_4$, subsequently concentration under vacuum yielded 0.35 g of 25b as a yellow solid. Yield=80%.

Step 3: In a 50 mL reactor 0.19 g (0.77 mmol) of chloranil, 0.35 g (1.55 mmol) of 25b, 0.25 (3.1 mmol) of AcONa and 20 mL of ethanol were placed under $N_2$ atmosphere. The mixture was stirred at reflux for overnight. After the reaction was completed, the mixture was filtrated and the solid was washed with ethanol, Hot water, ethanol and tertbutylmethylether (TBME). 0.18 g of 25c was obtained after drying under reduced pressure as a brown solid. Yield=38%.

Step 4: In a 20 mL reactor 0.18 g (0.29 mmol) of 25c, 0.097 (0.51 mmol) of p-toluenesulfonylchloride and 7 mL of nitrobenzene were placed under $N_2$ atmosphere. The mixture was stirred at 220° C. for overnight. The reaction mixture was filtered, and then the residue was washed with ethanol, water, dichloromethane. 0.11 g of compound 25 was obtained after drying under reduced pressure a purple solid. Yield=62%, Melting Point: 300° C., UV-VIS (DMF): 540, 642 nm, MALDI: 622.50.

Compound 26:

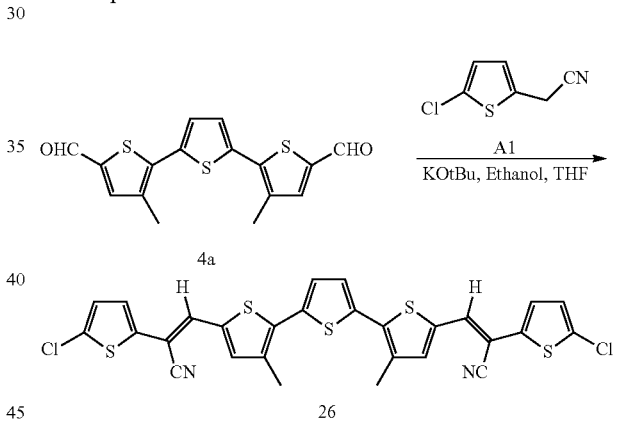

Compound 26 was synthesized by condensing acetonitrile A1 with compound 4a using a similar procedure as described for compound 4 to give compound 26 in 74% yield. UV-vis (THF): $\lambda_{max}$=480 nm; $^1$H-NMR ($C_2D_2Cl_4$, 400 MHz, ppm): δ 7.37 (s, 2H), 7.31 (s, 2H), 7.22 (s, 2H), 7.12 (d, 2H), 6.93 (d, 2H), 2.5 (s, 6H).

Compound 27:

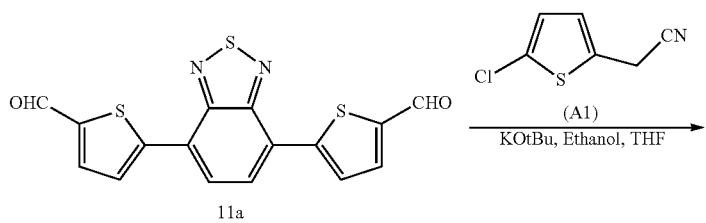

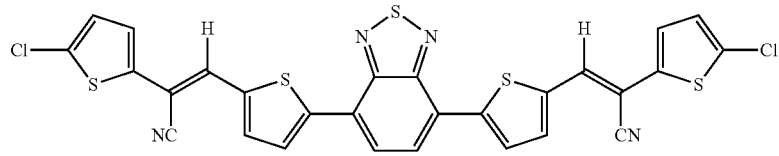

27

Compound 27 was synthesized by condensing 11a with A1 in a similar way as described for compound 11. Yield=80%. UV-vis (THF): $\lambda_{max}$=526 nm; $^1$H-NMR (C$_2$D$_2$Cl$_4$, 400 MHz, ppm): δ 8.25 (d, 2H), 8.03 (s, 2H), 7.78 (d, 2H), 7.40 (s, 2H), 7.21 (d, 2H), 6.9 (d, 2H).

Compound 28:

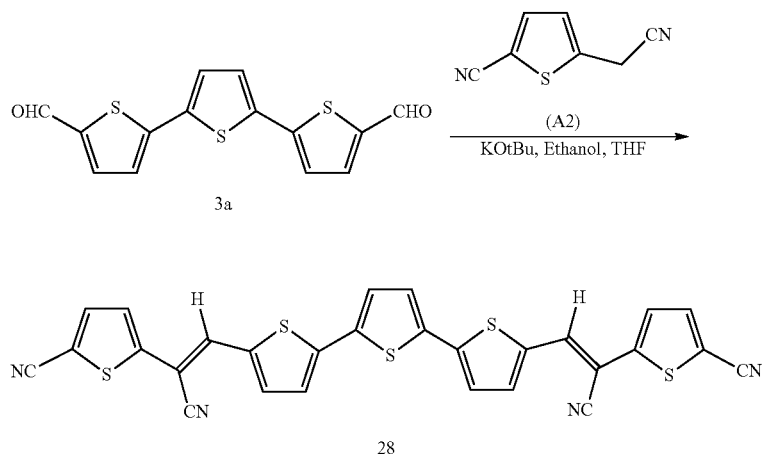

Compound 3a (0.46 g, 1.5 mmol) and acetonitrile A2 (0.67 g, 4.5 mmol) were dissolved the in 25 mL THF and 5 mL ethanol mixture (5:1). Potassium tert-butoxide was added (0.34 g, 3 mmol) and stirred at 22° C. for 1 h and later warmed to 60° C. and stirring continued for one more hour. Purification: The reaction mixture was cooled down and filtered and the brownish black solid 28 obtained was washed thoroughly with methanol and recrystallize from boiling 1,2-dichlorobenzene. Yield=0.6 g (71.4%). UV-vis (THF): $\lambda_{max}$=504 nm; $^1$H-NMR (C$_2$D$_2$Cl$_4$, 400 MHz, ppm): δ 7.64 (d, 2H), 7.60 (d, 2H), 7.52 (s, 2H), 7.37 (s, 2H), 7.34 (dd, 4H).

Compound 29:

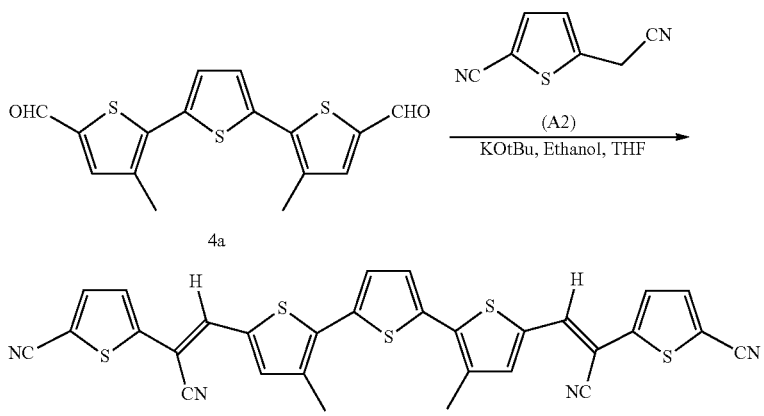

Compound 29 was synthesized from 4a and A2 using a similar synthesis and purification procedure as adopted for the synthesis of compound 28 to yield compound 29 in 78% yield. UV-vis (THF): $\lambda_{max}$=501 nm; $^1$H-NMR ($C_2D_2Cl_4$, 400 MHz, ppm): δ 7.60 (d, 2H), 7.46 (s, 2H), 7.36 (bs, 4H), 7.30 (d, 2H), 2.5 (s, 6H).

Compound 30:

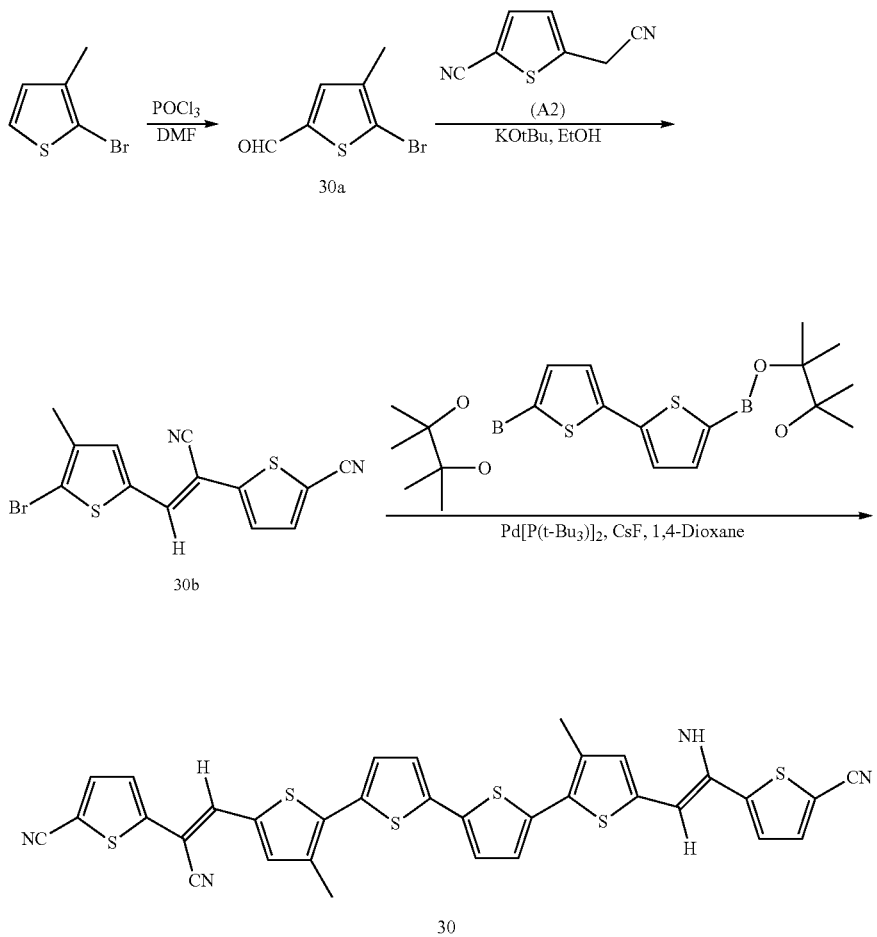

Compound 30 was synthesized in a three step reaction using acetonitrile A2, 2-bromo-3-methylthiophene and 5,5'-bis(4,4,5,5-tetramethyl-1,3,2-dioxaborolan-2yl)-2,2'-bithiophene.

Step 1: 2-Bromo-3-methyl thiophene (10 g, 56.5 mmol) was dissolved in 40 mL of DMF. POCl$_3$ (10.3 mL) was added drop wise to DMF solution at 0° C. and the resulting reaction mixture was stirred at 70° C. for 6 hours. The reaction mixture was cooled down and poured to saturated sodium acetate solution and extracted using diethyl ether to yield the pale brownish liquid 30a which was solidified upon drying in 80% yield. $^1$H-NMR (CDCl$_3$, 400 MHz, ppm): δ 9.8 (s, 1H), 7.44 (s, 1H), 2.21 (s, 3H).

Step 2: Compound 30a (0.62 g, 3 mmol) and A2 (0.74 g, 5 mmol) were dissolved in ethanol (15 mL). Potassium tert-butoxide was added (0.34 g, 3 mmol) and stirred at 22° C. for 1 hour. The reaction mixture was filtered and the yellowish solid 30b obtained was washed thoroughly with methanol. Yield=0.73 g (70%). $^1$H-NMR (CDCl$_3$, 400 MHz, ppm): δ 7.52 (d, 2H), 7.34 (s, 1H), 7.29 (s, 1H), 2.2 (s, 3H).

Step 3: Compound 30b (0.67 g, 2 mmol) and 5,5'-bis(4,4,5,5-tetramethyl-1,3,2-dioxaborolan-2yl)-2,2'-bithiophene (0.33 g, 0.8 mmol) and Pd[P(t-Bu)$_3$]$_2$ (20 mg, 0.028 mmol) were dried under vacuum. 1,4-Dioxane (15 mL) was added to the solids. Argon purged 1 mL 5N NaOH solution was added and stirred at 22° C. for 4 hours. The reaction mixture was diluted with methanol. The solid precipitated was filtered and washed with water and methanol. The brownish black solid 30 obtained was recrystallized from 1,2-dichlorobenzene. Yield=0.45 g (83%). UV-vis (THF): $\lambda_{max}$=501 nm. $^1$H-NMR ($C_2D_2Cl_4$, 400 MHz, ppm): δ 7.60 (d, 2H), 7.50 (s, 2H), 7.45 (s, 2H), 7.31 (m, 6H), 2.53 (s, 6H).

Compound 31:

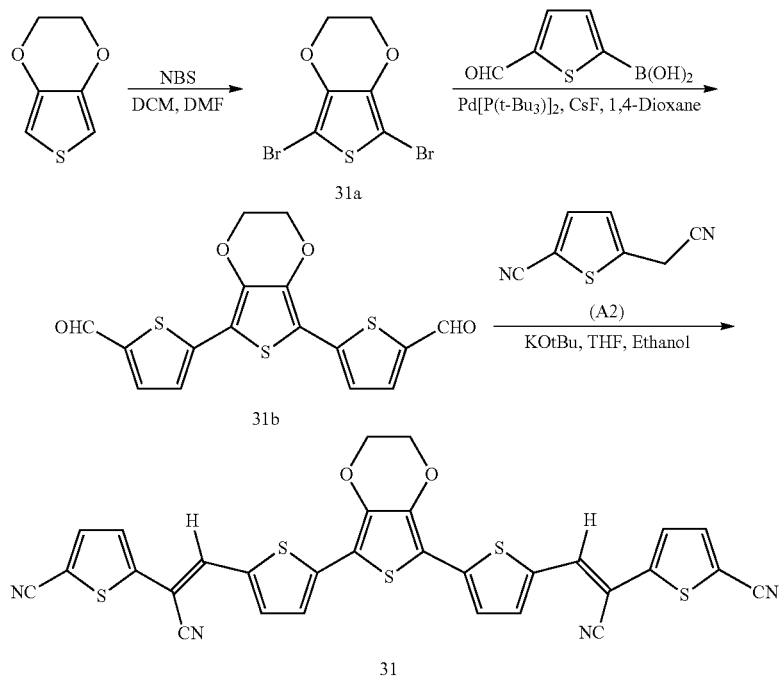

Compound 31 was synthesized via a three step reaction starting from 3,4-diethoxythiophene as described below.

Step 1: 3,4-Diethoxythiophene (1.42 g, 10 mmol) was dissolved in DCM (20 mL) at 0° C. NBS (3.91 g, 22 mmol) was dissolved in DMF (5 mL) and stirred at 22° C. for overnight. The reaction mixture was poured into ice-cold water and extracted with diethyl ether. The organic layer was dried under sodium sulphate, filtered and concentrated to give the desired product 31a in 80% yield. $^1$H-NMR (CDCl$_3$, 400 MHz, ppm): δ 4.26 (s, 4H).

Step 2: Compound 31a (0.66 g, 2.2 mmol), 5-formyl-2-thienylboronic acid (0.75 g, 4.84 mmol), CsF (1.32 g, 8.8 mmol) and Pd[P(t-Bu)$_3$]$_2$ (36 mg) were dried under vacuum. Argon purged water (1 mL) along with 1,4-Dioxane (25 mL) was added and the resulting reaction mixture was heated at 90° C. for 6 hours. The reaction mixture was cooled down and diluted with methanol and filtered. The solid precipitated was washed well with water and methanol to give 0.66 g (83%) of the desired product 31b. $^1$H-NMR (C$_2$D$_2$Cl$_4$, 400 MHz, ppm): δ 9.84 (s, 2H), 7.69 (d, 2H), 7.33 (d, 2H), 4.46 (s, 4H).

Step 3: Compound 31b (0.25 g, 0.7 mmol) and acetonitrile A2 (0.41 g, 2.8 mmol) were dissolved in THF/ethanol mixture. KOtBu (0.17 g, 1.4 mmol) was added and stirred at 22° C. for 2 hours. The reaction mixture was filtered. The solid (31) obtained after filtration was washed with methanol and acetonitrile. Yield=0.36 g. Purification: 0.35 g of the solid was dissolved in boiling dichlorobenzene and allowed to crystallize. Yield=0.32 g (74%). UV-vis (THF): λ$_{max}$=531 nm; $^1$H-NMR (C$_2$D$_2$Cl$_4$, 400 MHz, ppm): δ 7.65 (d, 2H), 7.57 (d, 2H), 7.50 (s, 2H), 7.37 (d, 2H), 7.29 (d, 2H), 4.5 (s, 4H).

Compound 32:

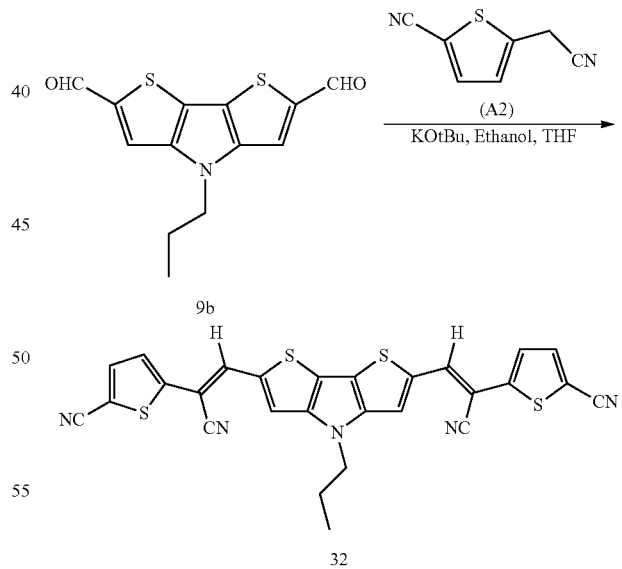

Compound 32 was synthesized by condensing 9b with acetonitrile A2 using a similar procedure as adopted for the synthesis of Compound 9. Yield=0.5 g (72%). UV-vis (THF): λ$_{max}$=527 nm; $^1$H-NMR (C$_2$D$_2$Cl$_4$, 400 MHz, ppm): δ 7.62 (dd, 4H), 7.56 (s, 2H), 7.32 (s, 2H), 4.23 (t, 2H), 1.94 (m, 2H), 0.98 (s, 3H).

Compound 33:

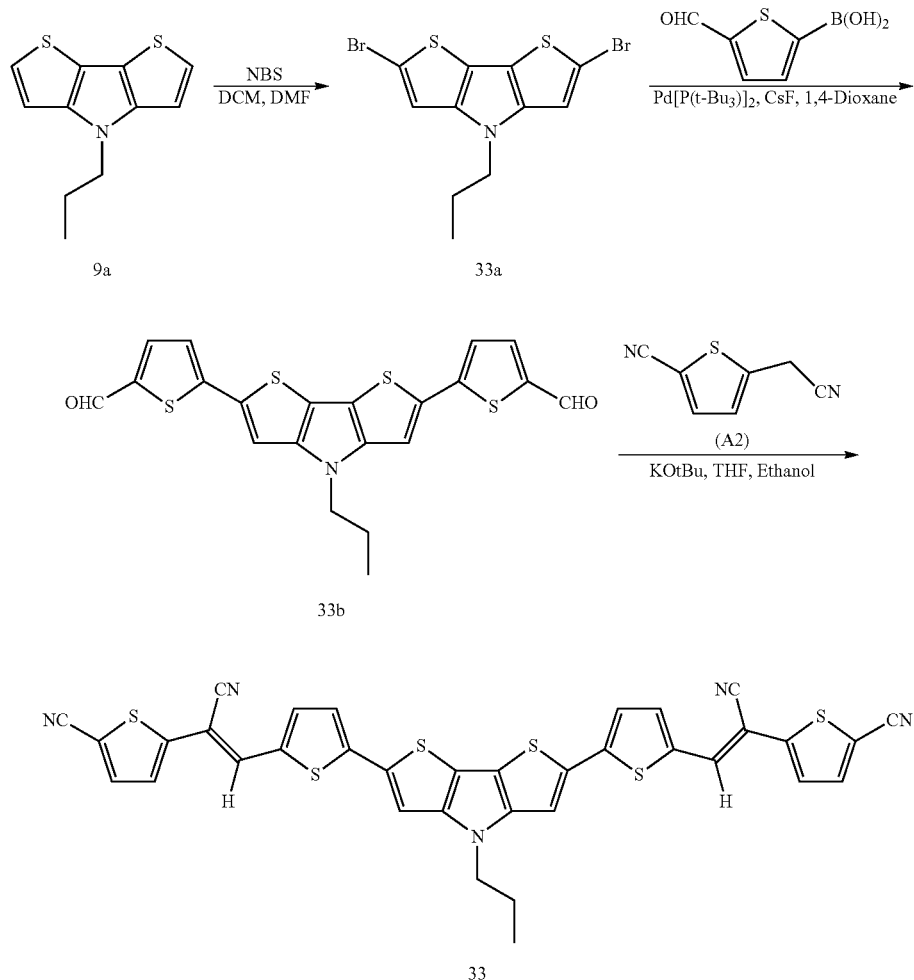

Compound 30 was synthesized in a three step reaction starting from 9a as described below.

Step 1: 9a (1.1 g, 5 mmol) was dissolved in DCM at 0° C. NBS (2.13 g, 12 mmol) was dissolved in DMF (5 mL) and added drop wise to the DCM solution and the resulting reaction mixture was stirred at 22° C. for 17 hours. The reaction mixture was poured to ice-cold water and extracted with DCM. The DCM extract was dried under $Na_2S_2O_4$ and purified by column chromatography to yield the pure compound 33a in 60% yield. $^1$H-NMR ($CDCl_3$, 400 MHz, ppm): δ 7.03 (s, 2H), 4.1 (t, 2H), 1.84 (m, 2H), 0.94 (t, 3H).

Step 2: 33a (0.76 g, 2 mmol), 5-formyl-thiophene-2-carbaldehyde (0.34 g, 2.2 mmol), Pd[P(t-Bu)$_3$]$_2$ (20 mg), and CsF (0.6 g, 4 mmol) were dried under vacuum. Argon purged 1,4-dioxane (10 mL) along with 1 mL of water was added and the resulting reaction mixture was stirred at 90° C. for 7 hours. The reaction mixture was cooled down and poured to icecold water. The solid precipitated was filtered, washed well with more water and methanol to yield 33b in 80% yield. $^1$H-NMR ($C_2D_2Cl_4$, 400 MHz, ppm): δ 9.85 (s, 2H), 7.71 (d, 2H), 7.32 (d, 2H), 7.29 (s, 2H), 4.1 (t, 2H), 1.96 (m, 2H), 0.96 (t, 3H).

Step3: 33b (0.31 g, 0.7 mmol) was condensed with acetonitrile A2 (0.36 g, 2.4 mmol) in a similar way as described earlier to yield compound 33. Yield=67%. UV-vis (THF): $\lambda_{max}$=545 nm; $^1$H-NMR ($C_2D_2Cl_4$, 400 MHz, ppm): δ 7.59 (dd, 4H), 7.46 (s, 2H), 7.32 (d, 6H), 4.2 (t, 2H), 1.84 (m, 2H), 1.08 (t, 3H).

Compound 34:

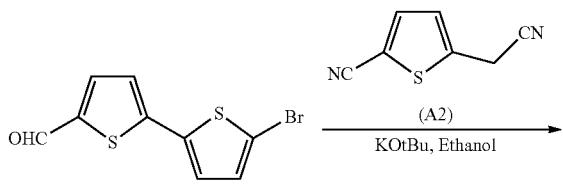

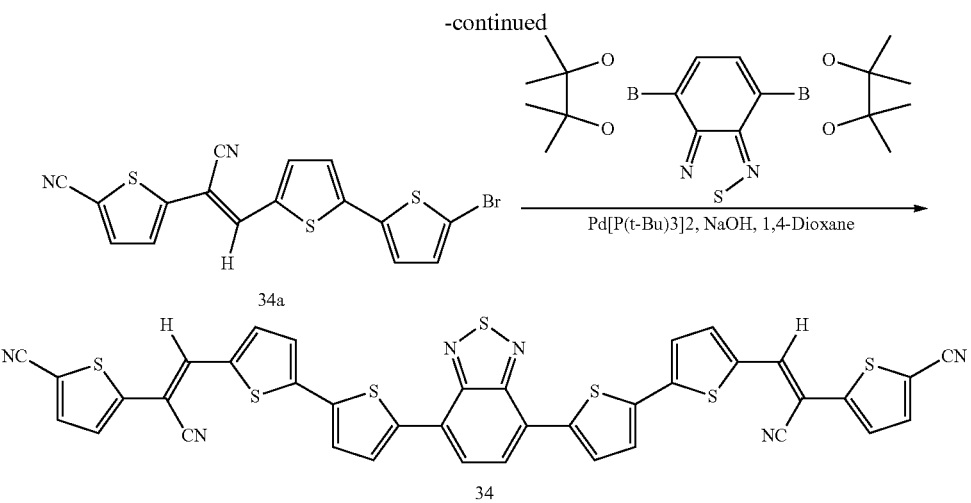

Compound 34 was synthesized via a two-step reaction starting from 5-(5'-bromo-2'-thienyl)thiophene-2-carbaldehyde described as below.

Step1: 5-(5'-bromo-2'-thienyl)thiophene-2-carbaldehyde (1.1 g, 4 mmol) and acetonitrile A2 (0.74 g, 5 mmol) were dissolved in ethanol (20 mL). Potassium tert-butoxide was added (0.22 g, 2 mmol) and stirred at 22° C. for 1 hour. The reaction mixture was filtered and the yellowish solid 34a obtained was washed thoroughly with methanol. Yield=1.2 g (75%). $^1$H-NMR (CDCl$_3$, 400 MHz, ppm): δ 7.63 (d, 2H), 7.53 (d, 1H), 7.51 (s, 1H), 7.30 (d, 1H), 7.18 (d, 1H), 7.14 (d, 1H), 7.08 (d, 1H).

Step2: 34a (0.61 g, 1.5 mmol) prepared as above and 4,7-bis(4,4,5,5-tetramethyl-1,3,2-dioxaborolan-2-yl)-2,1,3-benzothiadiazole (0.27 g, 0.7 mmol) and then Pd[P(t-Bu)$_3$]$_2$ (20 mg, 0.028 mmol) were dried under vacuum. 1,4-Dioxane (25 mL) was added to the solids. Argon purged 1 mL 5N NaOH solution was added and stirred at 22° C. for 3 hours. The reaction mixture was filtered. The solid obtained was washed with methanol and acetonitrile. Yield=0.52 g. The solid was dispersed in dichlorobenzene and heated at 210° C. for 2 hours and filtered. The residue was washed with methanol and hexane and vacuum dried to yield 0.48 g (88%) of the compound 34. UV-vis (THF): λ$_{max}$=550 nm.

Compound 35:

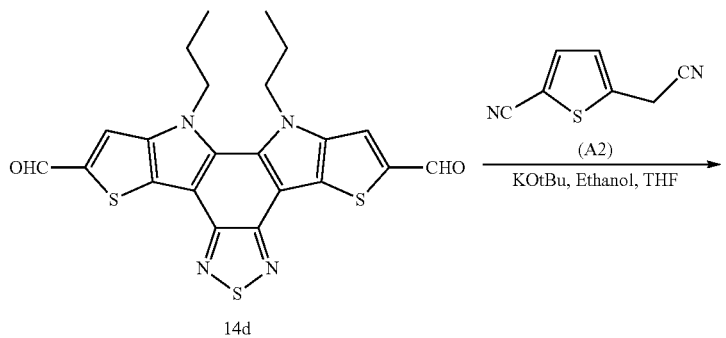

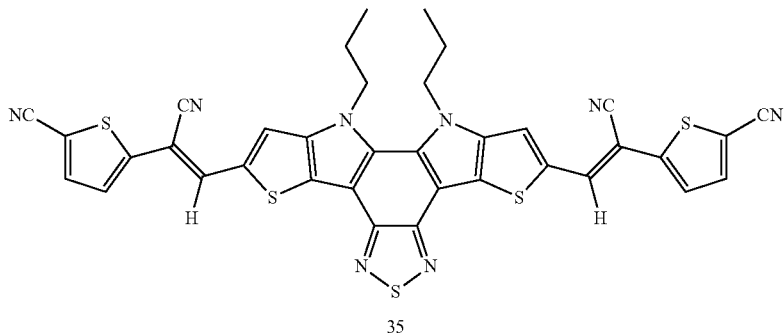

35

Compound 35 was synthesized from compound 14d by condensing it with acetonitrile A2 in the same manner as described for compound 31 in 74% yield. UV-vis (THF): $\lambda_{max}$=565 nm; $^1$H-NMR (C$_2$D$_2$Cl$_4$, 400 MHz, ppm): δ 7.92 (s, 2H), 7.63 (d, 4H), 7.38 (s, 2H), 4.58 (t, 4H), 2.17 (m, 4H), 0.90 (s, 6H).

Compound 36:

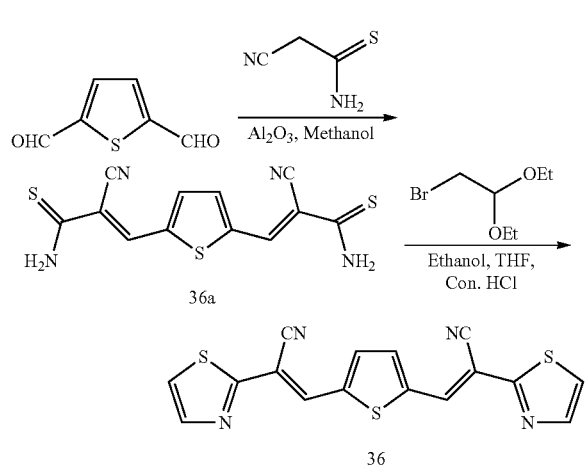

Compound 36 was synthesized in a two-step procedure as described below:

Step 1: To a solution of 2,5-thiophenedicarbaldehyde (1.4 g, 10 mmol), 2-cyanothioacetamide (2 g, 20 mmol) in methanol (50 mL) was added neutral alumina (11.78 g). The resulting suspension was stirred for 65 hours. The reaction mixture was cooled down and diluted with more methanol and the solid precipitated was filtered, washed well with methanol to yield 2.6 g of an orange red solid corresponding to compound 36a. Yield=85%.

Step 2: Compound 36a (0.61 g, 2 mmol) was added to ethanol (50 mL) and THF (25 mL). Bromoacetaldehyde diethylacetate (3.94 g, 20 mmol) was added, followed by conc. HCl (6 mL) and the resulting reaction mixture was stirred at 90° C. for 17 hours. The reaction mixture was cooled down and diluted with additional methanol and the solid precipitated was filtered, washed well with methanol to yield 0.4 g of the desired product 36 in 57% yield. UV-vis (THF): $\lambda_{max}$=449 nm; $^1$H-NMR (CD$_2$Cl$_2$, 400 MHz, ppm): δ 8.25 (s, 2H), 7.90 (d, 2H), 7.83 (s, 2H), 7.51 (d, 2H).

Compound 37:

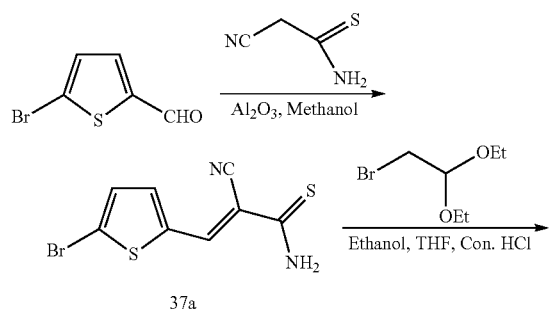

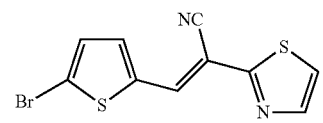

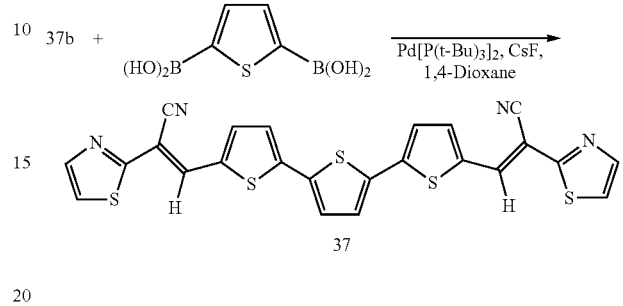

Compound 37 was synthesized in three steps as described below.

Step 1: To a solution of 2-bromothiophene-5-carbaldehyde (1.91 g, 20 mmol) and 2-cyanothioacetamide (2 g, 20 mmol) in 46 mL of methanol was added neutral alumina (11.78 g). The resulting suspension was stirred overnight for 20 hours. The reaction mixture was cooled down and diluted with more methanol and the solid precipitated was filtered, washed well with methanol and dried under vacuum to yield 4.8 g of the compound 37a. Yield=88%.

Step 2: Compound 37a (2.73 g, 10 mmol) was added to ethanol (50 mL) and THF (25 mL). Bromoacetaldehyde diethyl acetate (9.85 g, 50 mmol) was added followed by conc. HCl (10 mL) and the resulting reaction mixture was stirred at 90° C. for 17 hours. The reaction mixture was cooled down and diluted with more methanol and the solid precipitated was filtered, washed well with methanol and dried under vacuum to yield 2.46 g of the yellowish solid (37b). Yield=83%.

Step 3: 0.17 g (1 mmol) of 2,5-thiophenediboronicacid, compound 37b (0.67 g, 2.25 mmol), CsF (0.6 g, 4 mmol) and Pd[P(t-Bu)$_3$]$_2$ (20 mg) were dried under vacuum. Argon purged 1,4-dioxane (15 mL) was added along with 1 mL of water and the resulting reaction mixture was stirred at 90° C. for 17 hours. The reaction mixture was cooled down and diluted with methanol. Solid precipitated was filtered, washed thoroughly with methanol, ethanol and acetonitrile to yield compound 37 in pure form. Yield=0.48 g (93%). UV-vis (THF): $\lambda_{max}$=496 nm; $^1$H-NMR (C$_2$D$_2$Cl$_4$, 400 MHz, ppm): δ 8.22 (s, 2H), 7.91 (d, 2H), 7.70 (d, 2H), 7.45 (dd, 2H), 7.37 (s, 2H), 7.34 (d, 2H).

Compound 38:

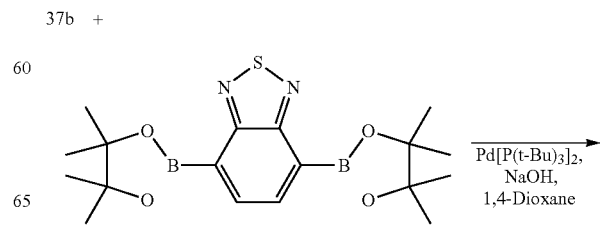

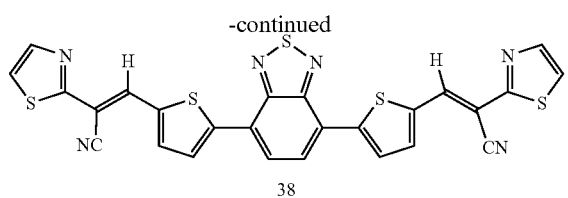

38

Compound 38 was synthesized by the Suzuki coupling reaction of 37b with 4,7-bis(4,4,5,5-tetramethyl-1,3,2-dioxaborolan-2-yl)-2,1,3-benzothiadiazole. In a typical procedure, 37b (0.68 g, 2.3 mmol) and 4,7-bis(4,4,5,5-tetramethyl-1,3,2-dioxaborolan-2-yl)-2,1,3-benzothiadiazole (0.39 g, 1 mmol) and Pd[P(t-Bu)$_3$]$_2$ (20 mg) were dried under vacuum. Argon purged 1,4-dioxane (15 mL) was added followed by the addition of argon purged 1 mL of 5N NaOH solution and the resulting reaction mixture was stirred at 70° C. for 17 hours. The reaction mixture was cooled down and diluted with methanol. Solid precipitated was filtered, washed thoroughly with methanol, ethanol and acetonitrile to give compound 38 as a dark brown solid. Yield=0.42 g (74%). UV-vis (THF): $\lambda_{max}$=520 nm; $^1$H-NMR (CDCl$_3$, 400 MHz, ppm): δ 8.3 (s, 2H), 8.28 (d, 2H), 8.04 (s, 2H), 7.89 (d, 2H), 7.84(d, 2H) 7.44 (d, 2H).

Compound 39:

Step 1: To a solution of 5-bromo-2,2'-bithiophene-5'-carbaldehyde (1.37 g, 5 mmol), 2-cyanothioacetamide (0.5 g, 5 mmol) in methanol (25 mL) was added neutral alumina (2.95 g). The resulting suspension was stirred for 17 hours. The reaction mixture was cooled down and diluted with more methanol and the solid precipitated was filtered, washed well with methanol to yield compound 39a. Yield=1.5 g (84%).

Step 2: Compound 39a (1.42 g, 4 mmol) was added to ethanol (25 mL) and THF (50 mL). Bromoacetaldehyde diethyl acetate (3.94 g, 20 mmol) was added. 5 mL of conc. HCl also added and the resulting reaction mixture was stirred at 90° C. for 17 hours. The reaction mixture was cooled down and diluted with additional methanol and the solid precipitated was filtered, washed well with methanol to yield compound 39b. Yield=1.4 g (92%).

Step 3: Compound 39b (0.87 g, 2.3 mmol), 4,7-bis(4,4,5,5-tetramethyl-1,3,2-dioxaborolan-2-yl)-2,1,3-benzothiadiazole (0.39 g, 1 mmol) and Pd[P(t-Bu)$_3$]$_2$ (20 mg) were dried under vacuum. Argon purged 1,4-dioxane (15 mL) was added. Argon purged 5N NaOH (1 mL) was added and the resulting reaction mixture was stirred at 70° C. for 17 hours. The reaction mixture was cooled down and diluted with methanol. Solid precipitated was filtered, washed thoroughly with methanol, ethanol and acetonitrile to yield compound 39. Yield=0.55 g (75%). UV-vis (THF):

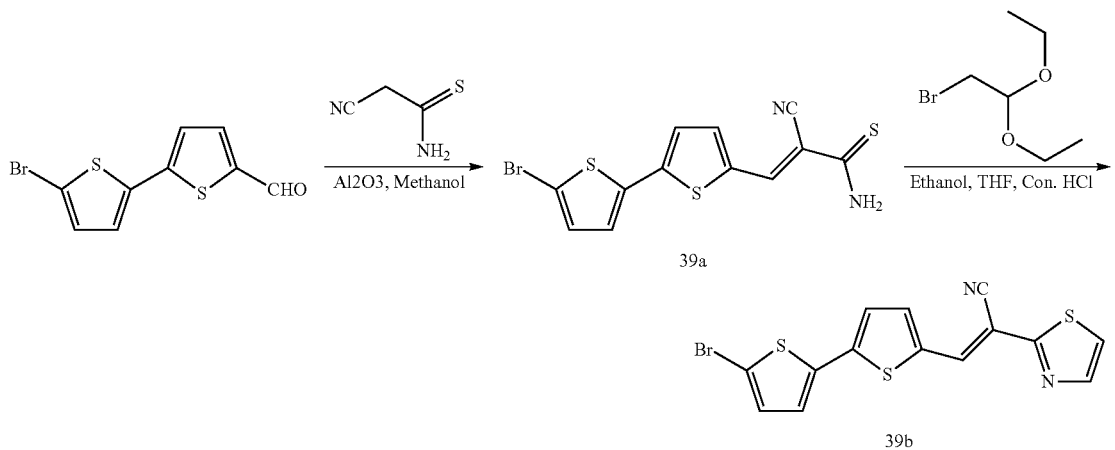

39a

39b

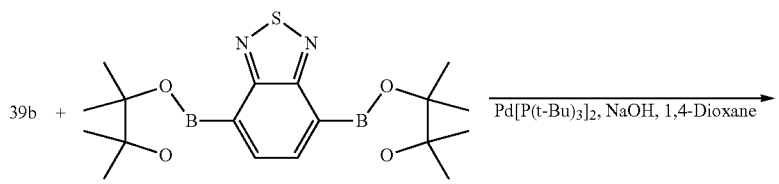

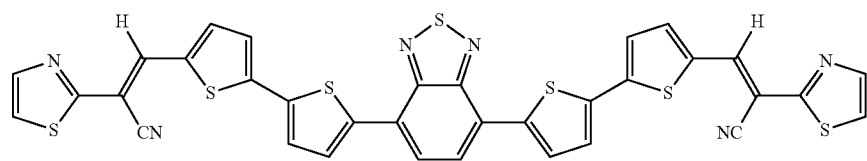

39

$\lambda_{max}$=516 nm; $^1$H-NMR (C$_2$D$_2$Cl$_4$, 400 MHz, ppm): δ 8.24 (s, 2H), 8.16 (d, 2H), 7.97 (s, 2H), 7.91 (d, 2H), 7.72 (d, 2H) 7.51 (d, 2H), 7.54 (d, 2H), 7.42 (d, 2H).

Compound 40:

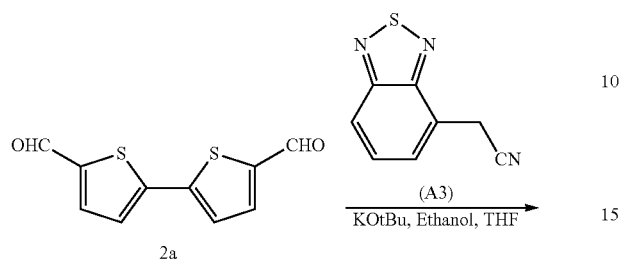

2a

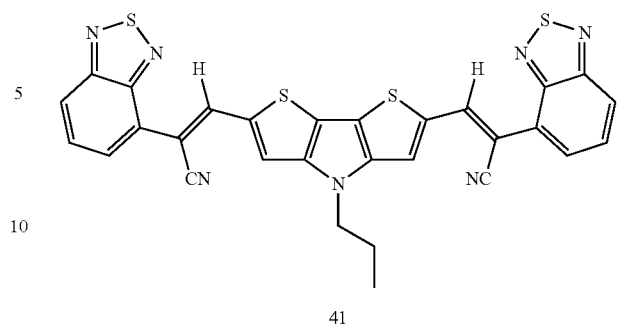

41

Compound 41 was synthesized from 9b and A3 as follows: Compound 9b (0.27 g, 1 mmol) was suspended in ethanol (10 mL) and THF (25 mL) mixture. Compound A3 (0.53 g, 3 mmol) and potassium tert-butoxide (0.34 g, 3 mmol) was added and the resulting reaction mixture was stirred at 50° C. for 20 minutes and later at 90° C. for 2 hours. The reaction mixture was then filtered hot and the solid obtained after filtration was washed with methanol and acetonitrile. Yield=0.46 g. Purification: 0.46 g of the solid was dissolved in boiling dichlorobenzene and allowed to crystallize. Yield=0.42 g (71%). UV-vis (THF): $\lambda_{max}$=519 nm; $^1$H-NMR (C$_2$D$_2$Cl$_4$, 400 MHz, ppm): δ 9.3 (s, 2H), 8.03 (d, 4H), 7.86 (s, 2H), 7.73 (d, 2H), 4.33 (t, 2H), 2.08 (m, 2H), 1.09 (t, 3H).

Compound 42:

40

Compound 2a (0.11 g, 0.5 mmol) and acetonitrile A3 (0.26 g, 1.5 mmol) were dissolved in anhydrous ethanol (5 mL) and THF (5 mL) mixture. Potassium tert-butoxide (0.17 g, 1.5 mmol) was added and stirred at 22° C. for 20 minutes and heated to 60° C. for 1 hour. The reaction mixture was cooled down and filtered. The brownish red solid obtained was washed thoroughly with hot methanol and acetonitrile to yield compound 40. Yield=0.2 g (75%). UV-vis (THF): $\lambda_{max}$=474 nm; $^1$H-NMR (C$_2$D$_2$Cl$_4$, 400 MHz, ppm): δ 9.28 (s, 2H), 8.05 (dd, 4H), 7.82 (d, 2H), 7.74 (t, 2H), 7.48 (d, 2H).

Compound 41:

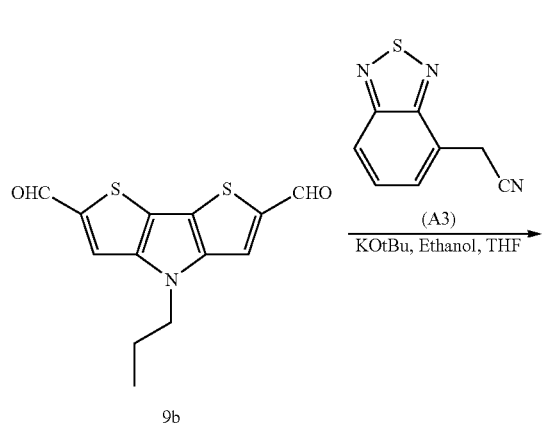

9b

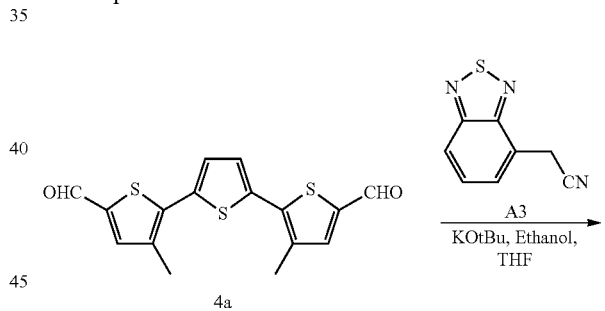

42

Compound 42 was synthesized from compound 4a and 40c using a similar procedure as adopted for compound 40 to yield compound 42 which was further purified by recrystallization from hot 1,2-dichlorobenzene (Yield=70%). UV-vis (THF): $\lambda_{max}$=478 nm; $^1$H-NMR (C$_2$D$_2$Cl$_4$, 400 MHz, ppm): δ 9.25 (s, 2H), 8.0 (dd, 4H), 7.72 (t, 2H), 7.61 (s, 2H), 7.38 (s, 2H), 2.54 (s, 6H).

Compound 43:

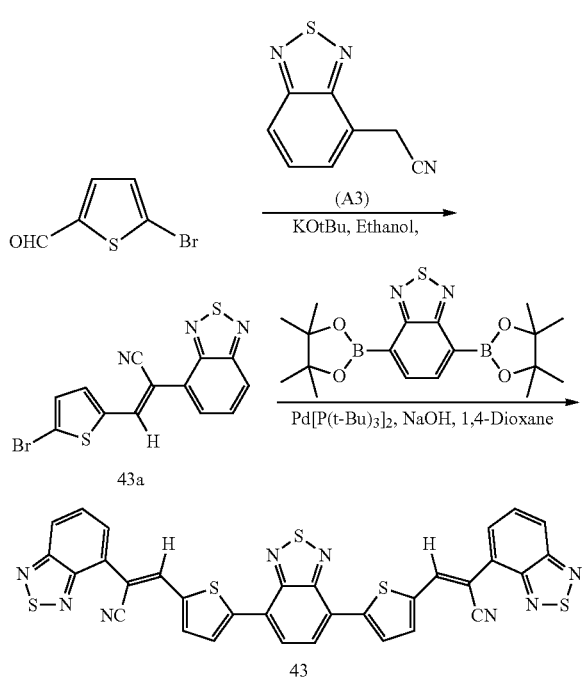

Compound 43 was synthesized via a two-step reaction as described below.

Step 1: Acetonitrile A3 (0.88 g, 5 mmol) and 5-bromo-thiophenecarbaldehyde (0.76 g, 4 mmol) was suspended in ethanol. Potassium tert-butoxide (0.45 g, 4 mmol) was added and stirred at 22° C. for 2 hours. The reaction mixture was filtered and the yellowish solid obtained (43a) was washed well with methanol. Yield=1.01 g (72%).

Step 2: 4,7-bis(4,4,5,5-tetramethyl-1,3,2-dioxaborolan-2-yl)-2,1,3-benzothiadiazole (0.31 g, 0.8 mmol), 43a (0.83 g, 2.4 mmol) and Pd[P(t-Bu)$_3$]$_2$ (30 mg) were dried under vacuum. 1,4-Dioxane (25 mL) was added followed by the addition of argon purged NaOH solution (1 mL) and the resulting reaction mixture was stirred initially at 60° C. and later at 85° C. for 5 hours. The reaction mixture was filtered hot. The solid obtained after filtration was washed with methanol and acetonitrile. Yield=0.43 g. Purification: 0.43 g of the solid was dissolved in boiling dichlorobenzene and allowed to crystallize. Yield=0.41 g (76%). UV-vis (THF): $\lambda_{max}$=507 nm; $^1$H-NMR (C$_2$D$_2$Cl$_4$, 400 MHz, ppm): δ 9.39 (s, 2H), 8.29 (d, 2H), 8.03-7.96 (m, 6H), 7.74 (d, 2H), 7.36 (d, 2H).

Compound 44:

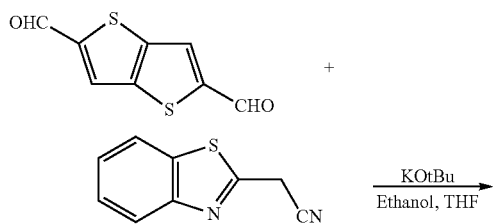

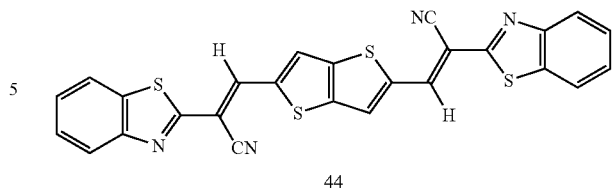

Potassium tert-butoxide (0.17 g, 1.5 mmol) was dissolved in anhydrous ethanol (10 mL). Benzothiazole-2-acetonitrile (0.7 g, 4 mmol) was added and stirred for 20 minutes. Thieno[3,2-b]thiophene-2,5-dicarbaldehyde (0.3 g, 1.5 mmol) was dissolved in 30 mL of THF and added to the ethanolic solution and stirred at 22° C. for 30 minutes and then refluxed for 6 hours. The reaction mixture was cooled down and filtered. The solid obtained was washed with methanol and water. The solid was then washed with acetone and ethanol. The solid was finally refluxed in acetonitrile (100 mL) for 5 hours to remove any excess benzothiazole-2-acetonitrile and filtered hot. The solid obtained was again washed with ethanol to yield the title compound 44, 0.55 g (72%). MALDI-TOF Ms.: 501.13 (without matrix); UV-vis (THF): $\lambda_{max}$=483 nm. $^1$H-NMR (C$_2$D$_2$Cl$_4$, 400 MHz, ppm): δ 8.43 (s, 2H), 8.13-7.98 (m, 6H), 7.60 (d, 2H), 7.49 (d, 2H).

Compound 45:

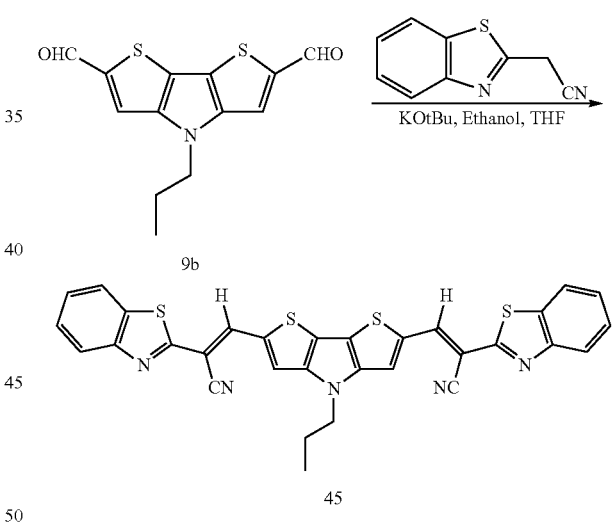

Compound 45 was synthesized by condensing compound 9b with compound benzothiazole-2-acetonitrile as follows. Compound 20b (0.22 g, 0.8 mmol) was suspended in ethanol (10 mL) and THF (20 mL) mixture. Benzothiadiazole-2-acetonitrile (0.56 g, 3.2 mmol) was added. Potassium tert-butoxide (0.18 g, 1.6 mmol) was added and the resulting reaction mixture was stirred at 50° C. for 20 minutes and later heated at 90° C. for 2 hours. The reaction mixture was filtered hot. The solid obtained after filtration was washed with methanol and acetonitrile. Yield=0.38 g. Purification: 0.38 g of the solid was dissolved in boiling chlorobenzene and allowed to crystallize. Yield=0.33 g (70%). UV-vis (THF): $\lambda_{max}$=565 nm; $^1$H-NMR (C$_2$D$_2$Cl$_4$, 400 MHz, ppm): δ 8.29 (s, 2H), 8.08 (d, 2H), 7.93 (d, 2H), 7.76 (s, 2H), 7.55 (t, 2H), 7.44 (t, 2H), 4.27 (t, 2H), 1.98 (m, 2H), 0.98 (s, 3H).

Compound 46:

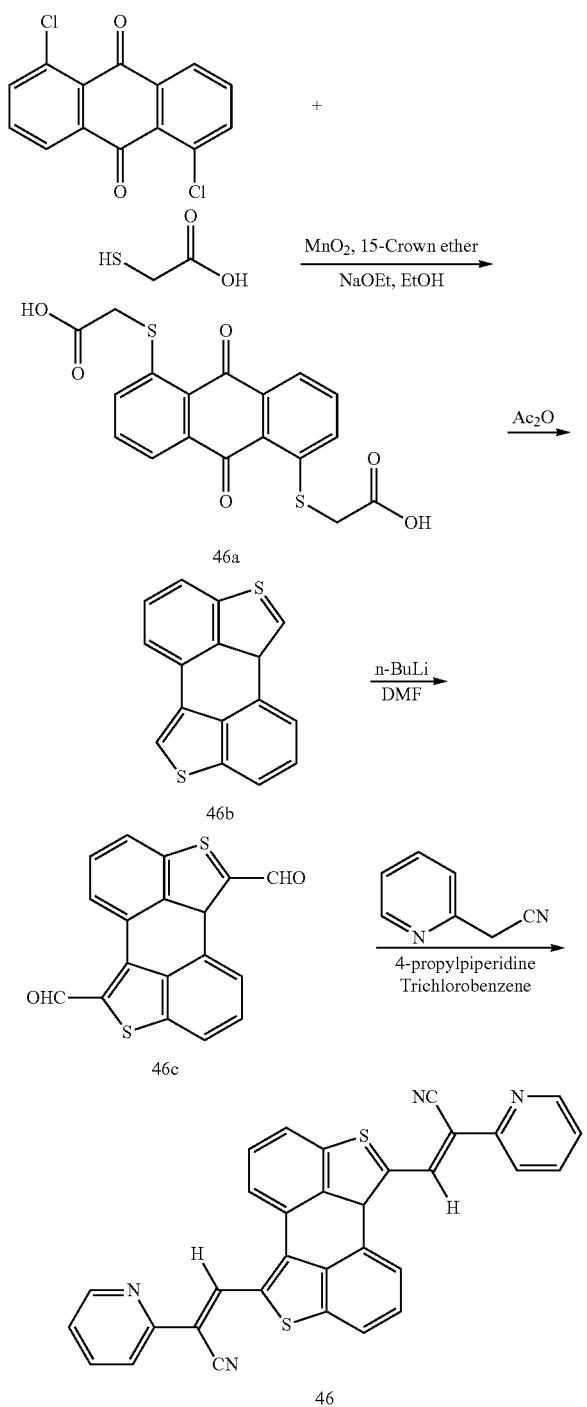

collected by filtration, and then washed with water. It was dried in vacuo to give 46a as a yellow powder. Yield=9.12 g (59%).

Step 2: 46a (2.00 g, 5.1 mmol) was added in acetic anhydride (67 mL), and then the suspension was refluxed for 3 hours. The solid was collected by filtration without cooling it. Then, it was washed with n-pentane to give 46b as a yellow solid. Yield=693 mg (52%).

Step 3: 46b (1.06 g, 4.0 mmol) was dissolved in THF (12 mL), and the suspension was cooled at −10° C. n-BuLi (6.0 mL, 9.6 mmol) was added dropwise to the suspension for 5 min, and then the mixture was stirred at −10° C. for 1 hour. To the reaction mixture was added DMF (0.88 g, 12.0 mmol), and then the reaction mixture was stirred at −10° C. for 2.5 hours. The reaction mixture was poured into ice-water, and the solid was collected by filtration, and washed with n-pentane. It was washed with hot toluene to give 46c as a red solid. Yield=356 mg (34%).

Step 4: 46c (320 mg, 1.0 mmol) was dissolved in 1,2,4-trichlorobenzene (125 mL) at 150° C. To this solution were added 2-pyridylacetonitrile (350 mg, 3.0 mmol) and 4-propylpiperidine (6.5 mg, 0.05 mmol), and then the mixture was stirred at 150° C. for 16 h. After half of trichlorobenzene was removed by distillation, 2-pyridylacetonitrile (350 mg, 3.0 mmol) and 4-propylpiperidine (6.5 mg, 0.05 mmol) were added there, and then the reaction mixture was stirred at 150° C. for 16 hours again. After the reaction mixture was cooled at 22° C., the solid was collected by filtration, and washed with hot toluene to give 46 as a dark red solid. Yield=109 mg (21%), MALDI-TOF Ms.: 520.08 (with matrix); UV-vis (THF): $\lambda_{max}$=562 nm.

Compound 47:

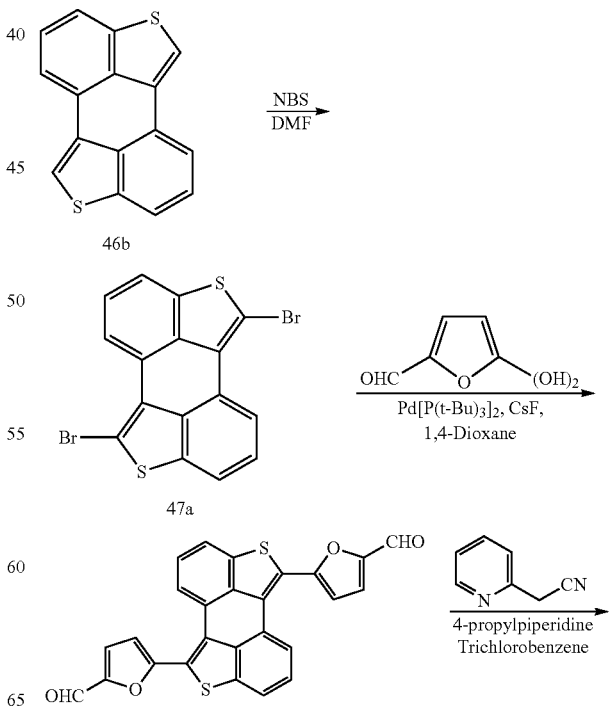

Step 1: In a solution of 1,5-dichloroanthraquinone (12.12 g, 42 mmol) in a solution of 21% sodium ethoxide in ethanol (100 mL) was added gradually mercaptoacetic acid (9.12 g, 94 mmol) at 22° C. Mangane oxide (2.27 mg, 23 mmol) and 15-crown-5 ether (204 mg, 0.9 mmol) were added there, and then the mixture was stirred at 70° C. for 14 hours. after the reaction mixture was cooled at 22° C., it was gradually poured into 800 mL of water while it was stirred. Then it was acidified with 2N hydrochloric acid. The formed solid was

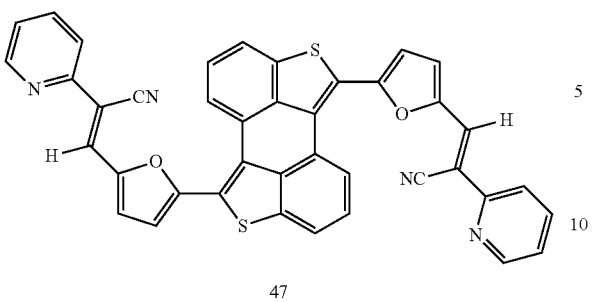

47

Step 1: To a solution of 46b (2.12 g, 8 mmol) in DMF (130 mL) was added dropwise a solution of N-bromonosuccinimide (3.59 g, 20 mmol) in DMF (24 mL). The mixture was stirred at 80° C. for 1 hour. The formed solid was collected by filtration, and then washed with acetone. It was dried over in vacuo at 40° C. overnight to give 47a as a yellow solid. Yield=89%.

Step 2: To a solution of 47a (2.4 g, 5.71 mmol) in 1,4-dioxane (95 mL) were added 5-fromylfurane-2-boronic acid (1.8 g, 12.5 mmol), caesium fluoride (3.8 g, 27.4 mmol), bis(tri-tert-butylphosphine)palladium (57 mg, 0.114 mmol), and water (2.4 mL). The mixture was refluxed for 42 hours. After the reaction mixture was cooled at 22° C., it was poured into ice-water. The formed solid was collected by filtration, and then washed with water, methanol, ethanol, and n-hexane. Then, it was washed with hot toluene. It was dried over in vacuo to give 47b as a brown solid. Yield=51%.

Step 3: 47b (452 mg, 1 mmol) was dissolved in 1,2,4-trichlorobenzene (110 mL) at 150° C. To this solution were added pyridine-2-acetonitrile (354 mg, 3 mmol) and 4-n-propylpiperidine (6.4 mg, 0.05 mmol) at 150° C., and then the mixture was stirred at that temperature for 24 hours. The formed solid was collected by filtration, and then washed with dichloromethane. It was washed with hot toluene to give 47 as a dark purple powder. Yield=81%, MALDI-TOF Ms.: 652.24 (with matrix); UV-vis (THF): $\lambda_{max}$=530 nm.

Compound 48:

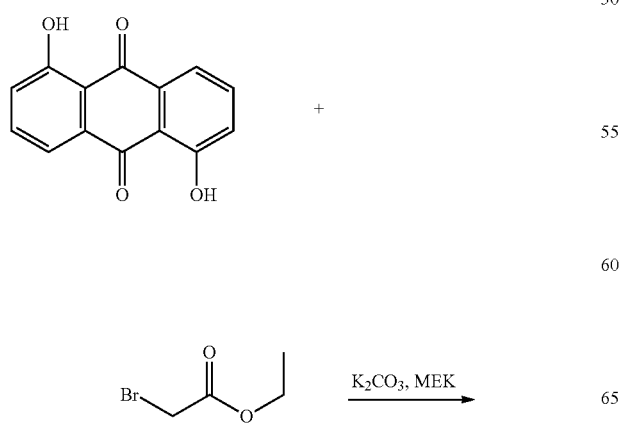

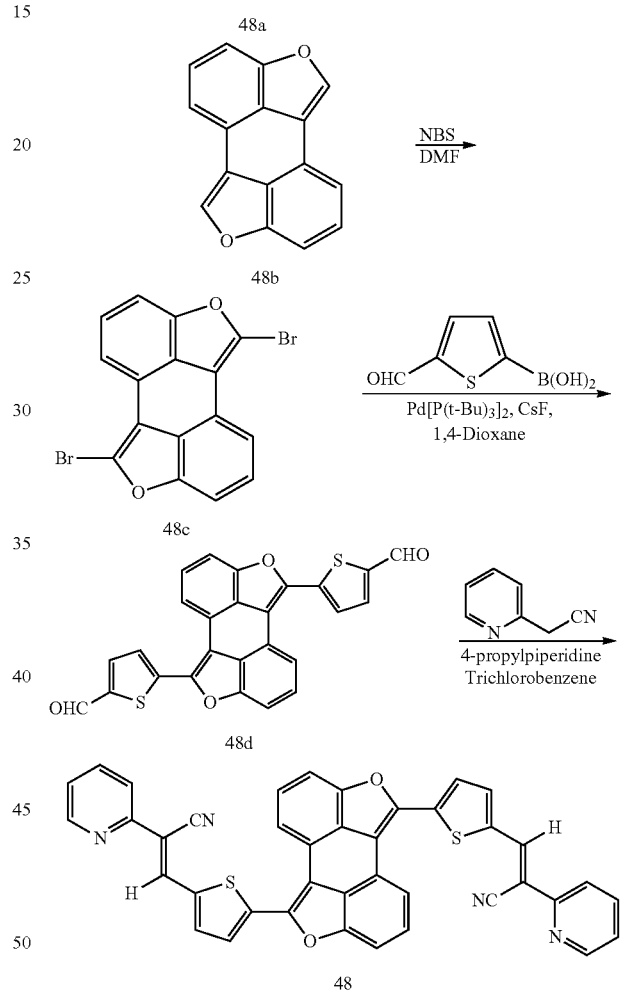

Step 1: To a solution of 1,5-dihydroxyanthraquinone (24.0 g, 100 mmol) in methylethylketone (240 mL) were added potassium carbonate (55.3 g, 600 mmol) and ethylbromoacetate (80.0 g, 540 mmol). The mixture was stirred at 100° C. for 5 hours. After the reaction mixture was cooled at 0° C., 1M hydrochloric acid (700 mL) was added gradually there. The formed solid was collected by filtration, and then washed with water and methanol. The solid was dried over in vacuo to give 48a as a pale yellow solid. Yield=34 g (83%).

Step 2: To a suspension of potassium hydroxide (5.4 g, 84.85 mmol) in 1,4-dioxane (500 mL) was added 48a (5.0 g, 12.12 mmol) at 22° C. This mixture was stirred at 22° C. for 2 days, and then at 60° C. for 1 hour. After the reaction mixture was cooled at 22° C., the solid was collected by filtration, and then it was washed with hot water (250 mL). After the solid was collected by filtration, it was dissolved in dichloromethane, and then the solution was passed through a column chromatography eluting with dichloromethane to give 48b as a yellow solid. Yield=0.93 g (33%).

Step 3: 48b (700 mg, 3 mmol) was dissolved in DMF (45 mL) at 130° C. After the solution was cooled at 60° C., N-bromosuccinimide (1.347 g, 7.5 mmol) was added there. The mixture was stirred at 80° C. overnight. The formed solid was collected by filtration, and washed with 1M hydrochloric acid (200 mL), water (500 mL), and dichloromethane (20 mL). Then it was collected by filtration. The solid was washed with hot dichloromethane to give 48c as a yellow solid. Yield=500 mg (43%).

Step 4: 48c (550 mg, 1.4 mmol), 5-(4,4,5,5-tetramethyl-1,3,2-dioxaborolan-2-yl)-2-thiophenecarboxaldehyde (733 mg, 3.08 mol), caesium fluoride (1.02 g, 6.72 mmol), and bis(tri-tert-butylphosphine)palladium (14 mg, 0.028 mmol) were added to 1,4-dioxane (20 mL). Then, after addition of water (0.6 mL), the mixture was refluxed for 24 hours. After the reaction mixture was poured into water, the solid was collected by filtration, and then washed with ethanol, methanol, and dichloromethane. Then it was washed with hot toluene to give 48d as a brown solid. Yield=0.33 g (52%).

Step 5: 48d (300 mg, 0.66 mmol) was dissolved in 1,2,4-trichlorobenzene (20 mL) at 150° C. To this solution, pyridineacetonitrile (236 mg, 2.00 mmol) and 4-propylpiperidine (4.2 mg, 33 µmol), and then the mixture was stirred at 150° C. overnight. After the reaction mixture was cooled at 22° C., the solid was collected by filtration, and washed with 1,2,4-trichlorobenzene and toluene to give 48 as a dark brown solid. Yield=432 mg (66%). MALDI-TOF Ms.: 652.09 (with matrix); UV-vis (DMSO): $\lambda_{max}$=614 nm.

Compound 49:

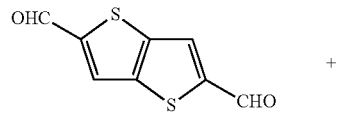

+

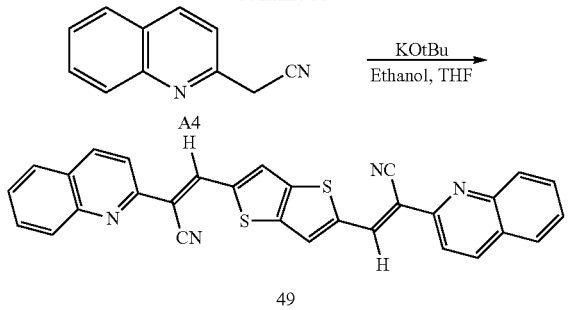

Compound 49 was synthesized from thieno[3.2b]thiophenedicarboxaldehyde as follows:

Potassium tert-butoxide (0.17 g, 1.5 mmol) was dissolved in anhydrous ethanol (20 mL). Acetonitrile (A4) (0.504 g, 3 mmol) was added and stirred for 20 minutes. Thieno[3.2b]thiophenedicarboxaldehyde (0.3 g, 1.5 mmol) was dissolved in 30 mL of THF and added to the ethanolic solution and stirred at 22° C. for 30 minutes and then refluxed for 6 hours. The reaction mixture was cooled down and filtered. The solid filtered off was washed with methanol and water. The solid was washed with acetone and ethanol. The solid was refluxed in acetonitrile (100 mL) for 5 hours and filtered hot. The solid obtained was again washed with ethanol to yield the pure compound 0.56 g (75%).

UV-vis (THF): $\lambda_{max}$=463 nm; $^1$H-NMR (DMSO, 400 MHz, ppm): δ 8.83 (s, 2H), 8.47 (d, 2H), 8.31 (s, 2H), 8.06 (d, 2H), 7.99 (t, 4H), 7.79 (d, 2H), 7.63 (d, 2H).

Compound 50:

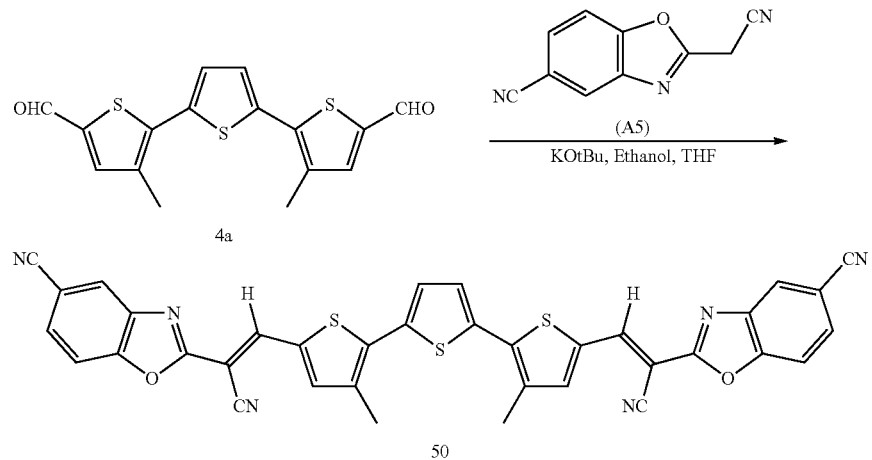

Compound 4a (0.3 g, 0.9 mmol) was suspended in ethanol (10 mL) and THF (25 mL) mixture. Acetonitrile A5 (0.49 g, 2.7 mmol) and potassium tert butoxide (0.3 g, 2.7 mmol) was added and the resulting reaction mixture was stirred at 50° C. for 20 minutes and later heated at 70° C. for 2 hours. The reaction mixture was cooled down and diluted with methanol. The solid obtained after filtration was washed with methanol and acetonitrile and recrystallized from boiling 1,2-Dichlorobenzene to yield the title compound 50, 0.36 g (64%).

UV-vis (THF): $\lambda_{max}$=497 nm; $^1$H-NMR ($C_2D_2Cl_4$, 400 MHz, ppm): δ 8.36 (s, 2H), 8.11 (s, 2H), 7.74-7.71 (m, 6H), 7.46 (s, 2H), 2.59 (s, 6H).

Compound 51:

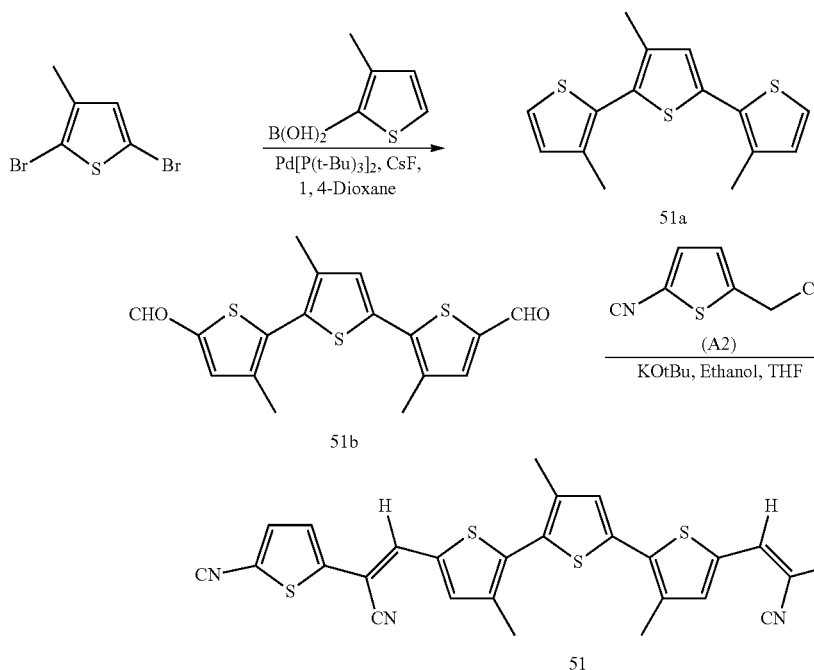

Compound 51 was synthesized in a three step procedure starting from 2,5-dibromo-3-methylthiophene as described below.

Step 1: 2,5-dibromo-3-methylthiophene (1.04 g, 4 mmol) and 3-methylthiophene-2-boronic acid (1.25 g, 8.8 mmol) were dissolved in 1,4-dioxane (20 mL) and water (1.7 mL) under an argon atmosphere. To this solution was added caesium fluoride (2.43 g, 16 mmol) and the solution was degassed using argon for 20 minutes. After degassing bis (tri-tert-butylphosphine)palladium (41 mg, 0.08 mmol) was added and the reaction mixture was refluxed overnight under an argon atmosphere. Finally, the reaction mixture was cooled to 22° C. and poured into water and the organic phase obtained was extracted with dichloromethane, dried and solvent removed to yield the crude product 51a. The crude product was purified by flash column chromatography using cyclohexane to yield 329 mg of pure 51a. Yield=28%. $^1$H-NMR (CD$_2$Cl$_2$, 400 MHz, ppm): δ 7.30 (d, 1H), 7.16 (d, 1H), 6.99 (s, 1H), 6.96 (d, 1H), 6.90 (d, 1H), 2.40 (s, 3H), 2.21 (s, 3H), 2.17 (s, 3H).

Step 2: 51a (480 mg, 1.65 mmol) was dissolved in DMF (11.4 mL) and cooled in an ice bath and POCl$_3$ (3.72 mL) was added slowly to this cold solution. After addition, the resulting reaction mixture was stirred at 80° C. for 3 hours and then at 22° C. overnight. Finally, the reaction mixture was poured into water and the organic phase was extracted with dichloromethane, dried and solvent removed to yield the dialdehyde 51b (490 mg, 86%). $^1$H-NMR (CD$_2$Cl$_2$, 400 MHz, ppm): δ 9.86 (s, 1H), 9.81 (s, 1H), 7.64 (s, 1H), 7.58 (s, 1H), 7.22 (s, 1H), 2.47(s, 3H), 2.30(s, 3H), 2.27(s, 3H).

Step 3: Dialdehyde 51b (0.3 g, 0.87 mmol) was suspended in ethanol (10 mL) and THF (50 mL) mixture. Acetonitrile A2 (0.39 g, 2.6 mmol) and potassium tert butoxide (0.2 g, 1.73 mmol) was added and the resulting mixture was stirred at 22° C. for 2 hours. The solid obtained was filtered, washed with methanol, dried and then recrystallized from chlorobenzene to yield the title compound 51, 0.24 g (45%). The compound was further purified by zone sublimation, yield 32%. MALDI-TOF Ms.: 606.015 (with matrix); UV-vis (THF): $\lambda_{max}$=459 nm. $^1$H-NMR (C$_2$D$_2$Cl$_4$, 80° C., 400 MHz, ppm): δ 7.50-7.55 (m, 3H), 7.43 (s, 2H), 7.40 (s, 1H), 7.22-7.30 (t, 2H), 7.17 (s, 1H), 2.44 (s, 3H), 2.28 (bd, 6H).

Preparation Examples for Devices with Compound of Formulae I

Materials:

Materials used for device fabrication were either used as such or after purifying them using a gradient sublimation system.

Substrate Preparation

Glass substrates were used as-received from Geomatec. ITO as transparent electrode has a thickness of 90 nm. The specific resistivity was 15 Ohm/cm. The root-mean-square roughness (RMS) was less than 2 nm.

Before deposition of organic layers, the substrate was ozone treated under UV light for 15 minutes (UV-ozone cleaning).

Cell Fabrication

Two types of cells (bilayer (BL) and bulk heterojunction (BHJ)) were fabricated in a high vacuum system (pressure <10$^{-6}$ mbar).

The BL cells (ITO/n-C$_{60}$/C$_{60}$/Compound of formula (I)/BPAPF/p-BPAPF/NDP-9/Al and ITO/MoO$_3$/Compound of formula (I)/C$_{60}$/Bphen/Ag) were built with the inventive compound and C$_{60}$ evaporated in turns on the ITO substrate. The deposition rate for both layers was 0.2 nm/second. C$_{60}$ was evaporated at 430° C., the inventive compounds between 200° C. and 350° C. Before and after, the (doped) ETL and HTL layers were applied by vapor deposition. Finally, an Al or Ag layer is applied by vapor deposition as a top electrode. The cells had an area of 0.04 cm$^2$ or 0.275 cm$^2$.

The BHJ cells (ITO/n-$C_{60}$/$C_{60}$/Compound of formula (I):$C_{60}$/BPAPF/p-BPAPF/NDP-9/Al and ITO/$MoO_3$/Compound of formula (I):$C_{60}$/$C_{60}$/Bphen/Ag and ITO/n-$C_{60}$/$C_{60}$/Compound of formula (I):$C_{60}$/BPAPF/p-BPAPF/NDP-9/Ag) were produced by coevaporation of the inventive compounds with $C_{60}$ at same rates of 0.1 nm/second onto the ITO substrate to have 1:1 weight ratio of the inventive compound and $C_{60}$ mixed layer. In some cells the weight ratio was 1:1.5 with a rate of 0.1 nm/second for the inventive compound and of 0.15 nm/second for $C_{60}$. ETL, HTL and top contacts are the same as in the bilayer cell.

Measurement

The solar simulators used were an AM 1.5 Simulator from L.O.T. Oriel with a 300 W (model LSH201) or 500 W xenon lamp (model LS0911). The current-voltage-characteristics were measured under ambient conditions with a Keithley 2400 series. The intensity of the solar simulator was calibrated with a monocrystalline solar cell (Fraunhofer ISE) and the deviation factor was determined to be approximately 1.

Device Result

A summary of the performance of the bilayer and bulk heterojunction solar cells which are containing the Compounds with terminal heteroarylcyanovinylene groups as donors is shown in the following tables. The results are containing short circuit current ($I_{SC}$), open circuit voltage ($V_{OC}$), fill factor (FF) and the power conversion efficiency ($\eta$). All compounds which were used in devices were measured with a light intensity of 100 mW/$cm^2$.

TABLE 1

| Entry | Compound | Cell Structure | Cell Type (BL/BHJ) | $V_{OC}$ (mV) | $J_{SC}$ (mA/$cm^2$) | FF | $\eta$ (%) |
|---|---|---|---|---|---|---|---|
| 1 | 1 | a | BL | 1040 | 0.89 | 53.0 | 0.49 |
| 2 | 1 | b | BHJ | 980 | 2.68 | 43.0 | 1.13 |
| 3 | 2 | a | BL | 820 | 2.38 | 66.0 | 1.29 |
| 4 | 2 | b | BHJ | 900 | 4.46 | 49.0 | 1.96 |
| 5 | 2 | $b^1$ | BHJ | 820 | 2.45 | 47.0 | 0.94 |
| 6 | 3 | a | BL | 860 | 3.3 | 59 | 1.70 |
| 7 | 4 | a | BL | 800 | 3.1 | 53 | 1.38 |
| 8 | 4 | b | BHJ | 900 | 5.46 | 48 | 2.36 |
| 9 | 6 | c | BL | 520 | 1.45 | 49.3 | 0.37 |
| 10 | 6 | d | BHJ | 940 | 2.09 | 43.5 | 0.85 |
| 11 | 7 | c | BL | 540 | 2.91 | 54.8 | 0.83 |
| 12 | 7 | d | BHJ | 960 | 3.75 | 41.9 | 1.51 |
| 13 | 8 | e | BHJ | 600 | 0.86 | 46.4 | 0.86 |
| 14 | 9 | a | BL | 800 | 3.6 | 30 | 0.90 |
| 15 | 9 | $b^2$ | BHJ | 800 | 6.0 | 50 | 2.40 |
| 16 | 10 | e | BHJ | 480 | 2.78 | 35.9 | 0.46 |
| 17 | 11 | $e^1$ | BHJ | 940 | 2.99 | 51.5 | 1.45 |
| 18 | 12 | b | BHJ | 840 | 8.01 | 48.0 | 3.26 |
| 19 | 12 | $b^3$ | BHJ | 840 | 7.64 | 49.0 | 3.18 |
| 20 | 13 | e | BHJ | 680 | 0.84 | 36.5 | 0.21 |
| 21 | 14 | b | BHJ | 640 | 3.5 | 26 | 0.60 |
| 22 | 15 | a | BL | 680 | 2.92 | 58.0 | 1.16 |
| 23 | 15 | b | BHJ | 800 | 0.14 | 29.0 | 0.03 |
| 24 | 19 | b | BHJ | 760 | 1.93 | 45.8 | 0.67 |
| 25 | 23 | a | BL | 860 | 2.2 | 53 | 1.00 |
| 26 | 23 | b | BHJ | 840 | 2.8 | 63 | 1.48 |
| 27 | 24 | a | BL | 820 | 2.17 | 63 | 1.11 |
| 28 | 24 | $b^2$ | BHJ | 860 | 3.97 | 52 | 1.78 |
| 29 | 25 | $b^2$ | BHJ | 700 | 1.13 | 46 | 0.36 |
| 30 | 26 | $b^2$ | BHJ | 960 | 3.52 | 44 | 1.48 |
| 31 | 27 | a | BL | 820 | 2.05 | 61 | 1.03 |
| 32 | 27 | $b^2$ | BHJ | 960 | 4.32 | 42 | 1.72 |
| 33 | 28 | a | BL | 940 | 1.21 | 32 | 0.36 |
| 34 | 28 | $b^4$ | BHJ | 820 | 1.66 | 56 | 0.76 |
| 35 | 29 | a | BL | 940 | 3.0 | 37 | 1.03 |
| 36 | 29 | $b^2$ | BHJ | 940 | 6.49 | 50 | 3.03 |
| 37 | 30 | $b^2$ | BHJ | 820 | 6.18 | 47 | 2.40 |
| 38 | 31 | a | BL | 780 | 4.19 | 63 | 2.06 |
| 39 | 31 | b | BHJ | 840 | 8.46 | 49 | 3.46 |
| 40 | 32 | a | BL | 980 | 3.25 | 21 | 0.67 |
| 41 | 32 | $b^2$ | BHJ | 860 | 2.45 | 31 | 0.65 |
| 42 | 33 | $b^2$ | BHJ | 660 | 3.95 | 30 | 0.78 |
| 43 | 34 | a | BL | 860 | 3.1 | 52 | 1.40 |
| 44 | 34 | $b^2$ | BHJ | 880 | 6.4 | 40 | 2.25 |
| 45 | 35 | a | BL | 640 | 2.6 | 35 | 0.60 |
| 46 | 35 | $b^2$ | BHJ | 620 | 1.32 | 27 | 0.22 |
| 47 | 37 | a | BL | 900 | 1.50 | 39 | 0.53 |
| 48 | 37 | b | BHJ | 880 | 2.32 | 36 | 0.74 |
| 49 | 38 | a | BL | 980 | 2.90 | 39.0 | 1.10 |
| 50 | 38 | $b^2$ | BHJ | 960 | 3.46 | 43.0 | 1.44 |
| 51 | 39 | b | BHJ | 820 | 3.3 | 55 | 1.50 |
| 52 | 41 | a | BL | 900 | 3.79 | 41 | 1.40 |
| 53 | 41 | $b^2$ | BHJ | 860 | 5.02 | 25 | 1.07 |
| 54 | 42 | a | BL | 820 | 2.56 | 39 | 0.83 |
| 55 | 42 | $b^2$ | BHJ | 920 | 5.24 | 45 | 2.15 |
| 56 | 43 | a | BL | 960 | 2.91 | 41 | 1.14 |
| 57 | 43 | $b^2$ | BHJ | 1020 | 5.58 | 40 | 2.26 |
| 58 | 44 | d | BHJ | 940 | 1.50 | 36.8 | 0.52 |
| 59 | 44 | e | BHJ | 940 | 2.02 | 50.7 | 0.96 |
| 60 | 45 | a | BL | 740 | 2.38 | 21 | 0.38 |
| 61 | 45 | $b^2$ | BHJ | 940 | 3.97 | 24 | 0.89 |
| 62 | 47 | a | BL | 880 | 2.30 | 44.0 | 0.90 |
| 63 | 47 | b | BHJ | 600 | 0.66 | 39.0 | 0.15 |
| 64 | 51 | a | BL | 980 | 3.52 | 63.0 | 2.19 |
| 65 | 51 | $b^2$ | BHJ | 920 | 8.05 | 56.0 | 4.16 | a = ITO/n-$C_{60}$/$C_{60}$/Compound of formula (I)/BPAPF/p-BPAPF/NDP-9/Al with no substrate heating b = ITO/n-$C_{60}$/$C_{60}$/Compound of formula (I):$C_{60}$/BPAPF/p-BPAPF/NDP-9/Al with no substrate heating $b^1$ = same as b, with substrate heating at 100° C.

$b^2$ = same as b with substrate heating to 70° C.

$b^3$ = same as b with substrate heating to 60° C.

$b^4$ = same as b with substrate heating to 90° C.

c = ITO/$MoO_3$/Compound of formula (I)/$C_{60}$/Bphen/Ag with no substrate heating d = ITO/$MoO_3$/Compound of formula (I):$C_{60}$/$C_{60}$/Bphen/Ag with no substrate heating e = ITO/n-$C_{60}$/$C_{60}$/Compound of formula (I):$C_{60}$/BPAPF/p-BPAPF/NDP-9/Ag $e^1$ = same as e with substrate heating at 100° C.

TABLE 2

| Entry | Compound | End Group | Cell Type (BL/BHJ) | $V_{OC}$ (mV) | $J_{SC}$ (mA/cm2) | FF | η (%) |
|---|---|---|---|---|---|---|---|
| 1 | 11 | (thiophene with CN vinyl) | BHJ | 760 | 5.09 | 35.1 | 1.34 |
| 2 | 27 | (5-Cl-thiophene with CN vinyl) | BL | 820 | 2.05 | 61 | 1.03 |
| 3 | 27 | -do- | BHJ | 960 | 4.32 | 42 | 1.72 |
| 4 | 38 | (thiazole with CN vinyl) | BL | 980 | 2.90 | 39.0 | 1.10 |
| 5 | 38 | -do- | BHJ | 960 | 3.46 | 43.0 | 1.44 |
| 6 | 43 | (benzothiadiazole with CN vinyl) | BL | 960 | 2.91 | 41 | 1.14 |
| 7 | 43 | -do- | BHJ | 1020 | 5.58 | 40 | 2.26 |

TABLE 3

| Entry | Compound | UV-vis $\lambda_{max}$ in THF (nm) | Cell Type (BL/BHJ) | $V_{OC}$ (mV) | $J_{SC}$ (mA/cm²) | FF | η (%) |
|---|---|---|---|---|---|---|---|
| 1 | 11 | 523-THF | BHJ w C60 | 760 | 5.09 | 35.1 | 1.34 |
| 2 | 11 (Lit data)* | 478-THF | BHJ w PCBM | 640 | 0.71 | 24.0 | 0.11 |

*data from *Synthetic Metals*, 2009, 159, 1471.

The invention claimed is:

1. A photoactive material comprising a donor substance and an acceptor substance, wherein
   a. the donor substance comprises a compound of formula (I), or
   b. the acceptor substance comprises a compound of formula (I), or
   c. the donor substance comprises a first compound of formula (I) and the acceptor substance comprises a second compound of formula (I) with the proviso that the first and second compound are not the same,
wherein the compound of formula (I) is selected from the group consisting of:

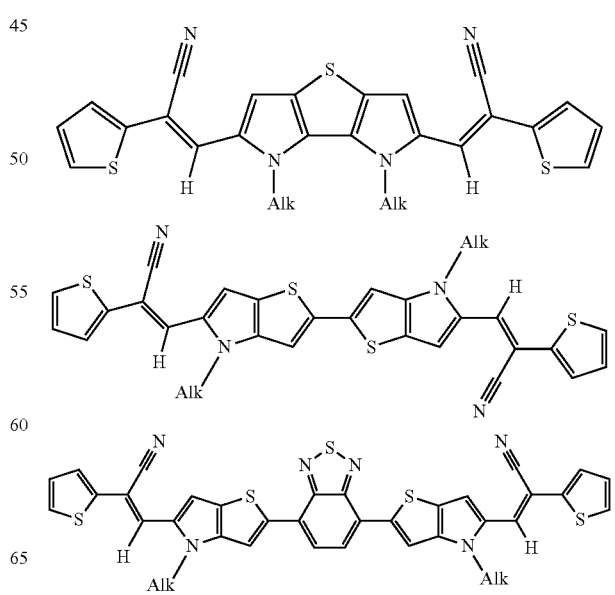

-continued
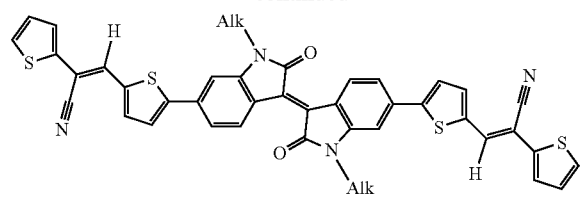
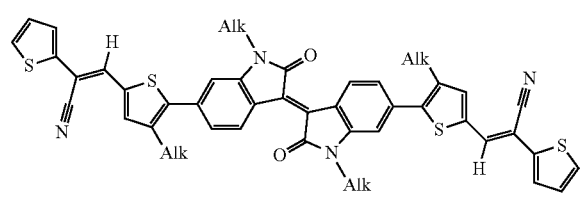
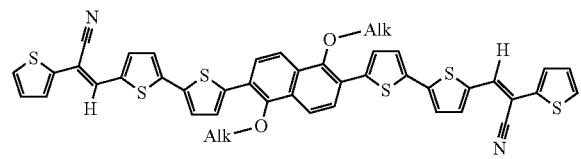
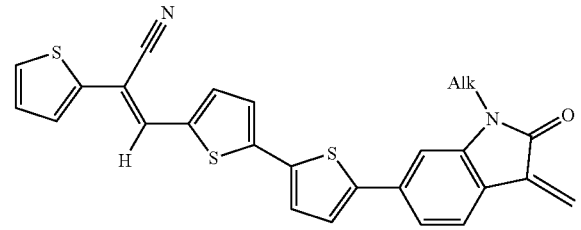
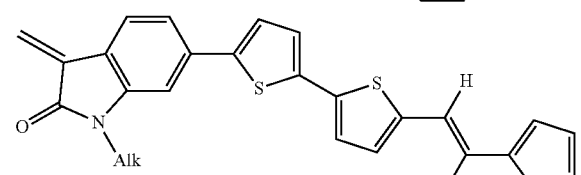
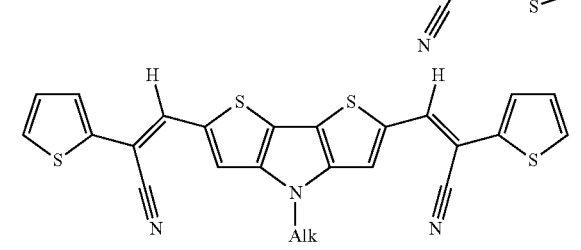
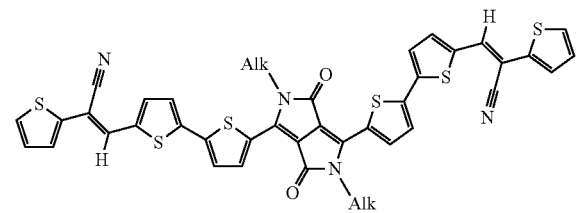
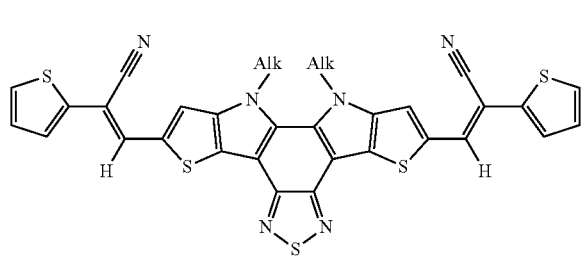
-continued
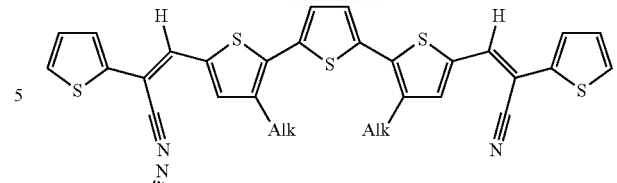
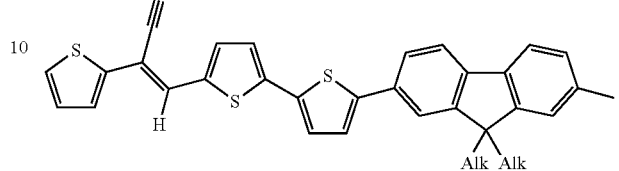
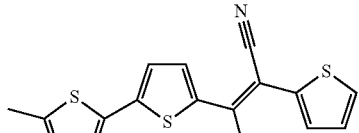
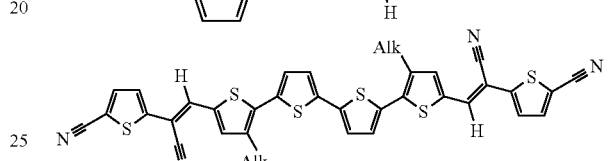
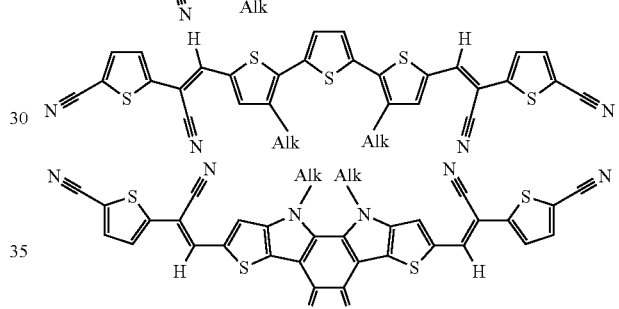
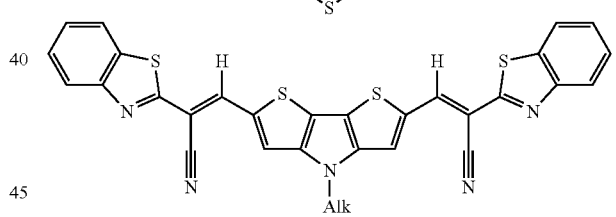
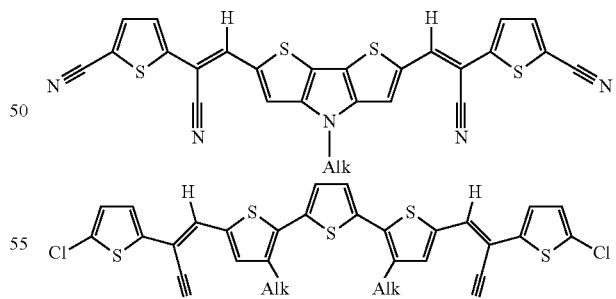
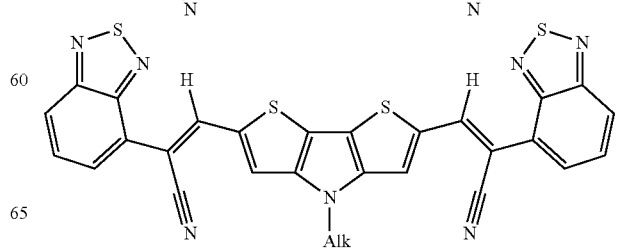

-continued

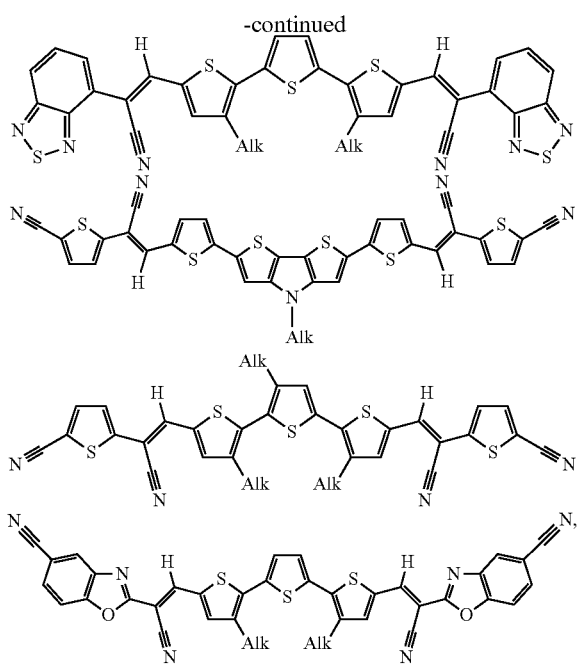

wherein Alk in each case is independently of each other either linear alkyl having 1 to 20 carbon atoms or branched alkyl having 1 to 20 carbon atoms.

2. The photoactive material according to claim 1, wherein the donor substance comprises a compound of formula (I), and wherein the acceptor substance comprises one or more compounds selected from the group consisting of
  (i) a fullerene or a fullerene derivative, and
  (ii) 3,4,9,10-perylenetetracarboxyl-bisbenzimidazole (PTCBI).

3. A solar cell or a sensor comprising the photoactive material according to claim 1.

4. A donor-acceptor bilayer or a donor-acceptor mixed layer comprising the photoactive material according to claim 1.

5. The donor-acceptor bilayer or donor-acceptor mixed layer according to claim 4, wherein the photoactive material is part of a solar cell or sensor.

6. A photoelectric conversion device comprising two or more solar cells according to claim 3, wherein the solar cells are arranged as tandem cells.

7. The photoelectric conversion device according to claim 6, wherein organic solar cells are arranged as inverted tandem cells.

8. The photoactive material of claim 1, wherein:
  a. the donor substance comprises a compound of formula (I).

9. The photoactive material of claim 1, wherein:
  b. the acceptor substance comprises a compound of formula (I).

10. The photoactive material of claim 1, wherein:
  c. the donor substance comprises a first compound of formula (I) and the acceptor substance comprises a second compound of formula (I) with the proviso that the first and second compound are not the same.

* * * * *